(12) United States Patent
Yamazaki

(10) Patent No.: US 8,748,881 B2
(45) Date of Patent: Jun. 10, 2014

(54) SEMICONDUCTOR DEVICE

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 25 days.

(21) Appl. No.: 12/951,249

(22) Filed: Nov. 22, 2010

(65) Prior Publication Data
US 2011/0127523 A1 Jun. 2, 2011

(30) Foreign Application Priority Data
Nov. 28, 2009 (JP) ................................ 2009-270857

(51) Int. Cl.
*H01L 29/12* (2006.01)

(52) U.S. Cl.
USPC .................... 257/43; 257/E29.296; 438/104

(58) Field of Classification Search
USPC ............. 257/43, E29.296, E21.476; 438/104
See application file for complete search history.

(56) References Cited

U.S. PATENT DOCUMENTS

| | | | |
|---|---|---|---|
| 5,225,398 A | 7/1993 | Nakanishi et al. | |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,836,308 B2 | 12/2004 | Sawasaki et al. | |
| 6,838,308 B2 * | 1/2005 | Haga ............................. | 438/104 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,245,345 B2 | 7/2007 | Sawasaki et al. | |

(Continued)

FOREIGN PATENT DOCUMENTS

| | | |
|---|---|---|
| EP | 1737044 A | 12/2006 |
| EP | 1770788 A | 4/2007 |

(Continued)

OTHER PUBLICATIONS

Fortunato.E et al., "Wide-Bandgap High-Mobility ZnO Thin-Film Transistors Produced at Room Temperature,", Appl. Phys. Letter. (Applied Physics Letters) , Sep. 27, 2004, vol. 85, No. 13, pp. 2541-2543.

(Continued)

*Primary Examiner* — Phuc Dang
(74) *Attorney, Agent, or Firm* — Eric J. Robinson; Robinson Intellectual Property Law Office, P.C.

(57) ABSTRACT

An embodiment is a semiconductor device which includes a first oxide semiconductor layer over a substrate having an insulating surface and including a crystalline region formed by growth from a surface of the first oxide semiconductor layer toward an inside; a second oxide semiconductor layer over the first oxide semiconductor layer; a source electrode layer and a drain electrode layer which are in contact with the second oxide semiconductor layer; a gate insulating layer covering the second oxide semiconductor layer, the source electrode layer, and the drain electrode layer; and a gate electrode layer over the gate insulating layer and in a region overlapping with the second oxide semiconductor layer. The second oxide semiconductor layer is a layer including a crystal formed by growth from the crystalline region.

40 Claims, 30 Drawing Sheets

(56) References Cited

U.S. PATENT DOCUMENTS

| | | | |
|---|---|---|---|
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,426,009 B2 | 9/2008 | Sawasaki et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,598,520 B2 | 10/2009 | Hirao et al. | |
| 7,601,984 B2 | 10/2009 | Sano et al. | |
| 7,674,650 B2 | 3/2010 | Akimoto et al. | |
| 7,732,819 B2 | 6/2010 | Akimoto et al. | |
| 7,791,074 B2 | 9/2010 | Iwasaki | |
| 7,847,287 B2 | 12/2010 | Kim et al. | |
| 7,910,490 B2 | 3/2011 | Akimoto et al. | |
| 7,923,722 B2 | 4/2011 | Ryu et al. | |
| 7,935,964 B2 | 5/2011 | Kim et al. | |
| 7,977,169 B2 | 7/2011 | Hirao et al. | |
| 7,993,964 B2 | 8/2011 | Hirao et al. | |
| 7,994,500 B2 | 8/2011 | Kim et al. | |
| 8,038,857 B2 * | 10/2011 | Inoue et al. | 204/298.13 |
| 8,058,645 B2 | 11/2011 | Jeong et al. | |
| 8,137,594 B2 | 3/2012 | Imanishi et al. | |
| 8,148,779 B2 | 4/2012 | Jeong et al. | |
| 8,164,256 B2 * | 4/2012 | Sano et al. | 313/509 |
| 8,188,480 B2 | 5/2012 | Itai | |
| 8,202,365 B2 | 6/2012 | Umeda et al. | |
| 8,203,143 B2 | 6/2012 | Imai | |
| 8,222,092 B2 | 7/2012 | Yamazaki et al. | |
| 8,274,078 B2 | 9/2012 | Itagaki et al. | |
| 8,349,647 B2 | 1/2013 | Ryu et al. | |
| 2001/0012569 A1 * | 8/2001 | Arao et al. | 428/632 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2002/0164888 A1 * | 11/2002 | Roh et al. | 438/754 |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0186458 A1 * | 8/2006 | Forbes et al. | 257/315 |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1 | 3/2007 | Akimoto et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0035920 A1 | 2/2008 | Takechi et al. | |
| 2008/0038882 A1 | 2/2008 | Takechi et al. | |
| 2008/0038929 A1 | 2/2008 | Chang | |
| 2008/0042134 A1 * | 2/2008 | Jung et al. | 257/59 |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0308796 A1 | 12/2008 | Akimoto et al. | |
| 2008/0308797 A1 | 12/2008 | Akimoto et al. | |
| 2008/0308805 A1 | 12/2008 | Akimoto et al. | |
| 2008/0308806 A1 | 12/2008 | Akimoto et al. | |
| 2009/0008639 A1 | 1/2009 | Akimoto et al. | |
| 2009/0045397 A1 | 2/2009 | Iwasaki | |
| 2009/0068773 A1 | 3/2009 | Lai et al. | |
| 2009/0073325 A1 | 3/2009 | Kuwabara et al. | |
| 2009/0078877 A1 | 3/2009 | Yaegashi et al. | |
| 2009/0114910 A1 | 5/2009 | Chang | |
| 2009/0134399 A1 | 5/2009 | Sakakura et al. | |
| 2009/0145847 A1 * | 6/2009 | Spiegelman et al. | 210/662 |
| 2009/0152506 A1 | 6/2009 | Umeda et al. | |
| 2009/0152541 A1 | 6/2009 | Maekawa et al. | |
| 2009/0206332 A1 | 8/2009 | Son et al. | |
| 2009/0224238 A1 | 9/2009 | Kim et al. | |
| 2009/0236596 A1 * | 9/2009 | Itai | 257/43 |
| 2009/0242992 A1 | 10/2009 | Kim et al. | |
| 2009/0247413 A1 | 10/2009 | Hayashi et al. | |
| 2009/0247473 A1 * | 10/2009 | Inman et al. | 514/19 |
| 2009/0278122 A1 | 11/2009 | Hosono et al. | |
| 2009/0280600 A1 | 11/2009 | Hosono et al. | |
| 2009/0283763 A1 | 11/2009 | Park et al. | |
| 2009/0305461 A1 | 12/2009 | Akimoto et al. | |
| 2010/0026169 A1 | 2/2010 | Jeong et al. | |
| 2010/0051935 A1 | 3/2010 | Lee et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0109003 A1 | 5/2010 | Akimoto et al. | |
| 2010/0136743 A1 | 6/2010 | Akimoto et al. | |
| 2010/0136775 A1 * | 6/2010 | Choi et al. | 438/585 |
| 2010/0176383 A1 * | 7/2010 | Park et al. | 257/40 |
| 2010/0244022 A1 | 9/2010 | Takahashi et al. | |
| 2010/0265978 A1 * | 10/2010 | Katoda | 372/45.01 |
| 2010/0276689 A1 | 11/2010 | Iwasaki | |
| 2010/0279462 A1 | 11/2010 | Iwasaki | |
| 2010/0283055 A1 * | 11/2010 | Inoue et al. | 257/59 |
| 2010/0283509 A1 | 11/2010 | Kim et al. | |
| 2010/0285640 A1 | 11/2010 | Chae et al. | |
| 2010/0320458 A1 | 12/2010 | Umeda et al. | |
| 2010/0320459 A1 | 12/2010 | Umeda et al. | |
| 2011/0049509 A1 | 3/2011 | Takahashi et al. | |
| 2011/0062436 A1 | 3/2011 | Yamazaki et al. | |
| 2011/0073856 A1 | 3/2011 | Sato et al. | |
| 2011/0108835 A1 * | 5/2011 | Kim et al. | 257/43 |
| 2011/0114939 A1 * | 5/2011 | Kim et al. | 257/43 |
| 2011/0115839 A1 * | 5/2011 | Takahashi et al. | 345/698 |
| 2011/0127521 A1 | 6/2011 | Yamazaki | |
| 2011/0127522 A1 | 6/2011 | Yamazaki | |
| 2011/0127579 A1 | 6/2011 | Yamazaki | |

(56) References Cited

U.S. PATENT DOCUMENTS

| | | |
|---|---|---|
| 2011/0193083 A1 | 8/2011 | Kim et al. |
| 2011/0215328 A1 | 9/2011 | Morosawa et al. |
| 2012/0032163 A1* | 2/2012 | Yamazaki ................. 257/43 |
| 2012/0119205 A1 | 5/2012 | Taniguchi et al. |
| 2012/0205651 A1 | 8/2012 | Lee et al. |
| 2013/0082256 A1 | 4/2013 | Yamazaki |

FOREIGN PATENT DOCUMENTS

| | | |
|---|---|---|
| EP | 1995787 A | 11/2008 |
| EP | 1998373 A | 12/2008 |
| EP | 1998374 A | 12/2008 |
| EP | 1998375 A | 12/2008 |
| EP | 2120267 A | 11/2009 |
| EP | 2226847 A | 9/2010 |
| JP | 60-198861 | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 | 10/1996 |
| JP | 11-505377 | 5/1999 |
| JP | 2000-026119 A | 1/2000 |
| JP | 2000-044236 A | 2/2000 |
| JP | 2000-150900 | 5/2000 |
| JP | 2002-076356 A | 3/2002 |
| JP | 2002-289859 A | 10/2002 |
| JP | 2003-041362 | 2/2003 |
| JP | 2003-086000 A | 3/2003 |
| JP | 2003-086808 A | 3/2003 |
| JP | 2003-298062 A | 10/2003 |
| JP | 2004-103957 | 4/2004 |
| JP | 2004-273614 A | 9/2004 |
| JP | 2004-273732 A | 9/2004 |
| JP | 2005-217385 A | 8/2005 |
| JP | 2006-165529 | 6/2006 |
| JP | 2006-313776 A | 11/2006 |
| JP | 2007-103918 A | 4/2007 |
| JP | 2007-220820 A | 8/2007 |
| JP | 2008-533693 | 8/2008 |
| JP | 2009-021612 A | 1/2009 |
| JP | 2009-167087 A | 7/2009 |
| JP | 2009-218562 A | 9/2009 |
| JP | 2009-231613 | 10/2009 |
| JP | 2009-246362 A | 10/2009 |
| JP | 2009-278115 A | 11/2009 |
| JP | 2010-016347 | 1/2010 |
| JP | 4415062 | 2/2010 |
| JP | 2010-067954 | 3/2010 |
| JP | 2010-177431 | 8/2010 |
| JP | 4571221 | 10/2010 |
| JP | 2012-160679 | 8/2012 |
| KR | 2002-0041279 A | 6/2002 |
| KR | 2003-0048012 A | 6/2003 |
| KR | 2008-0104860 A | 12/2008 |
| WO | WO-2004/114391 | 12/2004 |
| WO | WO 2005/088726 | 9/2005 |
| WO | WO-2007/029844 | 3/2007 |
| WO | WO-2007/094501 | 8/2007 |
| WO | WO-2007/142167 | 12/2007 |
| WO | WO2008/133345 | 11/2008 |
| WO | WO-2009/034953 | 3/2009 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTs,", SID Digest '08 : SID International Symposium Digest of Technical Papers, May 20, 2008, vol. 39, pp. 621-624.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In3O4-ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. pp. 899-902.

Kanno.H et al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

(56) References Cited

OTHER PUBLICATIONS

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.
Sakata.J et al., "Development of 4.0-in. AMOLED Display With Driver Circuit Using Amorphous In-Ga-Zn-Oxide TFTs,", IDW '09 : Proceedings of the 16th International Display Workshops, 2009, pp. 689-692.
Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by PEALD Grown ZnO TFT,", IMID '07 Digest, pp. 1249-1252.
Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.
Osada.T et al., "Development of Driver-Integrated Panel Using Amorphous In-Ga-Zn-Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.
Ohara.H et al., "21.3:4.0 in. QVGA AMOLED Display Using In-Ga-Zn-Oxide TFTs With a Novel Passivation Layer,", SID Digest '09 : SID International Symposium Digest of Technical Papers, May 31, 2009, pp. 284-287.
Miyasaka.M, "Suftla Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.
Lee.H et al., "Current Status of, Challenges to, and Perspective View of AM-OLED ,", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.
Nakamura.M, "Synthesis of Homologous Compound with New Long-Period Structure,", NIRIM Newsletter, Mar. 1, 1995, vol. 150, pp. 1-4.
Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures over 1000° C.,", Journal of Solid State Chemistry, 1985, vol. 60, pp. 382-384.
Kitzerow.H et al., "Observation of Blue Phases in Chiral Networks,", Liquid Crystals, 1993, vol. 14, No. 3, pp. 911-916.
Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.
Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.
Orita.M et al., "Mechanism of Electrical Conductivity of Transparent InGaZnO4,", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.
Janotti.A et al., "Native Point Defects in ZnO,", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.
Janotti.A et al., "Oxygen Vacancies in ZnO,", Appl. Phys. Lett. (Applied Physics Letters) , 2005, vol. 87, pp. 122102-1-122102-3.
Oba.F et al., "Defect energetics in ZnO: A hybrid Hartree-Fock density functional study,", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor,", Philosophical Magazine, 2001, vol. 81, No. 5, pp. 501-515.
Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays,", IDW '08 : Proceedings of the 6th International Display Workshops, Dec. 3, 2008, pp. 581-584.
Kim.S et al., "High-Performance oxide thin film transistors passivated by various gas plasmas,", 214th ECS Meeting, 2008, No. 2317, ECS.
Clark.S et al., "First Principles Methods Using CASTEP,", Zeitschrift fur Kristallographie, 2005, vol. 220, pp. 567-570.
Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.
Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator,", Appl. Phys. Lett. (Appl. Physics Letters) , Sep. 1, 2003, vol. 83, No. 9, pp. 1755-1757.
Nomura et al., "Room-Temperature Fabrication of Transparent Flexible Thin-Film Transistors Using Amorphous Oxide Semiconductors," Nature, Nov. 25, 2004, vol. 432, pp. 488-492.

(56) References Cited

OTHER PUBLICATIONS

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the $In_2O_3$-$Ga_2ZnO_4$-ZnO System at 1350° C.," Journal of Solid State Chemistry, Aug. 1, 1991, vol. 93, No. 2, pp. 298-315.

Kimizuka et al., "Syntheses and Single-Crystal Data of Homologous Compounds, $In^2O^3(ZnO)_m$ (m=3, 4, and 5), $InGaO_3(ZnO)_3$, and $Ga_2O_3(ZnO)_m$ (m=7, 8, 9, and 16) in the $In_2O_3$-$ZnGa_2O_4$-ZnO System," Journal of Solid State Chemistry, Apr. 1, 1995, vol. 116, No. 1, pp. 170-178.

Nakamura et al., "Syntheses and crystal structures of new homologous compounds, indium iron zinc oxides ($InFeO_3(ZnO)_m$) (m: natural number) and related compounds," Kotai Butsuri (Solid State Physics), 1993, vol. 28, No. 5, pp. 317-327.

Nomura et al., "Thin-Film Transistor Fabricated in Single-Crystalline Transparent Oxide Semiconductor," Science, May 23, 2003, vol. 300, No. 5623, pp. 1269-1272.

International Search Report (Application No. PCT/JP2010/070246) Dated Feb. 15, 2011.

Written Opinion (Application No. PCT/JP2010/070246) Dated Feb. 15, 2011.

Nakayama et al., "17a-TL-8 Effect of GaO Layer on IGZO-TFT Channel," Extended Abstracts (The 57th Spring Meeting 2010), The Japan Society of Applied Physics and Related Societies, Mar. 17, 2010, pp. 21-008.

Korean Office Action (Application No. 2013-7010527) Dated Jun. 17, 2013.

Korean Office Action (Application No. 2012-7022039) Dated Sep. 26, 2013.

\* cited by examiner 3 nm

FIG. 16A
FIG. 16B
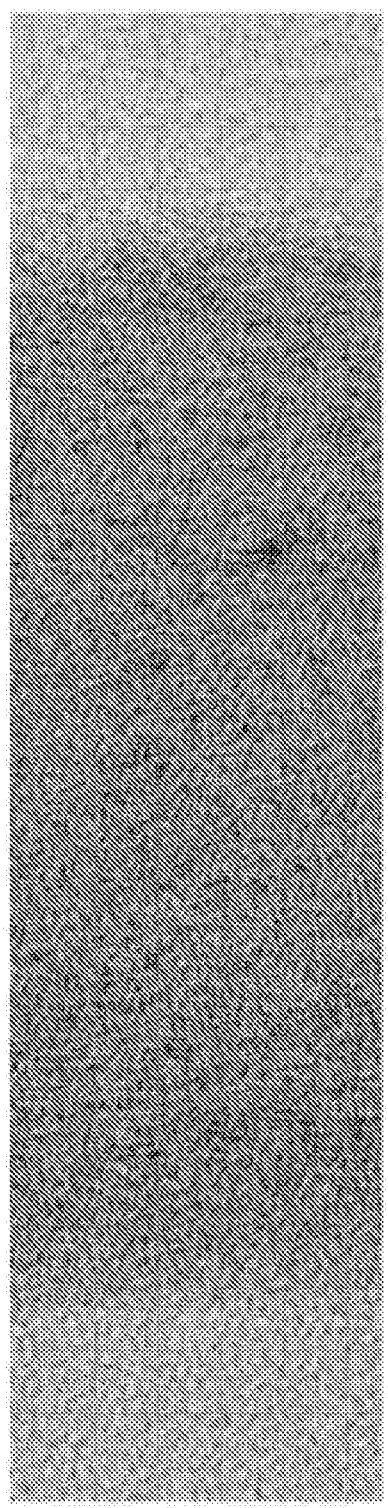
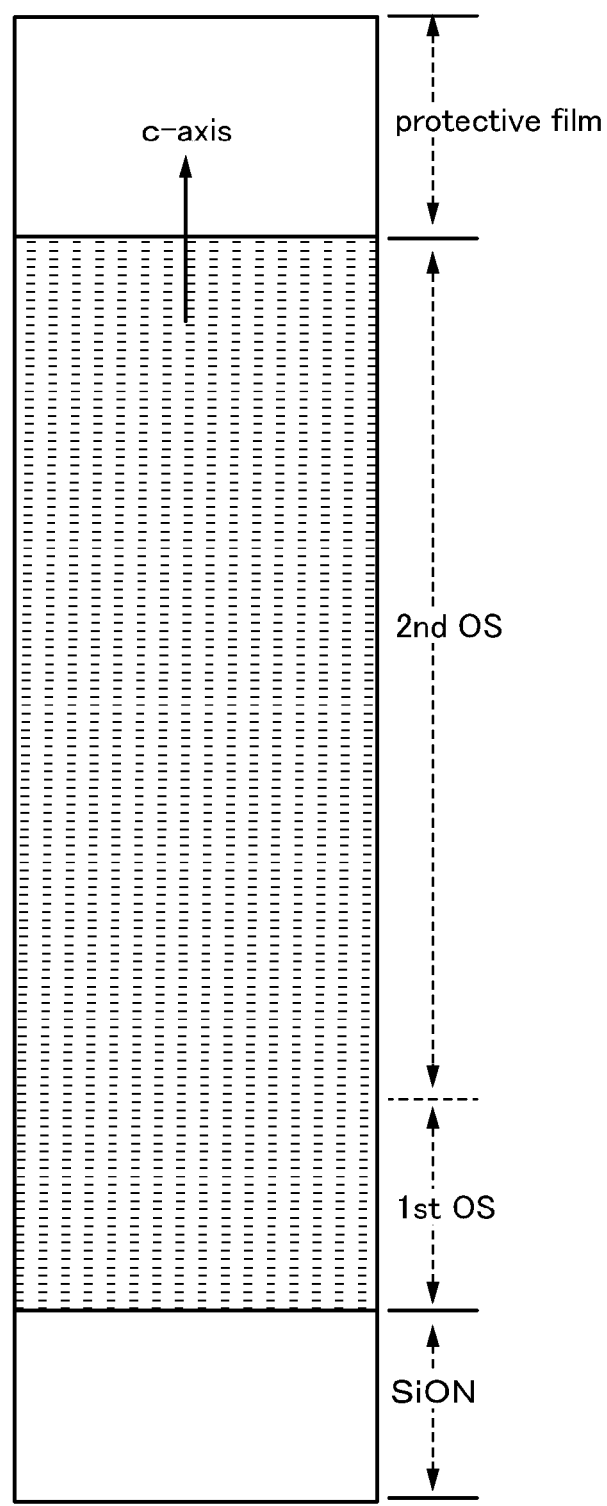

FIG. 17A
FIG. 17B
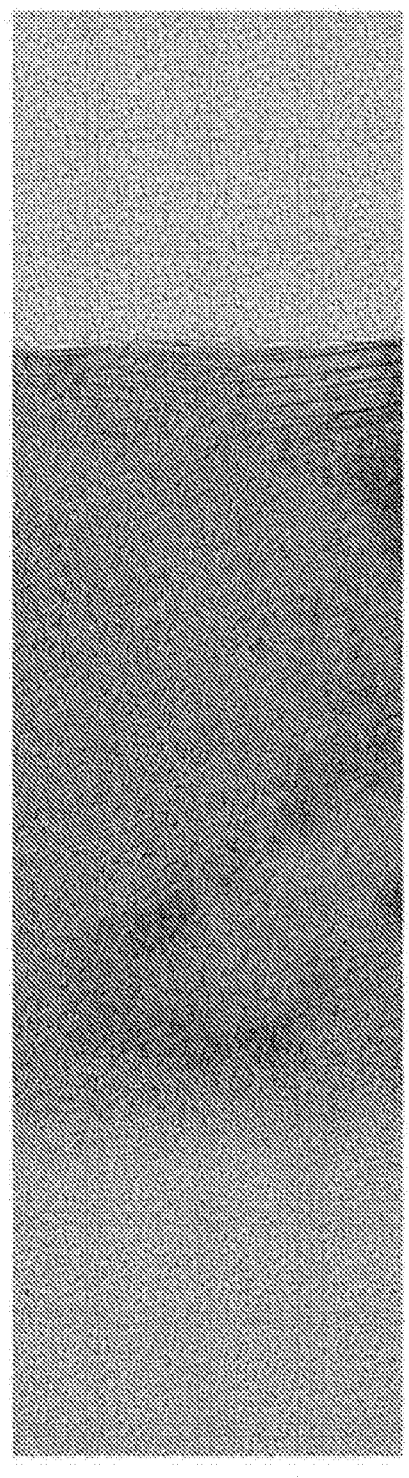
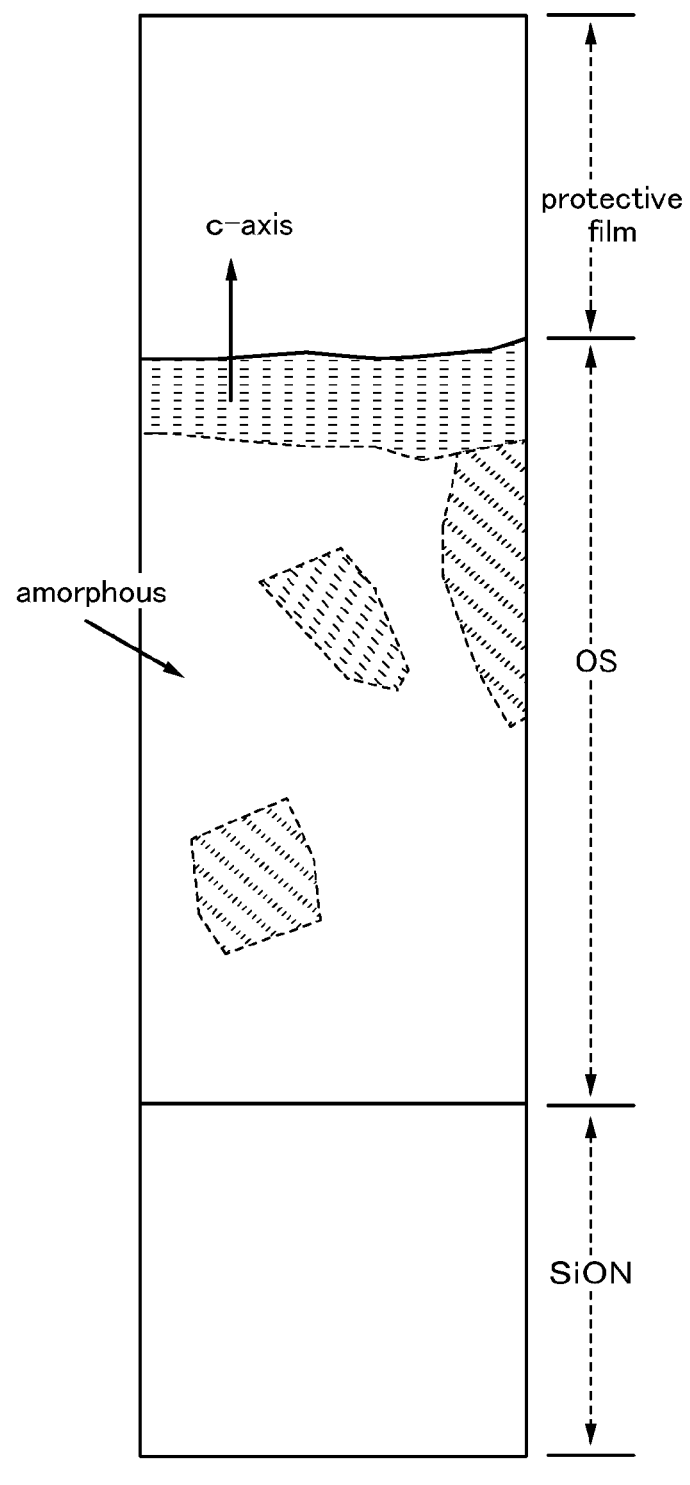

SEMICONDUCTOR DEVICE

TECHNICAL FIELD

The technical field of the disclosed invention relates to a semiconductor device including an oxide semiconductor and a manufacturing method thereof. Here, semiconductor devices refer to all elements and devices that function utilizing semiconductor characteristics. For example, power devices, thyristors, converters, image sensors, memories, and the like; semiconductor integrated circuits including such devices; electro-optical devices typified by liquid crystal display panels; light-emitting display devices including organic light-emitting elements; and the like are broadly included in the category of semiconductor devices.

BACKGROUND ART

A field-effect transistor is one of the most widely-used semiconductor elements. A variety of materials are used for field-effect transistors according to their uses. In particular, semiconductor materials including silicon are frequently used.

A field-effect transistor including silicon has characteristics satisfying the needs for a variety of uses. For example, single crystal silicon is used for an integrated circuit or the like which needs to operate at a high speed, whereby the need for high-speed operation is satisfied. Further, amorphous silicon is used for a device which needs a large area, such as a display device, whereby the need for large area can be satisfied.

As described above, silicon is highly versatile and can be used for various purposes. However, in recent years, semiconductor materials have come to be expected to have higher performance as well as versatility. For example, in terms of improving performance of a large-area display device, in order to realize high-speed operation of a switching element, a semiconductor material which facilitates the increase of the area of a display device and shows higher performance than amorphous silicon is needed.

Some metal oxides have semiconductor characteristics, and tungsten oxide, tin oxide, indium oxide, zinc oxide, and the like are known, for example. Thin film transistors in which a channel formation region is formed using such a metal oxide having semiconductor characteristics are already known (Patent Documents 1 to 4, Non-Patent Document 1).

As the metal oxides, not only single-component oxides but also multi-component oxides are known. For example, $InGaO_3(ZnO)_m$ (m: natural number) having a homologous series is known as a multi-component oxide semiconductor including In, Ga, and Zn (Non-Patent Documents 2 to 4).

Under such conditions, a technique relating to a field-effect transistor (also referred to as an FET) using an oxide semiconductor has attracted attention. Further, it has been confirmed that an oxide semiconductor including such an In—Ga—Zn—O-based oxide is applicable to a channel layer of a thin film transistor (Non-Patent Documents 5 and 6).

For example, in Patent Document 5, a transparent thin film field-effect transistor using a homologous compound $InMO_3(ZnO)_m$ (M is In, Fe, Ga, or Al, and m is an integer greater than or equal to 1 and less than 50) is disclosed.

In addition, in Patent Document 6, a field-effect transistor is disclosed in which an amorphous oxide semiconductor which contains In, Ga, and Zn and has an electron carrier concentration less than $10^{18}/cm^3$ is used. Note that in this patent document, the ratio of In atoms to Ga atoms and Zn atoms in the amorphous oxide semiconductor is represented as In:Ga:Zn=1:1:m (m<6).

Further, in Patent Document 7, a field-effect transistor is disclosed in which an amorphous oxide semiconductor including a microcrystal is used for an active layer.

REFERENCE

Patent Document

[Patent Document 1] Japanese Published Patent Application No. S60-198861

[Patent Document 2] Japanese Published Patent Application No. H8-264794

[Patent Document 3] Japanese Translation of PCT International Application No. H11-505377

[Patent Document 4] Japanese Published Patent Application No. 2000-150900

[Patent Document 5] Japanese Published Patent Application No. 2004-103957

[Patent Document 6] PCT International Publication No. 05/088726

[Patent Document 7] Japanese Published Patent Application No. 2006-165529

Non-Patent Document

[Non-Patent Document 1] M. W. Prins, K. O. Grosse-Holz, G Muller, J. F. M. Cillessen, J. B. Giesbers, R. P. Weening, and R. M. Wolf, "A ferroelectric transparent thin-film transistor," *Appl. Phys. Lett.*, 17 Jun. 1996, Vol. 68, pp. 3650-3652

[Non-Patent Document 2] M. Nakamura, N. Kimizuka, and T. Mohri, "The Phase Relations in the $In_2O_3$—$Ga_2ZnO_4$—ZnO System at 1350° C.," *J. Solid State Chem.*, 1991, Vol. 93, pp. 298-315

[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_n$, (m=7, 8, 9, and 16) in the $In_2O_3$—$ZnGa_2O_4$—ZnO System," *J. Solid State Chem.*, 1995, Vol. 116, pp. 170-178

[Non-Patent Document 4] M. Nakamura, N. Kimizuka, T. Mohri, and M. Isobe, "Syntheses and crystal structures of new homologous compounds, indium iron zinc oxides ($InFeO_3(ZnO)_m$ (m: natural number) and related compounds," *KOTAI BUTSURI (SOLID STATE PHYSICS)*, 1993, Vol. 28, No. 5, pp. 317-327

[Non-Patent Document 5] K. Nomura, H. Ohta, K. Ueda, T. Kamiya, M. Hirano, and H. Hosono, "Thin-film transistor fabricated in single-crystalline transparent oxide semiconductor," *SCIENCE*, 2003, Vol. 300, pp. 1269-1272

[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors," *NATURE*, 2004, Vol. 432, pp. 488-492

DISCLOSURE OF INVENTION

In Patent Document 3, it is disclosed that a composition in a crystal state is $InGaO_3(ZnO)_m$ (m is an integer less than 6). Further, in Example 1 of Patent Document 3, a case of $InGaO_3(ZnO)_4$ is disclosed. However, adequate characteristics have not been obtained in fact even when such oxide semiconductors are used.

In consideration of the above-described problems, it is an object to provide a semiconductor device having a novel structure in which an oxide semiconductor layer having a novel structure is used.

In the disclosed invention, a semiconductor device is formed using a purified oxide semiconductor layer including a crystalline region. The crystalline region is, for example, a region having electrical anisotropy or a region which prevents entry of an impurity.

An embodiment of the disclosed invention is a semiconductor device which includes a first oxide semiconductor layer including a crystalline region formed by growth from a surface of the first oxide semiconductor layer toward an inside, over a substrate having an insulating surface; a second oxide semiconductor layer over the first oxide semiconductor layer; a source electrode layer and a drain electrode layer which are in contact with the second oxide semiconductor layer; a gate insulating layer covering the second oxide semiconductor layer, the source electrode layer, and the drain electrode layer; and a gate electrode layer over the gate insulating layer and in a region overlapping with the second oxide semiconductor layer. The second oxide semiconductor layer is a layer including a crystal formed by growth from the crystalline region.

Another embodiment of the disclosed invention is a semiconductor device which includes a first gate electrode layer over a substrate having an insulating surface; a first gate insulating layer covering the first gate electrode layer; a first oxide semiconductor layer including a crystalline region formed by growth from a surface of the first oxide semiconductor layer toward an inside, over the first gate insulating layer; a second oxide semiconductor layer over the first oxide semiconductor layer; a source electrode layer and a drain electrode layer which are in contact with the second oxide semiconductor layer; a second gate insulating layer covering the second oxide semiconductor layer, the source electrode layer, and the drain electrode layer; and a gate electrode layer over the second gate insulating layer and in a region overlapping with the second oxide semiconductor layer. The second oxide semiconductor layer is a layer including a crystal formed by growth from the crystalline region.

In the above structure of the semiconductor device, the variation in height of a surface of the second oxide semiconductor layer is 1 nm or less (preferably 0.2 nm or less) in a region overlapping with the gate electrode layer (a channel formation region).

Note that the crystalline region of the first oxide semiconductor layer has c-axis aligned in a direction perpendicular to a surface of the first oxide semiconductor layer. Further, the c-axis direction of the crystal corresponds to a film thickness direction.

In the above structure of the semiconductor device, the substrate having an insulating surface includes an oxide or a nitride.

In the above structure of the semiconductor device, the crystalline region included in the first oxide semiconductor layer has an average thickness greater than or equal to 2 nm and less than or equal to 10 nm.

In the above structure of the semiconductor device, the first oxide semiconductor layer or the second oxide semiconductor layer comprises a metal oxide selected from an In—Sn—Ga—Zn—O, an In—Ga—Zn—O, an In—Sn—Zn—O, an In—Al—Zn—O, a Sn—Ga—Zn—O, an Al—Ga—Zn—O, a Sn—Al—Zn—O, an In—Zn—O, a Sn—Zn—O, an Al—Zn—O, a Zn—Mg—O, a Sn—Mg—O, an In—Mg—O, an In—O, a Sn—O, and a Zn—O.

In the above structure of the semiconductor device, the first oxide semiconductor layer or the second oxide semiconductor layer is a purified oxide semiconductor layer.

In the above structure of the semiconductor device, the first oxide semiconductor layer and the second oxide semiconductor layer include materials including the same main component.

In the above structure of the semiconductor device, the first oxide semiconductor layer and the second oxide semiconductor layer include different materials.

In the above structure of the semiconductor device, the crystalline region of the first oxide semiconductor layer has the same electron affinity as the crystal of the second oxide semiconductor layer.

In the above structure of the semiconductor device, the second oxide semiconductor layer has a depression portion.

In the above structure of the semiconductor device, the second oxide semiconductor layer includes a high-purity crystalline region.

In the above structure of the semiconductor device, the first oxide semiconductor layer or the second oxide semiconductor layer has a carrier density lower than $1.0 \times 10^{12}$ cm$^{-3}$, preferably lower than $1.45 \times 10^{10}$ cm$^{-3}$.

In the above structure of the semiconductor device, the crystalline region of the first oxide semiconductor layer includes a polycrystalline oxide semiconductor material.

In addition, the second oxide semiconductor layer includes a polycrystalline oxide semiconductor material.

In the above structure of the semiconductor device, the first oxide semiconductor layer and the second oxide semiconductor layer include a polycrystalline oxide semiconductor material. In the above structure of the semiconductor device, the sum of thicknesses of the first oxide semiconductor layer and the second oxide semiconductor layer is greater than or equal to 3 nm and less than or equal to 50 nm.

In the above structure of the semiconductor device, insulating layers having substantially the same shape as the source electrode layer and the drain electrode layer are included over the source electrode layer and the drain electrode layer.

In the above structure of the semiconductor device, portions in contact with the second oxide semiconductor layer of the source electrode layer and the drain electrode layer include a material having a low oxygen affinity.

Another embodiment of the disclosed invention is a manufacturing method of a semiconductor device, which includes the steps of forming a first oxide semiconductor layer over a substrate having an insulating surface; performing first heat treatment to cause crystal growth from a surface of the first oxide semiconductor layer toward an inside, so that a crystalline region having c-axis aligned in a direction substantially perpendicular to the surface is formed in the first oxide semiconductor layer; forming a second oxide semiconductor layer over the first oxide semiconductor layer; performing second heat treatment to cause crystal growth from the crystalline region and crystallize the second oxide semiconductor layer; forming a conductive layer over the second oxide semiconductor layer; etching the conductive layer to form a source electrode layer and a drain electrode layer; forming a gate insulating layer covering the second oxide semiconductor layer, the source electrode layer, and the drain electrode layer: and forming a gate electrode layer over the gate insulating layer and in a region overlapping with the second oxide semiconductor layer.

Another embodiment of the disclosed invention is a manufacturing method of a semiconductor device, which includes the steps of forming a first gate electrode layer over a substrate having an insulating surface; forming a first gate insulating layer covering the first gate electrode layer; forming a first oxide semiconductor layer over the first gate insulating layer; performing first heat treatment to cause crystal growth from a surface of the first oxide semiconductor layer toward an inside, so that a crystalline region having c-axis aligned in a direction substantially perpendicular to the surface is formed in the first oxide semiconductor layer; forming a second oxide semiconductor layer over the first oxide semiconductor layer; performing second heat treatment to cause crystal growth from the crystalline region and crystallize the second oxide semiconductor layer; forming a conductive layer over the second oxide semiconductor layer; etching the conductive layer to form a source electrode layer and a drain electrode layer; forming a second gate insulating layer covering the second oxide semiconductor layer, the source electrode layer, and the drain electrode layer: and forming a second gate electrode layer over the second gate insulating layer and in a region overlapping with the second oxide semiconductor layer.

In the above structure of the manufacturing method of a semiconductor device, the first oxide semiconductor layer has a thickness greater than or equal to 3 nm and less than or equal to 15 nm.

In the above structure of the manufacturing method of a semiconductor device, a polycrystalline region is formed as the crystalline region of the first oxide semiconductor layer.

In the above structure of the manufacturing method of a semiconductor device, the second heat treatment makes the second oxide semiconductor layer be a polycrystalline oxide semiconductor layer.

In the above structure of the manufacturing method of a semiconductor device, the first heat treatment and the second heat treatment make the first oxide semiconductor layer and the second oxide semiconductor layer be polycrystalline oxide semiconductor layers.

In the above structure of the manufacturing method of a semiconductor device, the second heat treatment causes the crystal growth so that c-axis is aligned in a direction substantially perpendicular to a surface of the second oxide semiconductor layer.

In the above structure of the manufacturing method of a semiconductor device, the second oxide semiconductor layer is formed by a sputtering method using a metal oxide target having a composition ratio, In:Ga:Zn=1:x:y (x is greater than or equal to 0 and less than or equal to 2, and y is greater than or equal to 1 and less than or equal to 5).

In the above structure of the manufacturing method of a semiconductor device, the metal oxide target has a composition ratio, In:Ga:Zn=1:x:y (x=1, y=1).

In the above structure of the manufacturing method of a semiconductor device, the metal oxide target has a composition ratio, In:Ga:Zn=1:x:y (x=0, y=1).

In the above structure of the manufacturing method of a semiconductor device, insulating layers having substantially the same shape as the source electrode layer and the drain electrode layer are formed over the source electrode layer and the drain electrode layer.

In the above structure of the manufacturing method of a semiconductor device, portions in contact with the second oxide semiconductor layer in the source electrode layer and the drain electrode layer are formed using a material having a low oxygen affinity.

In the above-described manufacturing method, annealing is performed after the formation of the first oxide semiconductor layer, and the second oxide semiconductor layer is formed over the first oxide semiconductor layer. Then, crystal growth is caused from the surface of the first oxide semiconductor layer toward the surface of the second oxide semiconductor layer. The first oxide semiconductor layer corresponds to a seed crystal for the second oxide semiconductor layer. It is important that the crystalline (e.g., polycrystalline) second oxide semiconductor layer be formed over the first oxide semiconductor layer.

As the crystallinity of the oxide semiconductor layers is increased, the amount of shift in threshold voltage of the transistor in a BT test can be reduced, so that high reliability can be realized. In the transistor formed using the oxide semiconductor layer including the c-axis-aligned polycrystalline layer, the amount of shift in threshold voltage of the transistor can be reduced in the BT test in which the transistor is continuously irradiated with light. Accordingly, the transistor having stable electric characteristics can be manufactured.

In addition, as the crystallinity of the oxide semiconductor layers is increased, temperature dependence of electric characteristics of the transistor, for example, the amount of change in on-state current or off-state current in a temperature range of from −30° C. to 120° C. can be suppressed. Although the operation temperature range of a general display panel is higher than or equal to 0° C. and lower than or equal to 40° C., for example, an in-car display panel needs heat resistance against a temperature higher than or equal to −30° C. and lower than or equal to 85° C., or further up to 105° C. Without limitation to a display panel, an oxide semiconductor layer having high crystallinity can be used for a switching element or a driver circuit; in such a case, a device capable of withstanding various severe circumstances can be obtained, which is advantageous for expanding usage or application fields.

Further, higher crystallinity of the oxide semiconductor layer can realize a transistor having a higher field-effect mobility.

The above-described oxide semiconductor layers all include metal oxide, and can be formed using an In—Sn—Ga—Zn—O-based film which is a four-component metal oxide; an In—Ga—Zn—O-based film, an In—Sn—Zn—O-based film, an In—Al—Zn—O-based film, a Sn—Ga—Zn—O-based film, an Al—Ga—Zn—O-based film, or a Sn—Al—Zn—O-based film which are three-component metal oxides; an In—Zn—O-based film, a Sn—Zn—O-based film, an Al—Zn—O-based film, a Zn—Mg—O-based film, a Sn—Mg—O-based film, or an In—Mg—O-based film which are two-component metal oxides; or an In—O-based film, a Sn—O-based film, a Zn—O-based film, or the like.

For the above-described oxide semiconductor layers, a thin film represented by $InMO_3(ZnO)_m$ (m>0, and m is not a natural number) can be used. Here, M represents one or more metal elements selected from Ga, Al, Mn, and Co. For example, M may be Ga, Ga and Al, Ga and Mn, Ga and Co, or the like. A material represented by $InGa_xZn_yO_z$ can be used. Here, x, y, and z are arbitrary numbers. In addition, x, y, and z are not necessarily integers and may be non-integer numbers. Further, x may be zero, but y is preferably not zero. For example, In—Zn—O where x is zero may be used. In addition, an oxide semiconductor material expressed by In—Ga—Zn—O in this specification is $InGaO_3(ZnO)_m$ (m>0, and m is not a natural number), and it can be confirmed by analysis using ICP-MS or RBS that m is not a natural number. In addition, the case where x is 1 and y is 1, the case where x is 1 and y is 0.5, or the like may be employed. It is preferable to use a purified oxide semiconductor having a carrier density lower than $1\times10^{12}$ cm$^{-3}$, preferably lower than $1.45\times10^{10}$ cm$^{-3}$.

Metal oxides which have been reported so far are only a metal oxide in an amorphous state, a metal oxide in a polycrystalline state, or a metal oxide in a single-crystalline state which is obtained through treatment at a high temperature of approximately 1400° C. However, as described above, a thin polycrystal film can be formed at a relatively low temperature by a method in which a plate-shaped polycrystal of a metal oxide is formed and then crystal growth is caused using the plate-shaped polycrystal of the metal oxide as a seed. If formation of a thicker polycrystalline film is possible, industrial application is further expanded. Note that in order to obtain a fine thick polycrystalline film, flatness and smoothness of the substrate are preferably high. This is because small unevenness of the substrate leads to local misalignment of the c-axis, and as crystal growth proceeds, a difference in the c-axis direction between adjacent crystals produces defects such as crystal transition. Note that the plate-like crystal in the oxide semiconductor layer is preferably a crystal of $InGaZnO_4$ (In:Ga:Zn:O=1:1:1:4). Alternatively, a crystal of $In_2Ga_2ZnO_7$ (In:Ga:Zn:O=2:2:1:7) is preferable. A crystal whose c-axis is aligned in a direction perpendicular to the surface of the oxide semiconductor layer, for example, a polycrystal, can be used.

Note that in this specification and the like, the term "over" or "below" does not necessarily mean that a component is placed "directly on" or "directly under" another component. For example, the expression "a gate electrode layer over a gate insulating layer" does not exclude the case where a component is placed between the gate insulating layer and the gate electrode layer. Moreover, the terms such as "over" and "below" are only used for convenience of description and can include the case where the positions of components are reversed, unless otherwise specified.

In addition, in this specification and the like, the term such as "electrode" or "wiring" does not limit the function of the component. For example, an "electrode" can be used as part of "wiring", and the "wiring" can be used as part of the "electrode." In addition, the term "electrode" or "wiring" can also mean a combination of a plurality of "electrodes" and "wirings."

Functions of a "source" and a "drain" are sometimes replaced with each other when a transistor of opposite polarity is used or when the direction of current flow is changed in circuit operation, for example. Therefore, the terms "source" and "drain" can be used to denote the drain and the source, respectively, in this specification.

Note that in this specification and the like, the term "electrically connected" includes the case where components are connected through an "object having any electric function". There is no particular limitation on the "object having any electric function" as long as electric signals can be transmitted and received between components that are connected through the object.

Examples of the "object having any electric function" are a switching element such as a transistor, a resistor, an inductor, a capacitor, and an element with a variety of functions as well as an electrode and a wiring.

In the disclosed invention, a purified oxide semiconductor layer is used for a semiconductor device. The purification means at least one of removing hydrogen, which causes an oxide semiconductor to change to an n-type oxide semiconductor, from the oxide semiconductor layer as much as possible and reducing defects, which are caused by oxygen deficiency in the oxide semiconductor layer, by supply of oxygen that the oxide semiconductor layer lacks.

The purification is conducted in order to make the oxide semiconductor layer an i-type oxide semiconductor layer. Since an oxide semiconductor generally has an n-type conductivity, the off-state current is high. When the off-state current is high, switching characteristics are insufficient, which is not appropriate for semiconductor devices. Therefore, in an embodiment of the present invention, an oxide semiconductor layer is purified to change to an i-type or substantially i-type oxide semiconductor layer.

In the disclosed invention, an oxide semiconductor layer including a crystalline region is used in a semiconductor device.

Electric characteristics are different between the oxide semiconductor layer including a crystalline region and an oxide semiconductor layer without a crystalline region. For example, in an oxide semiconductor layer including a crystalline region whose c-axis is aligned in a direction substantially perpendicular to a surface, conductivity in a direction parallel to the surface of the oxide semiconductor layer is increased and an insulating property in a direction perpendicular to the surface of the oxide semiconductor layer is increased.

Thus, when the oxide semiconductor layer including a crystalline region is used for a semiconductor device, the semiconductor device can have excellent electric characteristics.

In the oxide semiconductor layer including a crystalline region, entry of impurities into the oxide semiconductor layer is reduced as compared to the case of using the oxide semiconductor layer without a crystalline region. For example, entry of water, hydrogen, or the like, which adversely affects the oxide semiconductor layer, is reduced in the oxide semiconductor layer including a crystalline region.

Accordingly, the oxide semiconductor layer can be prevented form being changed to an n-type oxide semiconductor layer after the deposition. That is, reliability of the semiconductor device can be increased.

Thus, in an embodiment of the disclosed invention, a semiconductor device having high reliability and excellent characteristics is provided.

As described above, it is understood that a variety of advantageous effects can be obtained when an oxide semiconductor, in particular, a purified intrinsic oxide semiconductor is used. In addition, when the intrinsic oxide semiconductor layer with a crystalline structure is realized as described in the disclosed invention, a novel semiconductor device having excellent characteristics is realized.

BRIEF DESCRIPTION OF DRAWINGS

In the accompanying drawings:

FIG. 16A is a cross-sectional TEM photograph after second heat treatment, and

FIG. 16B is a schematic view thereof;

FIG. 17A is a cross-sectional TEM photograph of a comparative example, and

FIG. 17B is a schematic view thereof;

BEST MODE FOR CARRYING OUT THE INVENTION

Figure 1A:
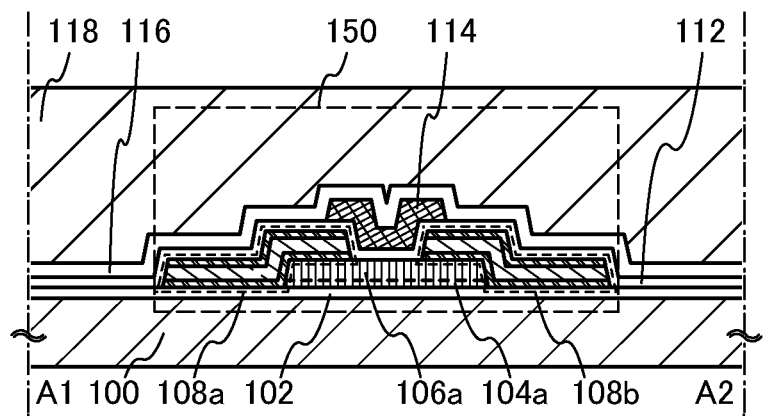
FIGS. 1A and 1B are cross-sectional views illustrating a semiconductor device.

Hereinafter, embodiments of the present invention will be described with reference to the drawings. Note that the present invention is not limited to the following description and it will be easily understood by those skilled in the art that modes and details can be modified in various ways without departing from the spirit and the scope of the present invention. Therefore, the present invention should not be construed as being limited to the description in the following embodiments.

Note that the position, the size, the range, or the like of each structure illustrated in drawings and the like is not accurately represented in some cases for easy understanding. Therefore, the disclosed invention is not necessarily limited to such position, size, range, and the like disclosed in the drawings and the like.

In this specification and the like, ordinal numbers such as "first", "second", and "third" are used in order to avoid confusion among components, and the terms do not limit the components numerically.

Embodiment 1

In this embodiment, a structure and a manufacturing method of a semiconductor device according to an embodiment of the invention disclosed will be described with reference to FIGS. 1A and 1B, FIGS. 2A to 2E, FIGS. 3A to 3D, and FIGS. 4A to 4C.

<The Structure of a Semiconductor Device>

Figure 1B:
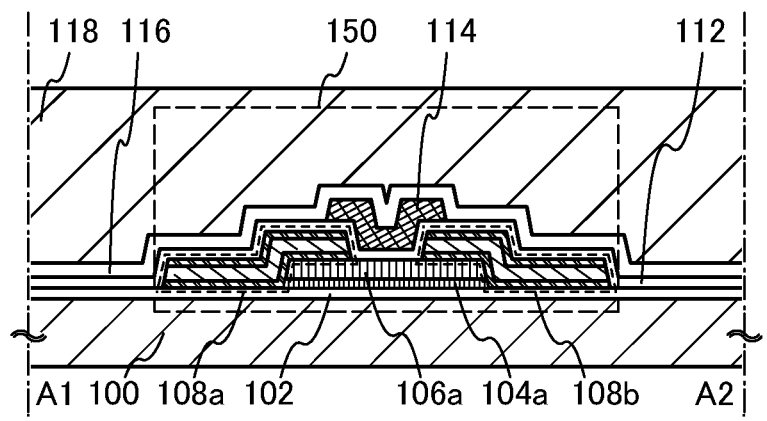

FIGS. 1A and 1B are cross-sectional views illustrating a transistor 150 which is an example of the structure of a semiconductor device. Note that although the transistor 150 described here is an n-channel IGFET (insulated gate field-effect transistor) whose carriers are electrons, the transistor 150 may be a p-channel IGFET.

The transistor 150 includes a first oxide semiconductor layer 104a provided over a substrate 100 with an insulating layer 102 provided therebetween, a second oxide semiconductor layer 106a provided over the first oxide semiconductor layer 104a, a source or drain electrode layer 108a and a source or drain electrode layer 108b which are electrically connected to the second oxide semiconductor layer 106a, a gate insulating layer 112 which covers the second oxide semiconductor layer 106a, the source or drain electrode layer 108a, and the source or drain electrode layer 108b, and a gate electrode layer 114 over the gate insulating layer 112 (see FIGS. 1A and 1B).

In addition, an interlayer insulating layer 116 and an interlayer insulating layer 118 are provided over the transistor 150. Note that the interlayer insulating layer 116 and the interlayer insulating layer 118 are not requisite components and may be omitted as appropriate.

For the first oxide semiconductor layer 104a and the second oxide semiconductor layer 106a, an In—Sn—Ga—Zn—O-based material which is a four-component metal oxide; an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material which are three-component metal oxides; an In—Zn—O-based material, a Sn—Zn—O-based material, an Al—Zn—O-based material, a Zn—Mg—O-based material, a Sn—Mg—O-based material, or an In—Mg—O-based material which are two-component metal oxides; an In—O-based material, a Sn—O-based material, or a Zn—O-based material which are one-component metal oxides; or the like can be used.

In addition, an oxide semiconductor material expressed by In-A-B—O may be used. Here, A represents one or plural kinds of elements selected from elements belonging to Group 13, such as gallium (Ga) or aluminum (Al), elements belonging to Group 14 typified by silicon (Si) or germanium (Ge), or the like. In addition, B represents one or plural kinds of elements selected from elements belonging to Group 12 typified by zinc (Zn). Note that the In content, the A content, and the B content are set freely, and the case where the A content is zero is included. On the other hand, the In content and the B content are not zero. In other words, the above expression includes In—Ga—Zn—O, In—Zn—O, and the like.

In particular, an In—Ga—Zn—O-based oxide semiconductor material has sufficiently high resistance when there is no electric field and thus off-state current can be sufficiently reduced. In addition, having a high field-effect mobility, the In—Ga—Zn—O-based oxide semiconductor material is suitable for a semiconductor material used in a semiconductor device.

As a typical example of the In—Ga—Zn—O-based oxide semiconductor material, one represented by $InGaO_3(ZnO)_m$ (m>0) is given. Using M instead of Ga, there is an oxide semiconductor material expressed by InMO$_3$(ZnO)$_m$ (m>0). Here, M denotes one or more of metal elements selected from gallium (Ga), aluminum (Al), iron (Fe), nickel (Ni), manganese (Mn), cobalt (Co), and the like. For example, M may be Ga, Ga and Al, Ga and Fe, Ga and Ni, Ga and Mn, Ga and Co, or the like. Note that the above-described compositions are derived from the crystal structures that the oxide semiconductor material can have and are only examples.

It is preferable that the first oxide semiconductor layer 104a and the second oxide semiconductor layer 106a be purified in such a manner that an impurity such as hydrogen is sufficiently removed from the first oxide semiconductor layer 104a and the second oxide semiconductor layer 106a and oxygen is supplied thereto. Specifically, the concentration of hydrogen in the first oxide semiconductor layer 104a and the second oxide semiconductor layer 106a is $5\times10^{19}$/cm$^3$ or less, preferably $5\times10^{18}$/cm$^3$ or less, and further preferably $5\times10^{17}$/cm$^3$ or less. The first oxide semiconductor layer 104a and the second oxide semiconductor layer 106a which are purified by sufficiently reducing the hydrogen concentration and supplying oxygen have a sufficiently low carrier density (e.g., less than $1\times10^{12}$/cm$^3$, preferably less than $1.45\times10^{10}$/cm$^3$) as compared to a general silicon wafer (a silicon wafer to which a slight amount of an impurity element such as phosphorus or boron is added) having a carrier density of approximately $1\times10^{14}$/cm$^3$. The transistor 150 having extremely excellent off-state current characteristics can be obtained with the use of an i-type or substantially i-type oxide semiconductor. For example, when the drain voltage Vd is +1 V or +10 V and the gate voltage Vg ranges from −20 V to −5 V, the off-state current is $1\times10^{-13}$ A or less. Note that the hydrogen concentration in the first oxide semiconductor layer 104a and the second oxide semiconductor layer 106a was measured by secondary ion mass spectroscopy (SIMS).

Here, it is preferable that the first oxide semiconductor layer 104a include a crystalline region. The crystalline region is preferably a region including a surface of the first oxide semiconductor layer 104a, that is, a region including an interface between the first oxide semiconductor layer 104a and the second oxide semiconductor layer 106a, and is preferably a region including a crystal whose c-axis is aligned in a direction substantially perpendicular to the surface of the first oxide semiconductor layer 104a. For example, the crystalline region can include a crystal grain whose c-axis is aligned in a direction substantially perpendicular to the surface of the first oxide semiconductor layer 104a. Here, a "substantially perpendicular direction" means a direction within ±10° from a perpendicular direction. Note that the crystalline region may be formed only in the vicinity of the surface of the first oxide semiconductor layer 104a (e.g., a region from the surface to a distance (depth) of 2 nm or more and 10 nm or less) or may be formed to reach the bottom surface of the first oxide semiconductor layer 104a.

In addition, the crystalline region preferably includes a plate-like crystal. Here, the plate-like crystal means a crystal that is grown in a planar manner and has a shape like a thin plate. The crystalline region preferably includes a polycrystal.

The second oxide semiconductor layer 106a includes a crystal which is formed by crystal growth from the crystalline region of the first oxide semiconductor layer 104a.

Here, since the second oxide semiconductor layer 106a includes the crystal which is formed by crystal growth from the crystalline region of the first oxide semiconductor layer 104a, the second oxide semiconductor layer 106a includes a crystal whose c-axis is aligned in a direction substantially perpendicular to the interface between the first oxide semiconductor layer 104a and the second oxide semiconductor layer 106a, as in the crystalline region of the first oxide semiconductor layer 104a. Here, a "substantially perpendicular direction" means a direction within ±10° from a perpendicular direction.

In addition, the second oxide semiconductor layer 106a preferably includes a plate-like crystal, as in the crystalline region of the first oxide semiconductor layer 104a. The second oxide semiconductor layer 106a preferably includes a polycrystal.

The second oxide semiconductor layer 106a may include not only the crystal which is formed by crystal growth from the crystalline region of the first oxide semiconductor layer 104a but also a crystal which is formed by crystal growth from the surface of the second oxide semiconductor layer 106a.

In the case where the first oxide semiconductor layer 104a and the second oxide semiconductor layer 106a are formed using the same material (i.e., in the case of homoepitaxy), the boundary between the first oxide semiconductor layer 104a and the second oxide semiconductor layer 106a might not be able to be identified. Although the boundary is shown by dotted lines in FIG. 1A, there is a case where the first oxide semiconductor layer 104a and the second oxide semiconductor layer 106a can be regarded as one layer (see FIG. 1A). Both the first oxide semiconductor layer 104a and the second oxide semiconductor layer 106a include a polycrystal.

Alternatively, the first oxide semiconductor layer 104a and the second oxide semiconductor layer 106a may be formed using different materials (see FIG. 1B). In the case where the first oxide semiconductor layer 104a and the second oxide semiconductor layer 106a are formed using different materials (i.e., in the case of heteroepitaxy), for example, the first oxide semiconductor layer 104a can be formed using an In—Zn—O-based material which is a two-component metal oxide, and the second oxide semiconductor layer 106a can be formed using an In—Ga—Zn—O-based material which is a three-component metal oxide.

Since the second oxide semiconductor layer 106a is formed by crystal growth from the crystalline region of the first oxide semiconductor layer 104a, the second oxide semiconductor layer 106a has electrical anisotropy. For example, the conductivity in a direction parallel to the surface of the second oxide semiconductor layer 106a is increased because the c-axis is aligned in a direction substantially perpendicular to the interface between the first oxide semiconductor layer 104a and the second oxide semiconductor layer 106a. In contrast, in a direction perpendicular to the surface of the second oxide semiconductor layer 106a, an insulating property is increased.

A region serving as a channel formation region in the oxide semiconductor layer preferably has at least a flat surface. The first oxide semiconductor layer and the second oxide semiconductor layer are polycrystals, and c-axes of the polycrystals included in the first oxide semiconductor layer and the second oxide semiconductor layer are aligned in the same direction. The variation in height of the surface of the second oxide semiconductor layer is preferably 1 nm or less (further preferably 0.2 nm or less) in a region overlapping with a gate electrode layer (the channel formation region).

As described above, with the use of the second oxide semiconductor layer 106a which is formed by crystal growth from the crystalline region of the purified first oxide semiconductor layer 104a, a semiconductor device having favorable electric characteristics can be realized.

The second oxide semiconductor layer 106a is comparatively stable, and thus can prevent entry of an impurity (e.g., water) thereto. Accordingly, the reliability of the second oxide semiconductor layer 106a can be improved.

The meaning of the purification of the oxide semiconductor to cause the oxide semiconductor to be an intrinsic (i-type) oxide semiconductor, an advantage of using such oxide semiconductor in a semiconductor device, and the like will be described below.

<Formation of an Intrinsic Oxide Semiconductor>

Although a lot of researches on properties of an oxide semiconductor such as density of state (DOS) have been conducted, they do not include the idea of sufficiently reducing the defect level itself According to an embodiment of the disclosed invention, a purified intrinsic (i-type) oxide semiconductor is formed by removing water or hydrogen which might cause the increase in the DOS from the oxide semiconductor. This is based on the idea of sufficiently reducing the DOS itself. Thus, excellent industrial products can be manufactured.

Note that when hydrogen, water, or the like is removed, oxygen is also removed in some cases. Therefore, it is favorable that the oxide semiconductor be further purified to be an intrinsic (i-type) oxide semiconductor by supplying oxygen to dangling bonds of metal which are generated by oxygen deficiency and thereby reducing the DOS resulted from oxygen deficiency. For example, the DOS resulted from oxygen deficiency can be reduced in the following manner: an oxide film having excessive oxygen is formed in a close contact with a channel formation region; and heat treatment at higher than or equal to 200° C. and lower than or equal to 400° C., typically, approximately 250° C., is performed so that oxygen is supplied to the oxide semiconductor from the oxide film. The gas may be switched from an inert gas to a gas containing oxygen during the heat treatment. Further, oxygen can be supplied to an oxide semiconductor by performing a temperature decreasing step in an atmosphere from which hydrogen, water, or the like is sufficiently removed or an oxygen atmosphere, successively after the heat treatment.

It can be considered that a factor of deterioration of oxide semiconductor characteristics is a shallow level formed due to excessive hydrogen at 0.1 eV to 0.2 eV below the conduction band, a deep level resulted from oxygen deficiency, or the like. The technical idea of thoroughly removing hydrogen and sufficiently supplying oxygen in order to eliminate these defects would be reasonable.

Note that although an oxide semiconductor generally has an n-type conductivity, in one embodiment of the disclosed invention, an i-type oxide semiconductor is obtained by removing an impurity such as water or hydrogen and supplying oxygen that is a component of the oxide semiconductor. In this respect, it can be said that one embodiment of the invention disclosed herein includes a novel technical idea because it is different from an i-type semiconductor such as silicon added with an impurity element.

When the i-type oxide semiconductor is used, favorable temperature characteristics of the transistor can be obtained. Typically, as for current-voltage characteristics of the transistor, in the temperature range from −25° C. to 150° C., on-state current, off-state current, field-effect mobility, S value, and threshold voltage hardly vary, and thus the current-voltage characteristics hardly deteriorate due to the temperature.

The transistor using an oxide semiconductor described in this embodiment has a mobility approximately two digits lower than that of a transistor using silicon carbide. However, the current value of the transistor using an oxide semiconductor can be increased by increasing the drain voltage or the channel width (W); thus, device characteristics can be improved.

A technical idea of this embodiment is to purify an oxide semiconductor itself by intentionally removing an impurity such as water or hydrogen which undesirably exists in the oxide semiconductor, without adding an impurity into the oxide semiconductor. In other words, a technical idea of this embodiment is to purify an oxide semiconductor by removing water or hydrogen that forms a donor level and sufficiently supplying oxygen which is a main component of the oxide semiconductor so as to reduce oxygen deficiency.

According to the measurement by SIMS (secondary ion mass spectroscopy), hydrogen exists in the oxide semiconductor at approximately $1\times10^{20}$ cm$^{-3}$ at the time right after the deposition of the oxide semiconductor. Water or hydrogen which causes a donor level is intentionally removed and oxygen (one of the components of the oxide semiconductor) which is decreased with the removal of water or hydrogen is added to the oxide semiconductor, whereby the oxide semiconductor is purified to be an electrically intrinsic (i-type) semiconductor.

Further, in the embodiments, it is preferable that the amount of water and hydrogen be as small as possible, and it is also preferable that the number of carriers in an oxide semiconductor be as small as possible. In other words, a carrier density of less than $1\times10^{12}$ cm$^{-3}$, preferably less than $1.4\times10^{10}$ cm$^3$ which is less than or equal to the measurement limit is needed. In addition, an ideal career density is 0 cm$^3$ or approximately 0 cm$^{-3}$ in the technical idea of this embodiment. In particular, when an oxide semiconductor is subjected to heat treatment in an oxygen atmosphere, a nitrogen atmosphere, or an atmosphere of ultra-dry air (air in which the water content is less than or equal to 20 ppm, preferably less than or equal to 1 ppm, and more preferably less than or equal to 10 ppb) at a temperature higher than or equal to 450° C. and lower than or equal to 850° C., preferably higher than or equal to 550° C. and lower than or equal to 750° C., water or hydrogen which serves as an n-type impurity can be removed and the oxide semiconductor can be purified. In addition, when the oxide semiconductor is purified by removing an impurity such as water or hydrogen, the carrier density thereof can be less than $1\times10^{12}$ cm$^{-3}$, preferably less than $1.4\times10^{10}$ cm$^{-3}$ which is less than or equal to the measurement limit.

In addition, when the heat treatment is performed at a high temperature of higher than or equal to 450° C. and lower than or equal to 850° C., preferably higher than or equal to 600° C. and lower than or equal to 700° C., the oxide semiconductor can be purified and also crystallized, and crystal growth proceeds from a surface of the oxide semiconductor toward the inside thereof, so that the oxide semiconductor becomes a polycrystalline layer whose c-axis is aligned.

According to an embodiment of the present invention, a polycrystalline layer whose c-axis is aligned is used as a seed crystal, a second oxide semiconductor is formed thereover, and heat treatment is performed at a temperature higher than or equal to 450° C. and lower than or equal to 850° C., preferably higher than or equal to 550° C. and lower than or equal to 750° C., so that the second oxide semiconductor can become a polycrystalline layer whose c-axis is aligned in a manner similar to that of the seed crystal. That is to say, ideal axial growth or epitaxial growth in which the c-axis of the seed crystal and the c-axis of the second oxide semiconductor are aligned in the same direction can be performed.

The second oxide semiconductor whose c-axis is aligned in the same direction as that of the seed crystal can be obtained not only by solid-phase growth caused by the heat treatment after deposition, but also by crystal growth during deposition in which the second oxide semiconductor is deposited typically by sputtering under the state of being heated at a temperature higher than or equal to 200° C. and lower than or equal to 600° C.

In addition, carriers in the oxide semiconductor are reduced, or preferably all carriers are removed, so that the oxide semiconductor serves as a path through which carriers pass in a transistor. As a result, the oxide semiconductor is a purified i-type (intrinsic) semiconductor which has no carrier or very few carriers, so that off-state current of a transistor in an off state can be extremely low, which is the technical idea of this embodiment.

In addition, when the oxide semiconductor serves as a path, and the oxide semiconductor itself is a purified i-type (intrinsic) semiconductor which has no carriers or very few carriers, carriers are supplied by a source electrode and a drain electrode. When the electron affinity χ and the Fermi level, preferably the Fermi level corresponding to the intrinsic Fermi level in the oxide semiconductor and the work functions of the source electrode and the drain electrode are appropriately selected, carriers can be injected from the source electrode and the drain electrode. Therefore, an n-channel transistor and a p-channel transistor can be manufactured appropriately.

In a lateral transistor in which a channel is formed substantially parallel to a substrate, a source and a drain as well as the channel need to be provided, so that the area occupied by the transistor in the substrate is increased, which hinders miniaturization. However, in a vertical transistor, a source, a channel, and a drain are stacked, whereby the area occupied by the transistor in a substrate surface can be reduced. As a result of this, it is possible to miniaturize the thin film transistor.

As described above, the oxide semiconductor film is purified so as to contain impurities that are not main components of the oxide semiconductor film, typically hydrogen, water, a hydroxyl group, or hydride, as little as possible and is made to include a polycrystalline region, whereby favorable operation of the transistor can be obtained. Specifically, the withstand voltage can be increased, a short-channel effect can be reduced, and an on/off ratio can be increased. In addition, the amount of shift in threshold voltage of the transistor in the BT test can be reduced, so that high reliability can be realized. Further, the temperature dependence of electric characteristics can be reduced. In the transistor formed using the oxide semiconductor layer including the c-axis-aligned polycrystalline layer, the amount of shift in threshold voltage of the transistor can be reduced in the BT test in which the transistor is continuously irradiated with light. Accordingly, the transistor having stable electric characteristics can be manufactured.

<Advantage of the Process Over Other Semiconductor Materials>

As a semiconductor material that can be compared to an oxide semiconductor, silicon carbide (e.g., 4H—SiC) or the like can be given. There are some commonalities between an oxide semiconductor and 4H—SiC. The carrier concentration is one example of the commonalities between the oxide semiconductor and 4H—SiC. In accordance with Fermi-Dirac distribution, the minority carrier density of an oxide semiconductor is estimated to be approximately $10^{-7}/cm^3$. This value of the minority carrier density is extremely small similarly to that of 4H—SiC, which is $6.7\times10^{-11}/cm^3$. When the minority carrier density of an oxide semiconductor is compared with the intrinsic carrier density of silicon (approximately $1.4\times10^{10}/cm^3$), it can be understood well that the minority carrier density of an oxide semiconductor is significantly low.

In addition, the energy band gap of the oxide semiconductor is greater than or equal to 3.0 eV and less than or equal to 3.5 eV, and the energy band gap of 4H—SiC is 3.26 eV. Therefore, an oxide semiconductor is similar to silicon carbide in that they are both wide-gap semiconductors.

On the other hand, there is a major difference between an oxide semiconductor and silicon carbide, that is, the process temperature. In general, a heat treatment at higher than or equal to 1500° C. and lower than or equal to 2000° C. is required when using silicon carbide. At such a high temperature, a semiconductor substrate, a semiconductor element, or the like using a material other than silicon carbide is damaged, and thus, it is difficult to form a semiconductor element using silicon carbide over a semiconductor element using a semiconductor material other than silicon carbide. On the other hand, an oxide semiconductor can be obtained through heat treatment at higher than or equal to 300° C. and lower than or equal to 800° C. Therefore, it is possible to form a semiconductor element using an oxide semiconductor after forming an integrated circuit using another semiconductor material.

In the case of using an oxide semiconductor, there is an advantage that it is possible to use a substrate having low heat resistance such as a glass substrate, which is different from the case where silicon carbide is used. Moreover, an oxide semiconductor can be obtained without high-temperature heat treatment so that energy cost can be reduced sufficiently as compared with the case of using silicon carbide. Further, in silicon carbide, a crystal defect or a small amount of impurities which is introduced into the silicon carbide without intention is a factor that generates carriers. In theory, a low carrier density equivalent to that of the oxide semiconductor of the present invention can be obtained in the case of silicon carbide; however, it is practically difficult to obtain a carrier density of $10^{12}/cm^3$ or lower because of the above-described reasons. The same is true when the oxide semiconductor is compared to gallium nitride which is also known as a wide band-gap semiconductor.

<Conduction Mechanism of a Transistor Including an Oxide Semiconductor>

The conduction mechanism of a transistor including an oxide semiconductor will be described with reference to FIG. 18, FIGS. 19A and 19B, FIGS. 20A and 20B, and FIG. 21. Note that the following description is based on the assumption of an ideal situation for easy understanding and does not entirely reflect a real situation. In addition, the following description is only one consideration.

Figure 18:
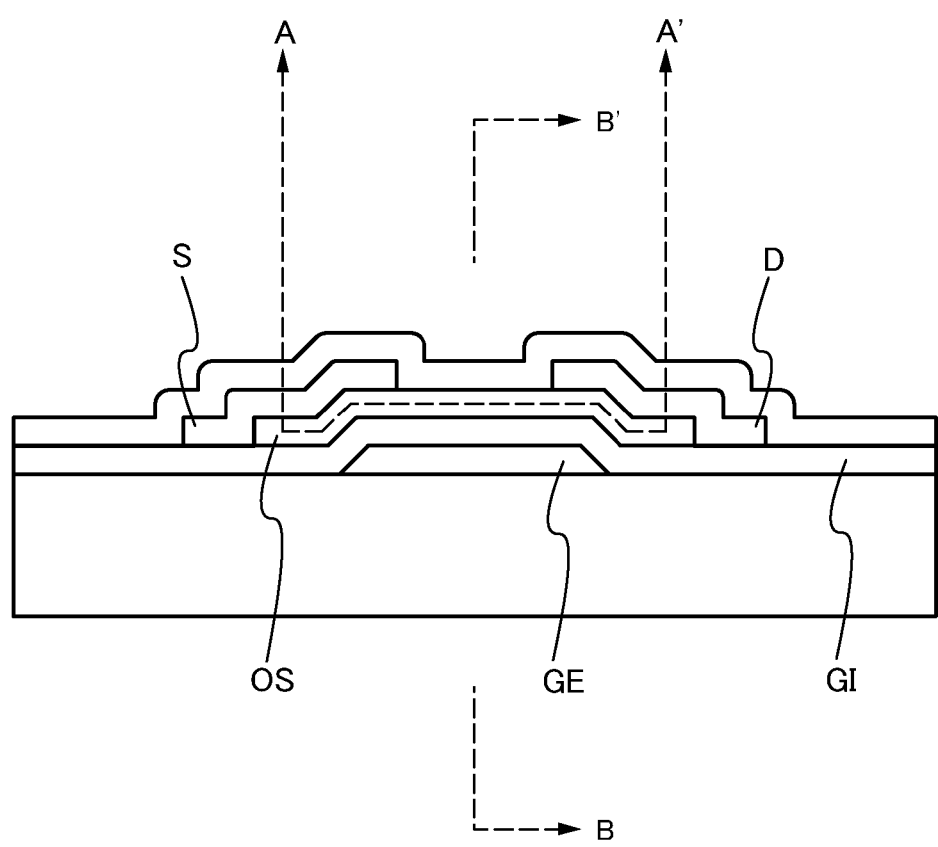
FIG. 18 is a cross-sectional view of a transistor including an oxide semiconductor.

FIG. 18 is a cross-sectional view of a transistor (thin film transistor) including an oxide semiconductor. An oxide semiconductor layer (OS) is provided over a gate electrode (GE) with a gate insulating layer (GI) provided therebetween, and a source electrode (S) and a drain electrode (D) are provided over the oxide semiconductor layer.

Figure 19:
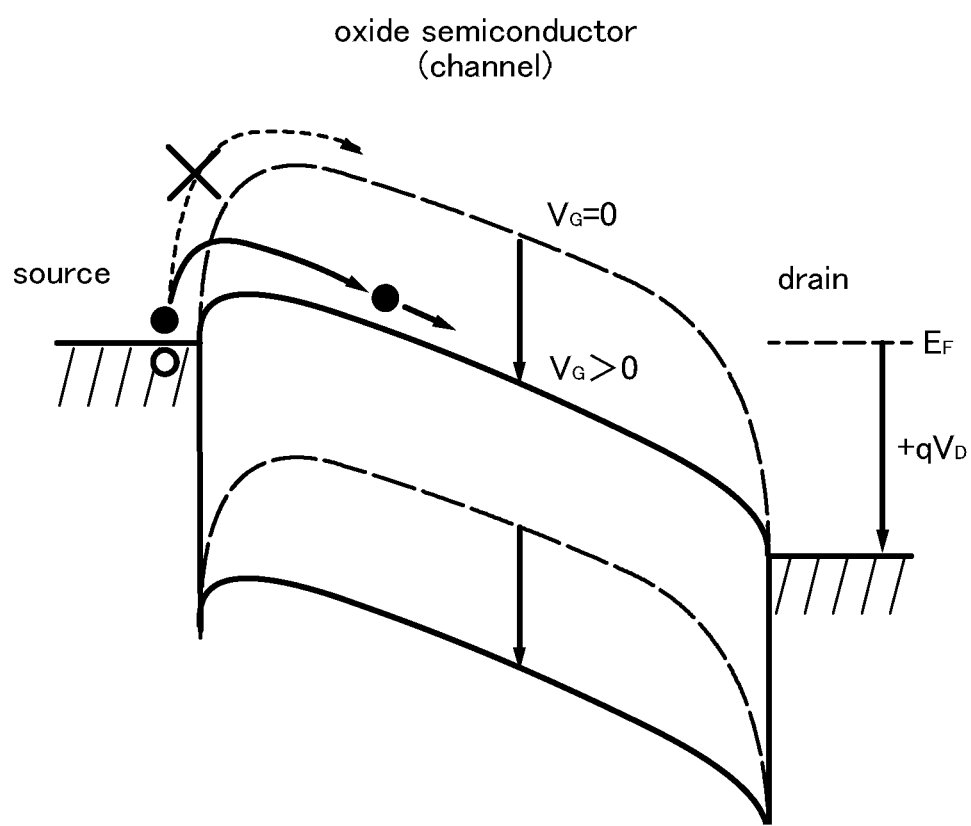
FIG. 19 is an energy band diagram (schematic diagram) along line A-A' in FIG. 18.

FIG. 19 is energy band diagram (schematic diagram) of a cross section taken along line A-A' in FIG. 18. In FIG. 19, a black circle (●) and a white circle (○) represent an electron and a hole and have electric charges (−q, +q), respectively. With a positive voltage ($V_D>0$) applied to the drain electrode, the dashed line shows the case where no voltage is applied to the gate electrode ($V_G=0$) and the solid line shows the case where a positive voltage is applied to the gate electrode ($V_G>0$). In the case where no voltage is applied to the gate electrode, carriers (electrons) are not injected to the oxide semiconductor side from an electrode because of high potential barrier, so that a current does not flow, which means an off state. On the other hand, when a positive voltage is applied to the gate electrode, potential barrier is lowered, and thus a current flows, which means an on state.

Figure 20A:
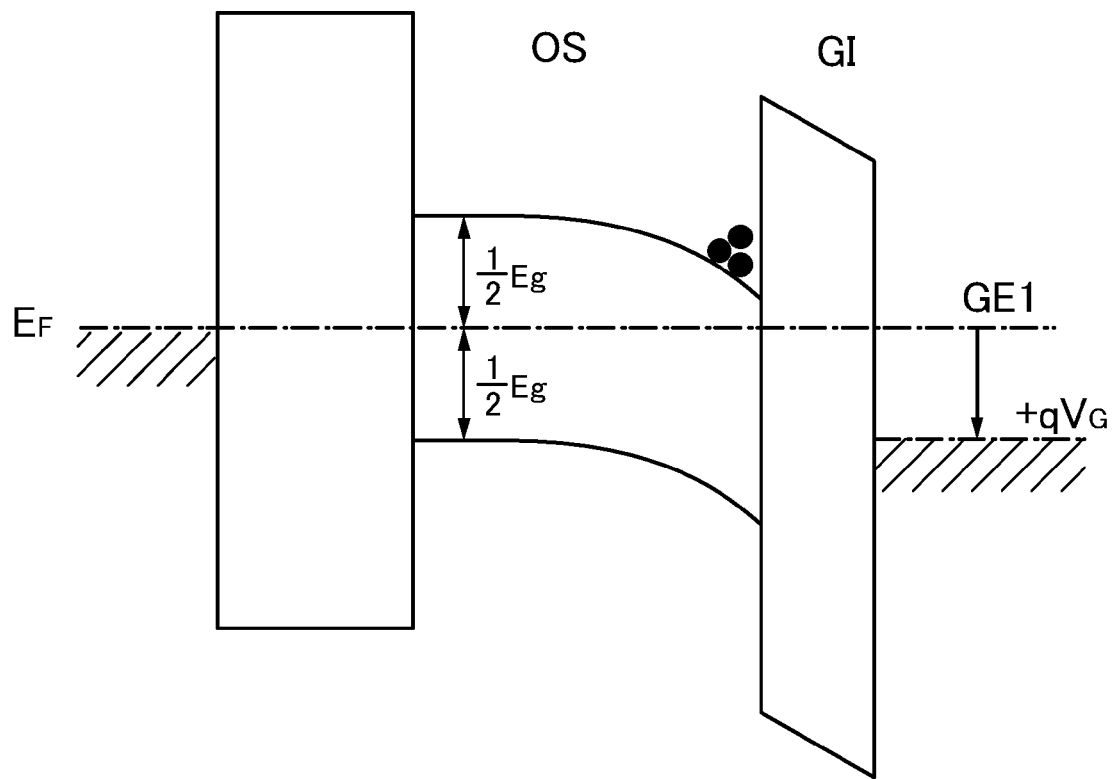
FIG. 20A shows a state in which a positive potential ($+V_G$) is applied to a gate (GE)
Figure 20B:
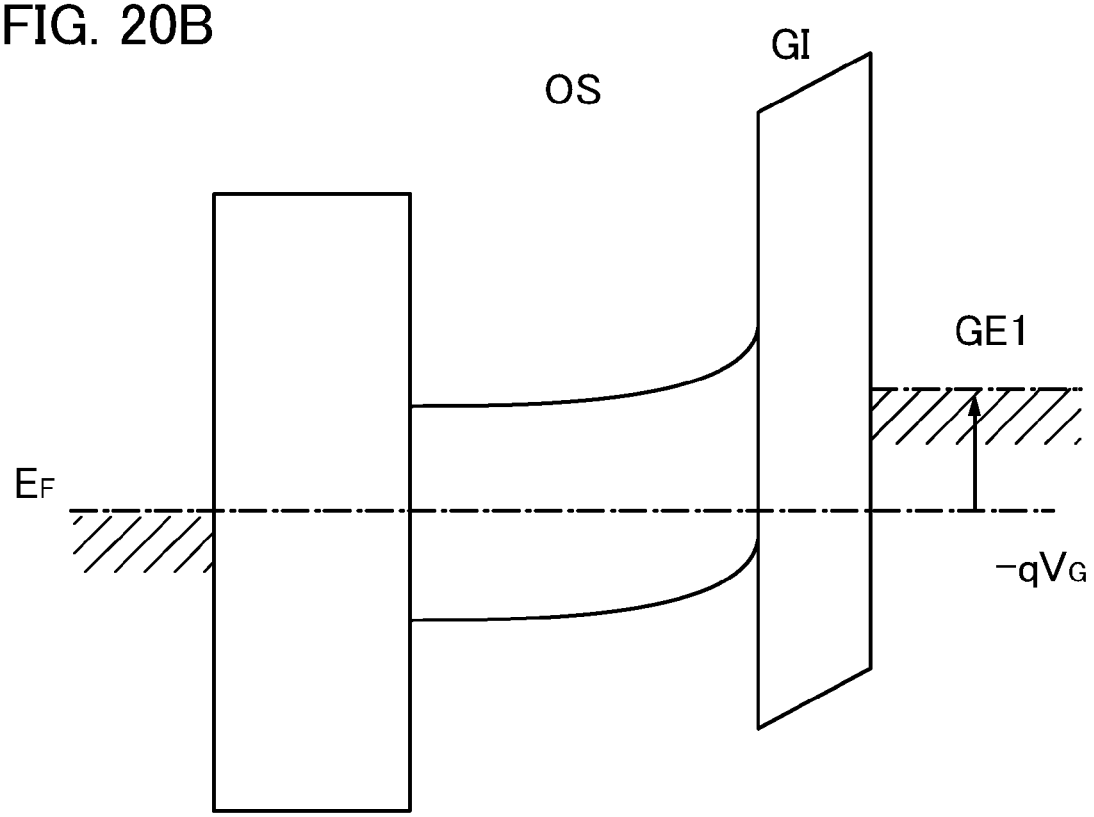
FIG. 20B shows a state in which a negative potential ($-V_G$) is applied to the gate (GE)

FIGS. 20A and 20B are energy band diagrams (schematic diagrams) of a cross section taken along line B-B' in FIG. 18. FIG. 20A illustrates a state where a positive potential ($V_G$>0) is applied to the gate electrode (GE) and an on state where carriers (electrons) flow between the source electrode and the drain electrode. FIG. 20B illustrates a state where a negative potential ($V_G$<0) is applied to the gate electrode (GE) and an off state (a minority carrier does not flow).

Figure 21:
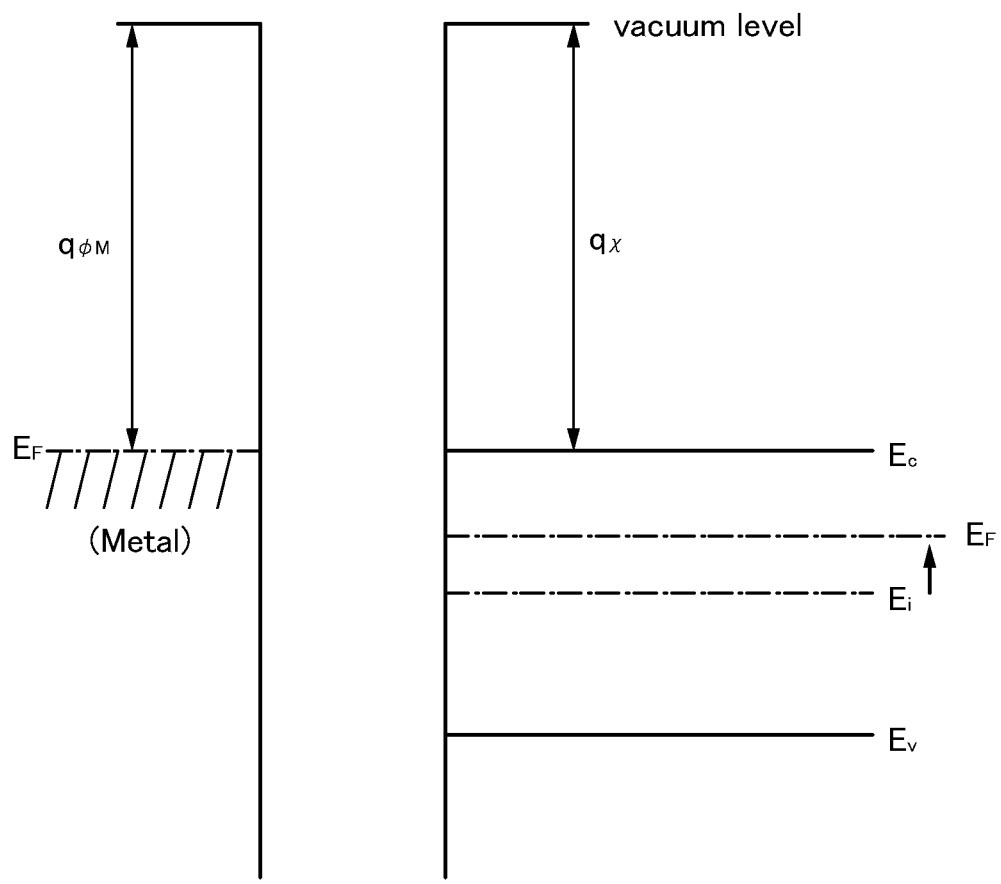
FIG. 21 shows relations between the vacuum level and the work function ($\phi_M$) of a metal, and between the vacuum level and the electron affinity ($\chi$) of an oxide semiconductor.

FIG. 21 shows the relations between the vacuum level and the work function of a metal ($\phi_M$) and between the vacuum level and the electron affinity ($\chi$) of an oxide semiconductor.

Because electrons in a metal are degenerated at room temperature, the Fermi level is located in the conduction band. On the other hand, a conventional oxide semiconductor is an n-type semiconductor, in which case the Fermi level ($E_F$) is away from the intrinsic Fermi level ($E_i$) located in the middle of a band gap and is located closer to the conduction band. Note that it is known that part of hydrogen is a donor in an oxide semiconductor and is one factor causing an oxide semiconductor to be an n-type semiconductor. Further, oxygen deficiency is known as one of the causes to produce an n-type oxide semiconductor.

In contrast, an oxide semiconductor according to an embodiment of the disclosed invention is an oxide semiconductor that is made to be intrinsic (i-type) or to be close to intrinsic in the following manner: hydrogen, which is the cause to produce an n-type oxide semiconductor, is removed from the oxide semiconductor for purification, so that the oxide semiconductor includes an element (impurity element) other than main components of the oxide semiconductor as little as possible, and in addition oxygen deficiency is removed. That is, a feature of an embodiment of the present invention is that an oxide semiconductor is made to be or be close to a purified i-type (intrinsic) semiconductor not by addition of an impurity element but by removal of impurities such as hydrogen and water and oxygen deficiency as much as possible. Thus, the Fermi level ($E_F$) can be comparable with the intrinsic Fermi level ($E_i$).

It is said that the band gap ($E_g$) of an oxide semiconductor is 3.15 eV and the electron affinity ($\chi$) is 4.3 V. The work function of titanium (Ti) used for forming the source and drain electrodes is substantially equal to the electron affinity ($\chi$) of the oxide semiconductor. In that case, a Schottky barrier for electrons is not formed at an interface between the metal and the oxide semiconductor.

At that time, as illustrated in FIG. 20A, the electron travels in the vicinity of the interface between the gate insulating layer and the purified oxide semiconductor (the bottom portion of the oxide semiconductor, which is energetically stable).

As illustrated in FIG. 20B, when a negative potential is supplied to the gate electrode (GE), a hole which is a minority carrier does not exist substantially. Thus, the current value is substantially close to 0.

In such a manner, the oxide semiconductor becomes intrinsic (i-type) or substantially intrinsic by being purified so as to contain an element (impurity element) other than its main components as little as possible. Thus, characteristics of the interface between the oxide semiconductor and the gate insulating layer become obvious. For that reason, the gate insulating layer needs to form a favorable interface with the oxide semiconductor. Specifically, it is preferable to use the following insulating layer, for example: an insulating layer formed by a CVD method using high-density plasma generated at a power supply frequency in the range of the VHF band to the microwave band, or an insulating layer formed by a sputtering method.

By purifying the oxide semiconductor and forming a favorable interface between the oxide semiconductor and the gate insulating layer, for example, when the channel width (W) of a transistor is $1\times10^4$ µm and the channel length (L) thereof is 3 lam, characteristics such as an off-state current of less than or equal to $1\times10^{-13}$ A and a subthreshold swing value (S value) of 0.1 V/dec. (the thickness of the gate insulating layer: 100 nm) can be realized.

When the oxide semiconductor is purified as described above so as to contain an element (impurity element) other than its main elements as little as possible, the transistor can operate in a favorable manner.

<Resistance to Hot Carrier Degradation of a Transistor Using an Oxide Semiconductor>

Next, the resistance to hot carrier degradation of a transistor using an oxide semiconductor will be described with reference to FIG. 22 and FIG. 23. Note that the following description is based on the assumption of an ideal situation for easy understanding and does not entirely reflect a real situation. In addition, the following description is only one consideration.

Main causes of hot carrier degradation are channel hot electron injection (CHE injection) and drain avalanche hot carrier injection (DAHC injection). Note that only electrons are considered below for simplicity.

CHE injection refers to a phenomenon in which electrons in a semiconductor layer which have gained energy higher than that of the barrier of a gate insulating layer are injected into the gate insulating layer or the like. Electrons gain energy by being accelerated by a low electric field.

DAHC injection refers to a phenomenon in which electrons generated by collision of electrons accelerated by a high voltage are injected into a gate insulating layer or the like. A difference between DAHC injection and CHE injection is whether or not they involve avalanche breakdown caused by impact ionization. Note that DAHC injection requires electrons having a kinetic energy higher than a band gap of a semiconductor.

Figure 22:
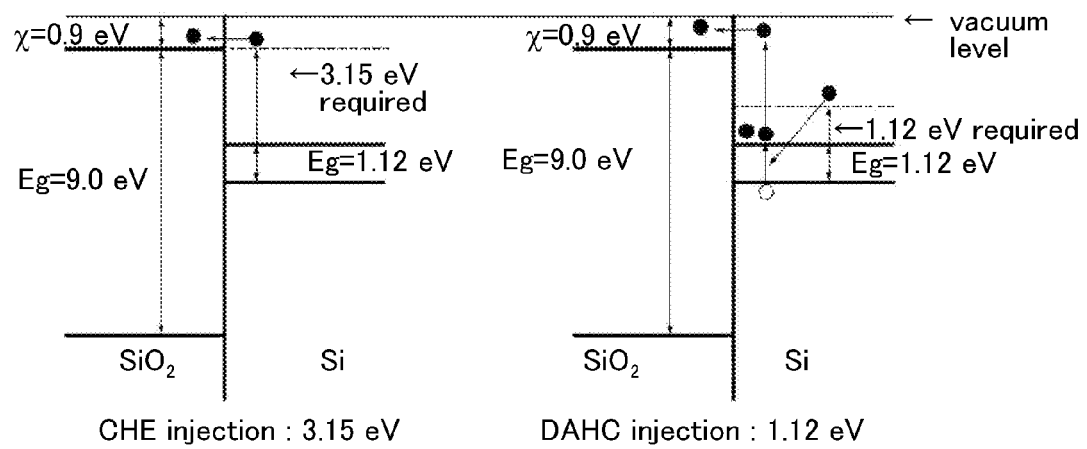
FIG. 22 is a diagram showing the amount of energy which induces injection of hot carriers in silicon (Si)
Figure 23:
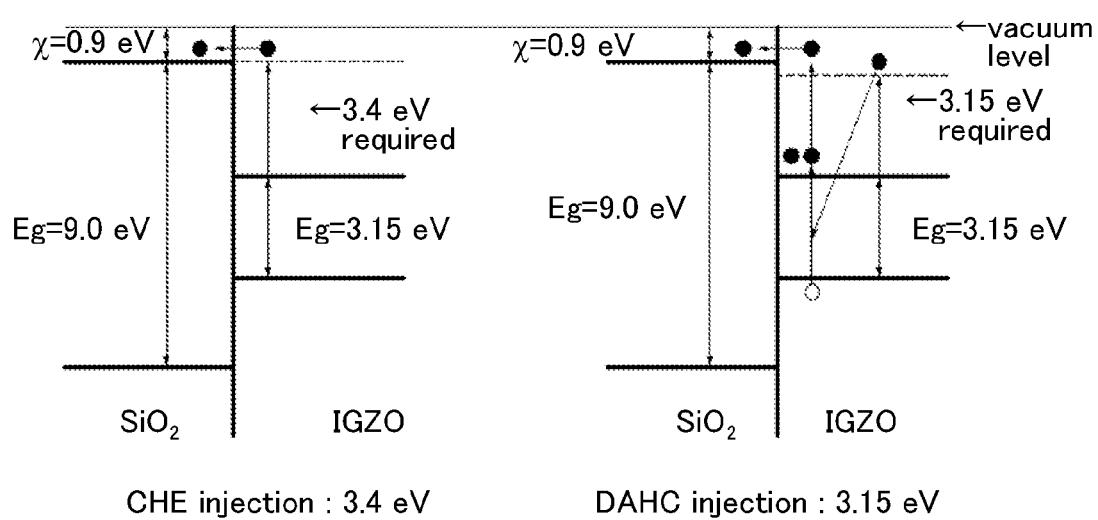
FIG. 23 is a diagram showing the amount of energy which induces injection of hot carriers in an In—Ga—Zn—O-based oxide semiconductor (IGZO)

FIG. 22 shows the amount of energy which induces injection of hot carriers, which is estimated from the band structure of silicon (Si). FIG. 23 shows the amount of energy which induces injection of hot carriers, which is estimated from the band structure of an In—Ga—Zn—O-based oxide semiconductor (IGZO). In FIG. 22 and FIG. 23, the diagram on the left shows CHE injection and the diagram on the right shows DAHC injection.

Regarding silicon, degradation caused by DAHC injection is more serious than that caused by CHE injection. This results from the fact that silicon has a narrow band gap and avalanche breakdown readily occurs therein. Since carriers (e.g., electrons) which are accelerated without collision are very few in silicon, the probability of CHE injection is low. On the other hand, the avalanche breakdown increases the number of electrons capable of travelling over the barrier of the gate insulating layer, and thus the probability of DAHC injection readily becomes higher than that of CHE injection.

Regarding an In—Ga—Zn—O-based oxide semiconductor, the amount of energy which induces CHE injection does not greatly differ from that in the case of silicon, whereas the amount of energy which induces DAHC injection is substantially equal to the amount of energy which induces CHE injection due to the wide bandgap. That is, the probability of DAHC injection is low.

In a similar manner to that of silicon, carriers (e.g., electrons) which are accelerated without collision are very few; accordingly, the probability of CHE injection is also low. That is, an In—Ga—Zn—O-based oxide semiconductor has high resistance to hot carrier degradation as compared to silicon.
<Short-Channel Effect in a Transistor Using an Oxide Semiconductor>

Next, a short-channel effect in a transistor using an oxide semiconductor will be described with reference to FIG. 24. Note that the following description is based on the assumption of an ideal situation for easy understanding and does not entirely reflect a real situation. In addition, the following description is only one consideration.

The short-channel effect refers to degradation of electric characteristics which becomes obvious with miniaturization of a transistor (a reduction in channel length (L)). The short-channel effect results from the effect of a drain on a source. Specific examples of the short-channel effect are a decrease in threshold voltage, an increase in subthreshold swing (S value), an increase in leakage current, and the like.

Here, a structure capable of suppressing a short-channel effect is examined by device simulation. Specifically, four kinds of models each having a different carrier density and a different thickness of an oxide semiconductor layer were prepared, and the relationship between a channel length (L) and a threshold voltage ($V_{th}$) was checked.

As the models, bottom-gate transistors were employed, each of which had a carrier density of $1.7 \times 10^{-8}/cm^3$ or $1.0 \times 10^{15}/cm^3$ and an oxide semiconductor layer with a thickness of 1 μm or 30 nm. Note that an In—Ga—Zn—O-based oxide semiconductor was used for the oxide semiconductor, and a silicon oxynitride film with a thickness of 100 nm was used as a gate insulating layer.

Note that there is no significant difference in calculation results between a top-gate transistor and a bottom-gate transistor.

Figure 24:
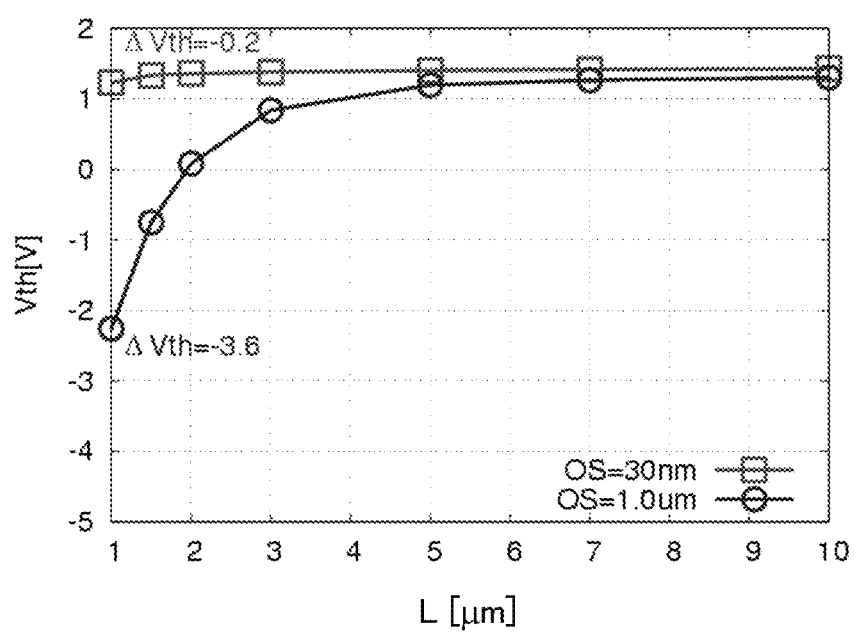
FIG. 24 shows results of device simulation concerning the short-channel effect.
Figure 25:
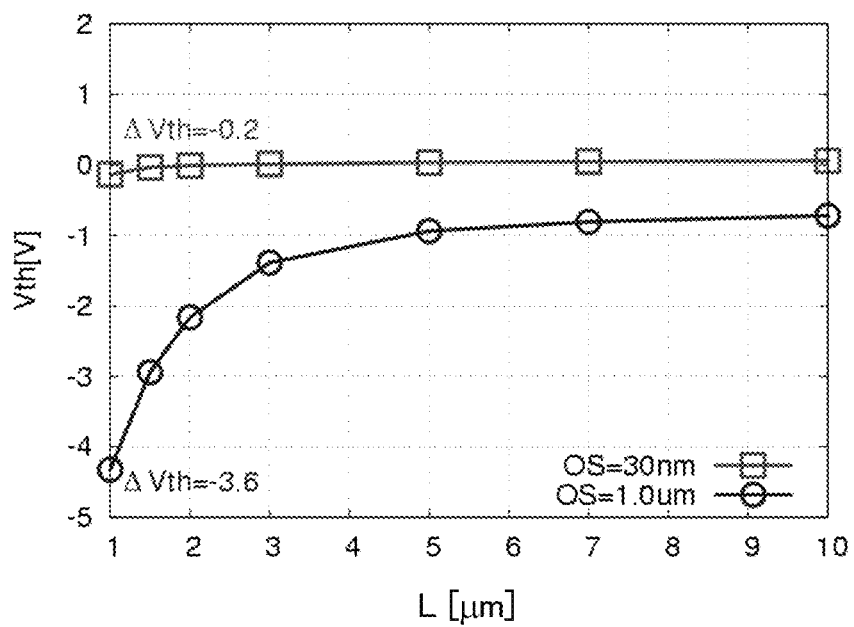
FIG. 25 shows results of device simulation concerning the short-channel effect.

FIG. 24 and FIG. 25 show calculation results. FIG. 24 shows the case where the carrier density is $1.7 \times 10^{-8}/cm^3$ and FIG. 25 shows the case where the carrier density is $1.0 \times 10^{15}/cm^3$. The results show that a short-channel effect can be suppressed by a reduction in thickness of an oxide semiconductor layer in a transistor including an oxide semiconductor. For example, in the case where the channel length is approximately 1 μm, even with an oxide semiconductor layer having a sufficiently low carrier density, it can be understood that a short-channel effect can be sufficiently suppressed when the thickness of the oxide semiconductor layer is set to about 3 nm to 50 nm, preferably about 3 nm to 20 nm, typically about 20 nm <Carrier Density of an Oxide Semiconductor>

One of technical ideas according to the invention disclosed herein is that an oxide semiconductor layer is made close to an intrinsic (i-type) oxide semiconductor layer as much as possible by a sufficient reduction in carrier density of the oxide semiconductor layer. A method for obtaining the carrier density and the carrier density measured in an oxide semiconductor layer will be described below with reference to FIG. 26 and FIG. 27.

The carrier density in an oxide semiconductor layer can be obtained in such a manner that a MOS capacitor including the oxide semiconductor layer is formed and the result of C-V measurement (C-V characteristics) of the MOS capacitor is evaluated.

The carrier density is measured in the following three steps: Step 1 for obtaining C-V characteristics by plotting the relation between the gate voltage Vg and the capacitance C of a MOS capacitor; Step 2 for obtaining a graph representing the relation between the gate voltage Vg and $(1/C)^2$ from the C-V characteristics and obtaining a differential value of $(1/C)^2$ in a weak inversion region in the graph; and Step 3 for substituting the obtained differential value into the following Formula 1 representing the carrier density $N_d$. Note that in Formula 1, e represents the elementary electric charge, $\varepsilon_0$ represents the dielectric constant of a vacuum, and $\varepsilon$ represents the relative dielectric constant of an oxide semiconductor.

$$N_d = -\left(\frac{2}{e\varepsilon_0\varepsilon}\right) / \frac{d(1/C)^2}{dV} \quad \text{[Formula 1]}$$

As a sample for the measurement, a MOS capacitor having the following structure was used. The MOS capacitor includes a 300-nm-thick titanium layer over a glass substrate, a 100-nm-thick titanium nitride layer over the titanium layer, a 2-μm-thick oxide semiconductor layer using an In—Ga—Zn—O-based oxide semiconductor (a-IGZO) over the titanium nitride layer, a 300-nm-thick silicon oxynitride layer over the oxide semiconductor layer, and a 300-nm-thick silver layer over the silicon oxynitride layer.

The oxide semiconductor layer was formed by a sputtering method using a target for depositing an oxide semiconductor including In, Ga, and Zn (In:Ga:Zn=1:1:0.5 [atom %]). The atmosphere in which the oxide semiconductor layer was formed was a mixed atmosphere of argon and oxygen (the flow rates of Ar and $O_2$ were 30 (sccm) and 15 (sccm), respectively).

Figure 26:
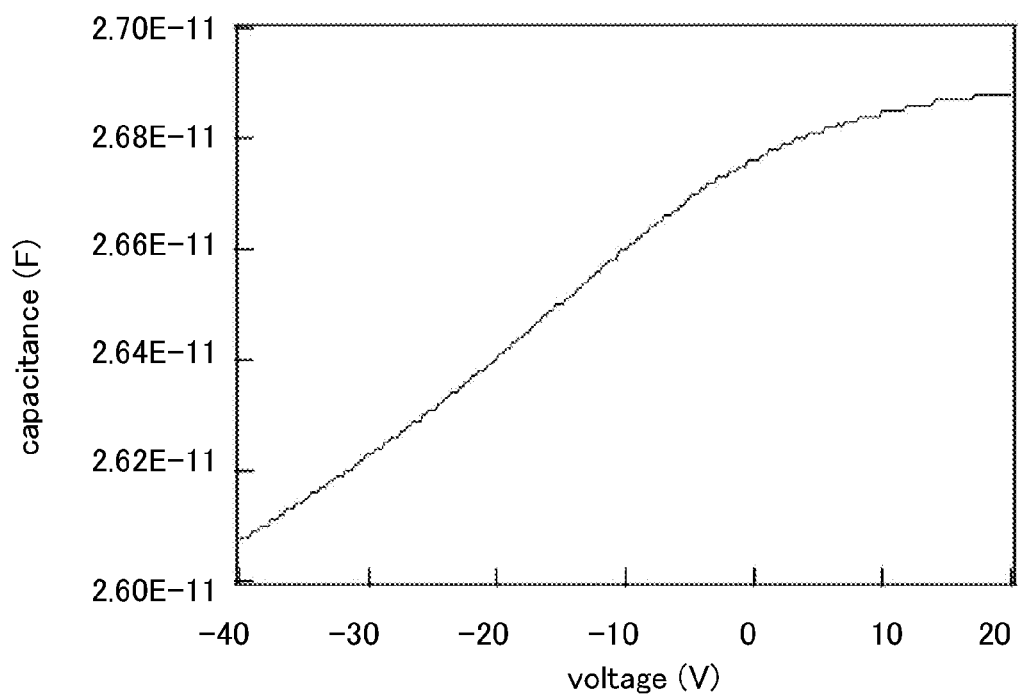
FIG. 26 shows C-V (capacitance-voltage) characteristics.
Figure 27:
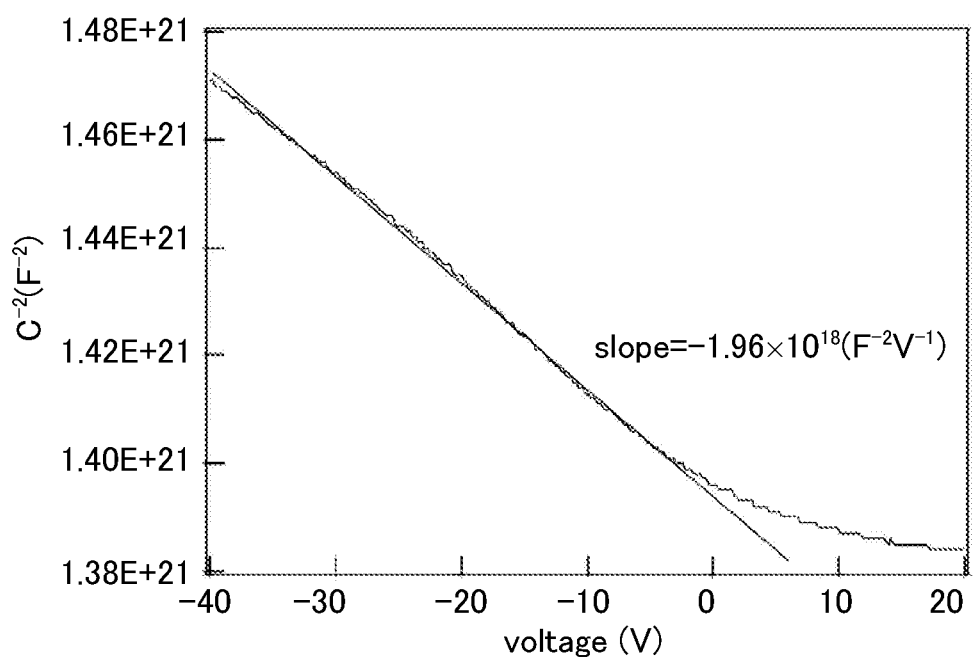
FIG. 27 shows a relation between Vg and $(1/C)^2$.

FIG. 26 shows C-V characteristics. FIG. 27 shows the relation between Vg and $(1/C)^2$. The carrier density obtained from Formula 1 using the differential value of $(1/C)^2$ in the weak inversion region in FIG. 27 was $6.0 \times 10^{10}/cm^3$.

With the use of an oxide semiconductor that becomes intrinsic or substantially intrinsic (e.g., the carrier density is less than $1 \times 10^{12}/cm^3$ and preferably less than $1.45 \times 10^{10}/cm^3$), a transistor with excellent off-state current characteristics can be obtained.

As described above, it is understood that a variety of advantageous effects can be obtained when an oxide semiconductor, in particular, a purified intrinsic oxide semiconductor is used. In addition, when the intrinsic oxide semiconductor layer with a crystalline structure is realized as described in the disclosed invention, a novel semiconductor device having excellent characteristics is realized.

<Method for Manufacturing a Semiconductor Device>

Next, a method for manufacturing a transistor 150 will be described with reference to FIGS. 2A to 2E and FIGS. 3A to 3D.

An insulating layer 102 is formed over a substrate 100. Then, a first oxide semiconductor layer is formed over the insulating layer 102, and first heat treatment is performed to crystallize at least a region including a surface of the first oxide semiconductor layer, whereby a first oxide semiconductor layer 104 is formed (see FIG. 2A).

The substrate 100 may be any substrate that has an insulating surface and may be, for example, a glass substrate. It is preferable to use a glass substrate because it enables the mass production of a semiconductor device according to an embodiment of the present invention. The glass substrate is preferably a non-alkali glass substrate. As a material of the non-alkali glass substrate, a glass material such as aluminosilicate glass, aluminoborosilicate glass, barium borosilicate glass, or the like is used, for example. Alternatively, as the substrate 100, an insulating substrate formed using an insulator such as a ceramic substrate, a quartz substrate, or a sapphire substrate, a semiconductor substrate which is formed using a semiconductor material such as silicon and whose surface is covered with an insulating material, or a conductive substrate which is formed using a conductor such as metal or stainless steel and whose surface is covered with an insulating material can be used. A plastic substrate can also be used as long as it can withstand heat treatment in a manufacturing process.

The insulating layer 102 functions as a base and can be formed by a CVD method, a sputtering method, or the like. The insulating layer 102 is preferably formed so as to include silicon oxide, silicon nitride, silicon oxynitride, silicon nitride oxide, aluminum oxide, hafnium oxide, tantalum oxide, or the like. Note that the insulating layer 102 may have a single-layer structure or a stacked structure. There is no particular limitation on the thickness of the insulating layer 102; the insulating layer 102 can have a thickness greater than or equal to 10 nm and less than or equal to 500 nm, for example. The insulating layer 102 is not an essential component here; therefore, a structure in which the insulating layer 102 is not provided is also possible.

If hydrogen, water, or the like is contained in the insulating layer 102, hydrogen may enter the oxide semiconductor layer or extract oxygen from the oxide semiconductor layer, whereby characteristics of the transistor may be degraded. Therefore, it is desirable to form the insulating layer 102 so as to include as little hydrogen or water as possible.

In the case of using a sputtering method or the like, for example, it is desirable that the insulating layer 102 be formed in a state where moisture remaining in the treatment chamber is removed. In order to remove moisture remaining in the treatment chamber, an adsorption-type vacuum pump such as a cryopump, an ion pump, or a titanium sublimation pump is preferably used. A turbo pump provided with a cold trap may be used. From the treatment chamber evacuated with a cryopump or the like, hydrogen, water, or the like is sufficiently removed; thus, the concentration of an impurity in the insulating layer 102 can be reduced.

When the insulating layer 102 is formed, it is desirable to use a high-purity gas in which an impurity such as hydrogen or water is reduced so that the concentration is decreased to approximately a value expressed in the unit "ppm" (preferably, "ppb").

The first oxide semiconductor layer can be formed using an In—Sn—Ga—Zn—O-based material which is a four-component metal oxide; an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material which are three-component metal oxides; an In—Zn—O-based material, a Sn—Zn—O-based material, an Al—Zn—O-based material, a Zn—Mg—O-based material, a Sn—Mg—O-based material, or an In—Mg—O-based material which are two-component metal oxides; or an In—O-based material, a Sn—O-based material, a Zn—O-based material, or the like.

In addition, an oxide semiconductor material expressed by In-A—B—O may be used. Here, A represents one or plural kinds of elements selected from elements belonging to Group 13, such as gallium (Ga) or aluminum (Al), elements belonging to Group 14 typified by silicon (Si) or germanium (Ge), or the like. In addition, B represents one or plural kinds of elements selected from elements belonging to Group 12 typified by zinc (Zn). Note that the In content, the A content, and the B content are set freely, and the case where the A content is zero is included. On the other hand, the In content and the B content are not zero. In other words, the above expression includes In—Ga—Zn—O, In—Zn—O, and the like.

In particular, an In—Ga—Zn—O-based oxide semiconductor material has sufficiently high resistance when there is no electric field and thus off-state current can be sufficiently reduced. In addition, having a high field-effect mobility, the In—Ga—Zn—O-based oxide semiconductor material is suitable for a semiconductor material used in a semiconductor device.

As a typical example of the In—Ga—Zn—O-based oxide semiconductor material, one represented by $InGaO_3(ZnO)_m$ (m>0) is given. Using M instead of Ga, there is an oxide semiconductor material expressed by $InMO_3(ZnO)_m$ (m>0). Here, M denotes one or more of metal elements selected from gallium (Ga), aluminum (Al), iron (Fe), nickel (Ni), manganese (Mn), cobalt (Co), and the like. For example, M may be Ga, Ga and Al, Ga and Fe, Ga and Ni, Ga and Mn, Ga and Co, or the like. Note that the above-described compositions are derived from the crystal structures that the oxide semiconductor material can have and are only examples.

In this embodiment, the first oxide semiconductor layer is formed by a sputtering method using a target for depositing an In—Ga—Zn—O-based oxide semiconductor.

As the target for depositing the first oxide semiconductor layer by a sputtering method, a metal oxide target containing zinc oxide as its main component can be used, for example. The composition ratio of the target for depositing an oxide semiconductor including In, Ga, and Zn is such that In:Ga:Zn=1:x:y (x is greater than or equal to 0 and less than or equal to 2, and y is greater than or equal to 1 and less than or equal to 5). For example, a target having such a composition ratio that In:Ga:Zn=1:1:1 [atomic ratio] (x=1, y=1) (that is, $In_2O_3$:$Ga_2O_3$:ZnO=1:1:2 [molar ratio]) may be used. As the target for depositing an oxide semiconductor, a target having such a composition ratio that In:Ga:Zn=1:1:0.5 [atomic ratio], a target having such a composition ratio that In:Ga:Zn=1:1:2 [atomic ratio], or a target having such a composition ratio that In:Ga:Zn=1:0:1 [atomic ratio] (x=0, y=1) can be used. In this embodiment, it is preferable to use a target for depositing an oxide semiconductor which can easily induce crystallization, for later intentional crystallization induced by heat treatment.

In addition, it is preferable that an oxide semiconductor contained in the target for depositing an oxide semiconductor have a relative density of 80% or more, preferably 95% or more, further preferably 99.9% or more. With a target for depositing an oxide semiconductor having a high relative density, the first oxide semiconductor layer is formed dense. In this embodiment, it is preferable to use a target for depositing an oxide semiconductor which can easily induce crystallization, for later intentional crystallization of the first oxide semiconductor layer induced by heat treatment.

The atmosphere in which the first oxide semiconductor layer is formed is preferably a rare gas (typically, argon) atmosphere, an oxygen atmosphere, or a mixed atmosphere of a rare gas (typically, argon) and oxygen. Specifically, it is preferable to use a high-purity gas atmosphere, for example, from which an impurity such as hydrogen, water, a hydroxyl group, or hydride is removed so that the concentration is decreased to approximately a value expressed in the unit "ppm" (preferably, "ppb").

At the time of forming the first oxide semiconductor layer, for example, the substrate is held in a treatment chamber that is maintained at reduced pressure and the substrate temperature is set to a temperature higher than or equal to 100° C. and lower than or equal to 600° C., preferably higher than or equal to 200° C. and lower than or equal to 400° C. Then, a sputtering gas from which hydrogen and water are removed is introduced into the treatment chamber from which remaining moisture is removed, and metal oxide is used as a target; thus, the first oxide semiconductor layer is formed. When the oxide semiconductor layer is formed while the substrate is heated, impurities contained in the first oxide semiconductor layer can be reduced. In addition, damage by sputtering can be reduced. It is preferable to remove moisture or the like remaining in the sputtering apparatus before, during, or after the formation of the first oxide semiconductor layer. In order to remove moisture remaining in the treatment chamber, an adsorption-type vacuum pump is preferably used. For example, a cryopump, an ion pump, a titanium sublimation pump, or the like can be used. Alternatively, a turbo pump provided with a cold trap may be used. Since hydrogen, water, or the like is removed from the treatment chamber which is evacuated with the cryopump, the concentration of impurities in the first oxide semiconductor layer can be reduced.

For example, the deposition conditions of the first oxide semiconductor layer are as follows: the distance between the substrate and the target is 170 mm, the pressure is 0.4 Pa, the direct-current (DC) power is 0.5 kW, and the atmosphere is an oxygen atmosphere (the proportion of oxygen in the oxygen flow is 100%). Note that the use of a pulse direct-current (DC) power supply is preferable because it reduces dust (powder or flake-like substances produced at the time of deposition) and it makes the film thickness uniform. The thickness of the first oxide semiconductor layer is preferably greater than or equal to 3 nm and less than or equal to 15 nm, and is 5 nm in this embodiment. Note that the appropriate thickness varies depending on the material of the oxide semiconductor, the usage, or the like, and thus the thickness is selected as appropriate depending on the material, the usage, or the like.

Note that before the first oxide semiconductor layer is formed by a sputtering method, reverse sputtering in which plasma is generated with an argon gas introduced is preferably performed so that a material attached to the surface of the insulating layer 102 is removed. Here, the reverse sputtering is a method by which ions collide with a surface to be processed so that the surface is modified, in contrast to normal sputtering by which ions collide with a sputtering target. An example of a method for making ions collide with a surface to be processed is a method in which high-frequency voltage is applied to the surface in an argon atmosphere so that plasma is generated near a substrate. Note that an atmosphere of nitrogen, helium, oxygen, or the like may be used instead of an argon atmosphere.

Further, pre-heat treatment is preferably performed before the deposition of the first oxide semiconductor layer, in order to remove moisture or hydrogen which remains on an inner wall of a sputtering apparatus, on a surface of the target, or inside a target material. As the pre-heat treatment, a method in which the inside of the deposition chamber is heated to higher than or equal to 200° C. and lower than or equal to 600° C. under reduced pressure, a method in which introduction and exhaustion of nitrogen or an inert gas are repeated while the inside of the deposition chamber is heated, and the like can be given. After the pre-heat treatment, the substrate or the sputtering apparatus is cooled. Then, an oxide semiconductor layer is formed without exposure to the air. In this case, not water but oil or the like is preferably used as a coolant for the target. Although a certain level of effect can be obtained when introduction and exhaustion of nitrogen are repeated without heating, it is further preferable to perform the treatment with the inside of the deposition chamber heated.

Next, first heat treatment is performed on the first oxide semiconductor layer to crystallize at least a region including a surface of the first oxide semiconductor layer, whereby the first oxide semiconductor layer 104 is formed. Through this first heat treatment, water (including a hydroxyl group), hydrogen, or the like in the first oxide semiconductor layer can be removed. The temperature of the first heat treatment is higher than or equal to 450° C. and lower than or equal to 850° C., preferably higher than or equal to 550° C. and lower than or equal to 750° C. The heating period is longer than or equal to 1 minute and shorter than or equal to 24 hours. In this embodiment, the first heat treatment is performed at 700° C. for 1 hour in a dry air atmosphere.

Note that in the first heat treatment, it is preferable that water, hydrogen, or the like be not contained in nitrogen, oxygen, or a rare gas such as helium, neon, or argon. It is preferable that nitrogen, oxygen, or a rare gas such as helium, neon, or argon introduced into a heat treatment apparatus have a purity of greater than or equal to 6N (99.9999%), preferably greater than or equal to 7N (99.99999%) (that is, the impurity concentration is set to less than or equal to 1 ppm, preferably less than or equal to 0.1 ppm). The first heat treatment may be performed in an ultra-dry air with an $H_2O$ concentration of 20 ppm or less, further preferably in an ultra-dry air with an $H_2O$ concentration of 1 ppm or less. With such first heat treatment, water (including a hydroxyl group), hydrogen, or the like in the first oxide semiconductor layer 104 can be removed. Accordingly, the i-type or substantially i-type first oxide semiconductor layer 104 in which impurities are reduced can be formed, which enables the transistor 150 to have extremely excellent characteristics.

In addition, when the temperature is increased in the first heat treatment, the inside of a furnace may be set to a nitrogen atmosphere, and when cooling is performed, the inside of the furnace may be switched to an oxygen atmosphere. By performing dehydration or dehydrogenation in a nitrogen atmosphere and switching the atmosphere to an oxygen atmosphere, oxygen can be supplied into the first oxide semiconductor layer, so that an i-type oxide semiconductor layer can be obtained.

Through the first heat treatment, the first oxide semiconductor layer 104 which includes a crystalline region in the region including at least the surface of the first oxide semiconductor layer 104 is formed. The crystalline region formed in the region including the surface is formed by crystal growth from the surface toward the inside. The crystalline region includes a plate-like crystal with an average thickness of greater than or equal to 2 nm and less than or equal to 10 nm. The crystalline region includes a crystal whose c-axis is aligned in a direction substantially perpendicular to the surface. Here, a "substantially perpendicular direction" means a direction within ±10° from a perpendicular direction.

Although an example in which the entire region of the first oxide semiconductor layer is crystallized by the first heat treatment is described in this embodiment, this embodiment is not limited thereto as long as the crystalline region is formed in the region including at least the surface of the first oxide semiconductor layer 104. For example, the first oxide semiconductor layer 104 may include an amorphous region in the vicinity of a bottom surface of the first oxide semiconductor layer 104, that is, an interface between the first oxide semiconductor layer 104 and the insulating layer 102. The existence of the amorphous region in the vicinity of the interface between the first oxide semiconductor layer 104 and the insulating layer 102 is favorable because carriers flowing in the crystalline region are prevented from being directly affected by the interface with the insulating layer 102.

Note that the apparatus used for the first heat treatment is not limited to a particular apparatus, and an apparatus for heating a process object using heat radiation or heat conduction from a heating element such as a resistance heating element, or the like can be used. For example, an electric furnace, or a rapid thermal annealing (RTA) apparatus such as a gas rapid thermal annealing (GRTA) apparatus or a lamp rapid thermal annealing (LRTA) apparatus can be used. An LRTA apparatus is an apparatus for heating a process object using radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas.

Figure 2A:
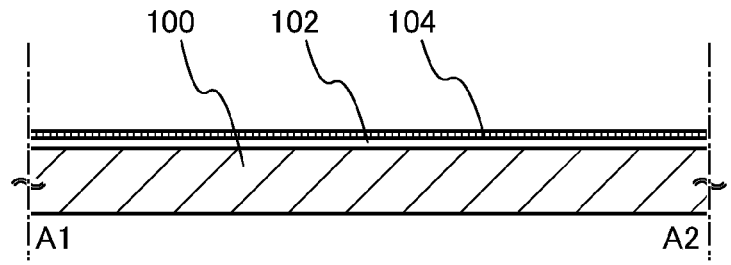
FIGS. 2A to 2E are cross-sectional views illustrating a manufacturing process of a semiconductor device.
Figure 2B:
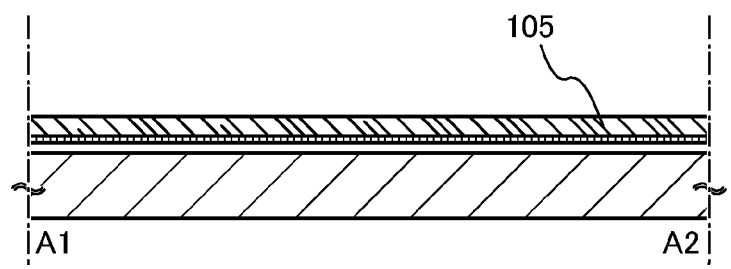

Next, a second oxide semiconductor layer 105 is formed over the first oxide semiconductor layer 104 which includes the crystalline region in the region including at least the surface (see FIG. 2B).

The second oxide semiconductor layer 105 can be formed in a manner similar to that of the first oxide semiconductor layer, using an In—Sn—Ga—Zn—O-based material which is a four-component metal oxide; an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material which are three-component metal oxides; an In—Zn—O-based material, a Sn—Zn—O-based material, an Al—Zn—O-based material, a Zn—Mg—O-based material, a Sn—Mg—O-based material, or an In—Mg—O-based material which are two-component metal oxides; an In—O-based material, a Sn—O-based material, a Zn—O-based material which are one-component metal oxides; or the like.

In particular, an In—Ga—Zn—O-based oxide semiconductor material has sufficiently high resistance when there is no electric field and thus off-state current can be sufficiently reduced. In addition, having a high field-effect mobility, the In—Ga—Zn—O-based oxide semiconductor material is suitable for a semiconductor material used in a semiconductor device.

As a typical example of the In—Ga—Zn—O-based oxide semiconductor material, one represented by $InGaO_3(ZnO)_m$ (m>0) is given. Using M instead of Ga in the above structure, there is an oxide semiconductor material expressed by $InMO_3(ZnO)_m$ (m>0). Here, M denotes one or more of metal elements selected from gallium (Ga), aluminum (Al), iron (Fe), nickel (Ni), manganese (Mn), cobalt (Co), and the like. For example, M may be Ga, Ga and Al, Ga and Fe, Ga and Ni, Ga and Mn, Ga and Co, or the like. Note that the above-described compositions are derived from the crystal structures that the oxide semiconductor material can have and are only examples.

It is preferable that the second oxide semiconductor layer 105 be formed using a material whose main component is the same as that of the material of the first oxide semiconductor layer 104 or that the second oxide semiconductor layer 105 have the same crystal structure as the first oxide semiconductor layer 104 and a lattice constant similar to that of the first oxide semiconductor layer 104 (a mismatch of 1% or less). Alternatively, the first oxide semiconductor layer 104 and the second oxide semiconductor layer 105 may be formed using materials having different main components.

In the case of using materials including the same main component, crystal growth is easily caused in later crystallization of the second oxide semiconductor layer 105 because the crystalline region of the first oxide semiconductor layer 104 serves as a seed. In addition, since the thickness can be increased substantially, using materials including the same main component is suitable for the application to power devices or the like. Further, in the case of using materials including the same main component, favorable interface characteristics such as adhesiveness or favorable electric characteristics can be obtained.

In the case of using materials having different main components, the layers can have different electric characteristics. For example, when a material having a high electric conductivity is used for the second oxide semiconductor layer and a material having a low electric conductivity is used for the first oxide semiconductor layer, a semiconductor device in which an influence of the base interface is reduced can be realized. In the case where a favorable seed crystal is formed by using a material which can be easily crystallized for the first oxide semiconductor layer and then the second oxide semiconductor layer is formed and crystallized, the second oxide semiconductor layer can have favorable crystallinity independently of the easiness of crystallization of the second oxide semiconductor layer.

In this embodiment, the second oxide semiconductor layer 105 is formed by a sputtering method using a target for depositing an In—Ga—Zn—O-based oxide semiconductor. The deposition of the second oxide semiconductor layer 105 by a sputtering method may be conducted in a manner similar to the above-described deposition of first oxide semiconductor layer by a sputtering method. Note that the thickness of the second oxide semiconductor layer 105 is preferably larger than that of the first oxide semiconductor layer 104. A second oxide semiconductor layer 105 is preferably formed so that the sum of the thicknesses of the first oxide semiconductor layer 104 and the second oxide semiconductor layer 105 may be greater than or equal to 3 nm and less than or equal to 50 nm. Note that the appropriate thickness varies depending on the material of the oxide semiconductor, the usage, or the like, and thus the thickness is selected as appropriate depending on the material, the usage, or the like.

Next, second heat treatment is performed on the second oxide semiconductor layer 105 to cause crystal growth using the crystalline region of the first oxide semiconductor layer 104 as a seed. Thus, a second oxide semiconductor layer 106 is formed (see FIG. 2C).

The temperature of the second heat treatment is higher than or equal to 450° C. and lower than or equal to 850° C., preferably higher than or equal to 600° C. and lower than or equal to 700° C. The heating period of the second heat treatment is longer than or equal to 1 hour and shorter than or equal to 100 hours, preferably longer than or equal to 5 hours and shorter than or equal to 20 hours, and typically 10 hours.

Note that also in the second heat treatment, it is preferable that water, hydrogen, or the like be not contained in nitrogen, oxygen, or a rare gas such as helium, neon, or argon. It is preferable that nitrogen, oxygen, or a rare gas such as helium, neon, or argon introduced into a heat treatment apparatus have a purity of greater than or equal to 6N (99.9999%), preferably greater than or equal to 7N (99.99999%) (that is, the impurity concentration is set to less than or equal to 1 ppm, preferably less than or equal to 0.1 ppm). The second heat treatment may be performed in an ultra-dry air with an $H_2O$ concentration of 20 ppm or less, further preferably in an ultra-dry air with an $H_2O$ concentration of 1 ppm or less. With such second heat treatment, water (including a hydroxyl group), hydrogen, or the like in the second oxide semiconductor layer 106 can be removed. Accordingly, the i-type or substantially i-type second oxide semiconductor layer 106 in which impurities are reduced can be formed, which enables the transistor 150 to have extremely excellent characteristics.

In addition, when the temperature is increased in the second heat treatment, the inside of a furnace may be set to a nitrogen atmosphere, and when cooling is performed, the inside of the furnace may be switched to an oxygen atmosphere. By performing dehydration or dehydrogenation in a nitrogen atmosphere and switching the atmosphere to an oxygen atmosphere, oxygen can be supplied into the second oxide semiconductor layer 106, so that an i-type oxide semiconductor layer can be obtained.

In this manner, the second heat treatment is performed in a long period, whereby the entire region of the second oxide semiconductor layer 105 is crystallized from the crystalline region formed in the vicinity of the interface between the second oxide semiconductor layer 105 and the first oxide semiconductor layer 104; thus, the second oxide semiconductor layer 106 can be formed. Further, by the second heat treatment, the crystalline layer of the first oxide semiconductor layer 104 can have higher orientation.

The second oxide semiconductor layer 106 includes a crystal whose c-axis is aligned in a direction substantially perpendicular to the interface between the first oxide semiconductor layer 104 and the second oxide semiconductor layer 106, in a manner similar to that of the crystalline region of the first oxide semiconductor layer 104. Here, a "substantially perpendicular direction" means a direction within ±10° from a perpendicular direction.

For example, in the case where an In—Ga—Zn—O-based oxide semiconductor material is used for the second oxide semiconductor layer 106, the second oxide semiconductor layer 106 can include a crystal represented by $InGaO_3(ZnO)_m$ (m>0, and m is not a natural number), a crystal represented by $In_2Ga_2ZnO_7$ (In:Ga:Zn:O=2:2:1:7), or the like. Owing to the second heat treatment, the c-axis of such a crystal is aligned in a direction substantially perpendicular to the surface of the oxide semiconductor layer 106.

Here, the above-described crystal includes any of In, Ga, and Zn, and can be considered to have a stacked structure of layers parallel to a-axis and b-axis. Specifically, the above-described crystal has a structure in which a layer including In and a layer not including In (a layer including Ga or Zn) are stacked in a c-axis direction.

In the In—Ga—Zn—O-based oxide semiconductor crystal, the conductivity of the layer including In in a direction parallel to a-axis and b-axis is favorable. This is due to the fact that electric conductivity is mainly controlled by In in the In—Ga—Zn—O-based oxide semiconductor crystal and the fact that the 5s orbital of one In atom overlaps the 5s orbital of an adjacent In atom and thereby a carrier path is formed. In a direction perpendicular to the above-described layer (that is, the c-axis direction), an insulating property is increased.

In the case where the first oxide semiconductor layer 104 includes an amorphous region in the vicinity of the interface between the first oxide semiconductor layer 104 and the insulating layer 102, the second heat treatment may cause crystal growth from the crystalline region formed on the surface of the first oxide semiconductor layer 104 toward the bottom surface of the first oxide semiconductor layer and may crystallize the amorphous region in some cases. Note that depending on the material for forming the insulating layer 102 or heat treatment conditions, the amorphous region may remain.

Figure 2C:
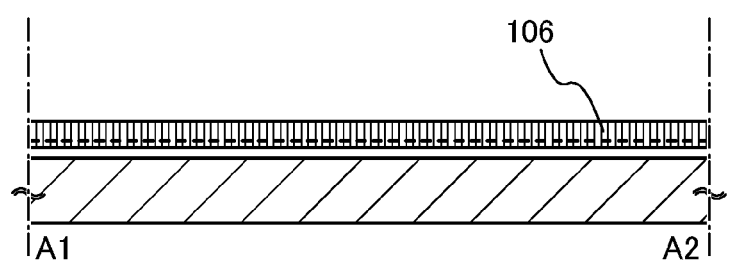

In the case where the first oxide semiconductor layer 104 and the second oxide semiconductor layer 105 are formed using oxide semiconductor materials including the same main component, as illustrated in FIG. 2C, crystal growth occurs upward to the surface of the second oxide semiconductor layer 105, in which the first oxide semiconductor layer 104 serves as a seed crystal of the crystal growth, so that the second oxide semiconductor layer 106 is formed. The first oxide semiconductor layer 104 and the second oxide semiconductor layer 105 have the same crystal structure. Therefore, although the boundary between the first oxide semiconductor layer 104 and the second oxide semiconductor layer 106 is indicated by dotted lines in FIG. 2C, it sometimes cannot be identified, and the first oxide semiconductor layer 104 and the second oxide semiconductor layer 106 can be sometimes regarded as one layer.

Since the second oxide semiconductor layer 106 is formed by crystal growth from the crystalline region of the first oxide semiconductor layer 104, the second oxide semiconductor layer 106 has electrical anisotropy. In the above-described example, the conductivity is increased in a direction parallel to the surface of the second oxide semiconductor layer 106, whereas the insulating property is increased in a direction perpendicular to the surface of the second oxide semiconductor layer 106. Thus, usage of the second oxide semiconductor layer 106 formed by crystal growth from the crystalline region of the purified first oxide semiconductor layer 104 can realize a semiconductor device having favorable electric characteristics.

Note that the apparatus for the second heat treatment is also not limited to a particular apparatus, and the apparatus may be provided with a device for heating a process object using heat radiation or heat conduction from a heating element such as a resistance heating element. For example, an electric furnace, or an RTA apparatus such as a GRTA apparatus or an LRTA apparatus can be used.

Figure 2D:
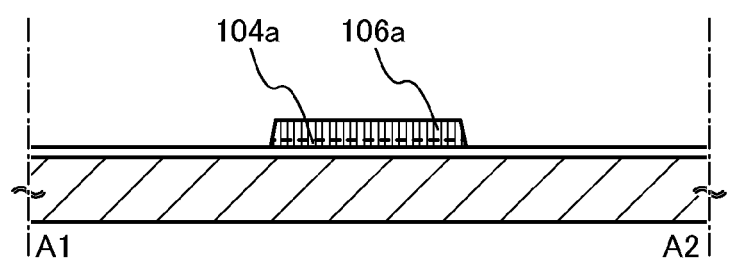

Next, the first oxide semiconductor layer 104 and the second oxide semiconductor layer 106 are processed by a method such as etching using a mask; thus, an island-shaped first oxide semiconductor layer 104a and an island-shaped second oxide semiconductor layer 106a are formed (see FIG. 2D).

As a method for etching the oxide semiconductor layers, either dry etching or wet etching may be employed. It is needless to say that dry etching and wet etching can be used in combination. The etching conditions (e.g., an etching gas or an etchant, etching time, and temperature) are set as appropriate depending on the material so that the oxide semiconductor layers can be etched into a desired shape.

As the dry etching method, a parallel-plate reactive ion etching (RIE) method, an inductively coupled plasma (ICP) etching method, or the like can be used. Also in this case, etching conditions (e.g., the amount of electric power applied to a coiled electrode, the amount of electric power applied to an electrode on the substrate side, and the electrode temperature on the substrate side) need to be set as appropriate.

An example of an etching gas which can be used for dry etching is a gas containing chlorine (a chlorine-based gas such as chlorine ($Cl_2$), boron trichloride ($BCl_3$), silicon tetrachloride ($SiCl_4$), or carbon tetrachloride ($CCl_4$)). Moreover, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like may be used.

An example of an etchant which can be used for wet etching includes a mixed solution of phosphoric acid, acetic acid, and nitric acid, an ammonia peroxide mixture (hydrogen peroxide solution of 31 wt %:ammonia solution of 28 wt %:water=5:2:2), or the like. An etchant such as ITO-07N (produced by KANTO CHEMICAL CO., INC.) may also be used.

Figure 2E:
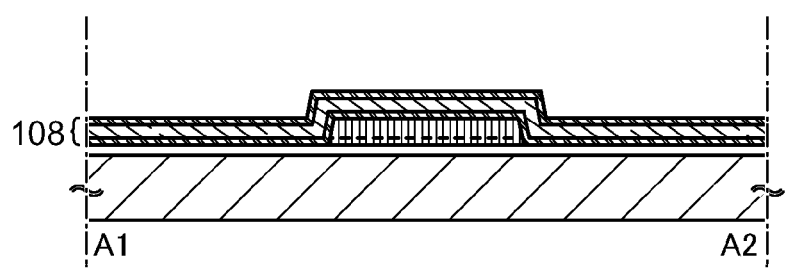

Next, a conductive layer 108 is formed in contact with the second oxide semiconductor layer 106a (see FIG. 2E).

The conductive layer 108 can be formed by a PVD method such as a sputtering method or a CVD method such as a plasma CVD method. The conductive layer 108 can be formed using an element selected from aluminum, chromium, copper, tantalum, titanium, molybdenum, and tungsten, an alloy including any of these elements as a component, or the like. A material including one or more of manganese, magnesium, zirconium, and beryllium may be used. A material including aluminum and one or more of elements selected from titanium, tantalum, tungsten, molybdenum, chromium, neodymium, and scandium may be used.

The conductive layer 108 may also be formed using a conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials in which silicon or silicon oxide is included can be used.

As the conductive layer 108, a three-layer structure in which an aluminum layer is stacked over a titanium layer and a titanium layer is stacked over the aluminum layer, or a three-layer structure in which an aluminum layer is stacked over a molybdenum layer and a molybdenum layer is stacked over the aluminum layer is preferable. Alternatively, a metal conductive film having a two-layer structure in which an aluminum layer and a tungsten layer are stacked, a two-layer structure in which a copper layer and a tungsten layer are stacked, or a two-layer structure in which an aluminum layer and a molybdenum layer are stacked can be used. Needless to say, the metal conductive film may have a single-layer structure or a stacked structure including four or more layers. In the case of the single-layer structure, a single-layer structure of a titanium layer is favorably used, for example. In the case of using a titanium layer having a single-layer structure, a favorable tapered shape can be obtained by etching to be performed later. Here, a three-layer structure including a titanium film, an aluminum film, and a titanium film is employed.

In the case of using a material having an ability of extracting oxygen from the second oxide semiconductor layer 106a (a material having a high oxygen affinity) such as titanium in a portion of the conductive layer 108, which is in contact with the second oxide semiconductor layer 106a, a region of the second oxide semiconductor layer 106a, which is in contact with the conductive layer 108 is changed to have an n-type conductivity due to oxygen deficiency. Utilizing this, resistance of a source region and a drain region can be reduced.

Alternatively, without using the material having an ability of extracting oxygen from the second oxide semiconductor layer 106a, an oxide conductive layer may be formed between the second oxide semiconductor layer 106a and the conductive layer 108. In the case of providing such an oxide conductive layer, the resistance of the source region and the drain region can be reduced as well.

Further, in the case where the region of the second oxide semiconductor layer 106a, which is in contact with the conductive layer 108, does not need to be changed to have an n-type conductivity, a material having a low ability of extracting oxygen (a material having a low oxygen affinity) is preferably used in a portion of the conductive layer 108, which is in contact with the second oxide semiconductor layer 106a. As such a material, titanium nitride can be given, for example. In a manner similar to the above, the conductive layer 108 may have either a single-layer structure or a stacked structure. In the case of the conductive layer 108 having a stacked structure, a two-layer structure of a titanium nitride film and a titanium film, a two-layer structure of a titanium nitride film and a tungsten film, a two-layer structure of a titanium nitride film and a copper-molybdenum alloy film, a two-layer structure of a tantalum nitride film and a tungsten film, a two-layer structure of a tantalum nitride film and a copper film, a three-layer structure of a titanium nitride film, a tungsten film, and a titanium film, or the like can be employed, for example.

In the case where the material having a low ability of extracting oxygen described above is used for the conductive layer 108, a change to an n-type in the oxide semiconductor layer due to extraction of oxygen can be prevented; accordingly, an adverse effect on transistor characteristics caused by uneven change to an n-type or the like can be prevented.

In the case of using a material having a high barrier property, such as a titanium nitride film or a tantalum nitride film as described above, in a portion of the conductive layer 108, which is in contact with the second oxide semiconductor layer 106a, entry of impurities into the second oxide semiconductor layer 106a can be prevented and an adverse effect on transistor characteristics can be reduced.

Figure 3A:
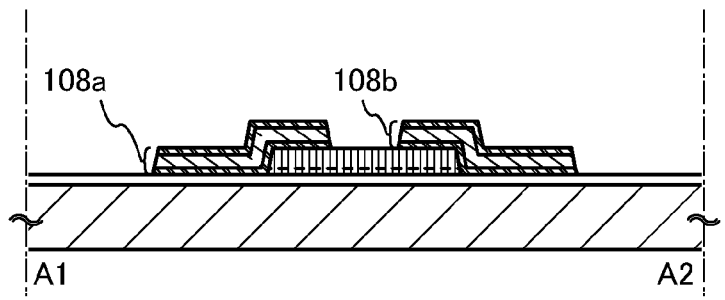
FIGS. 3A to 3D are cross-sectional views illustrating a manufacturing process of a semiconductor device.

Next, the conductive layer 108 is selectively etched to form a source or drain electrode layer 108a and a source or drain electrode layer 108b (see FIG. 3A). Further, an insulating layer may be formed over the conductive layer 108, and the insulating layer may be etched to form insulating layers having substantially the same shape as the source and the drain electrode layer, over the source and the drain electrode layer. In this case, capacitance (so-called gate capacitance) between the source and the drain electrode layer and the gate electrode can be reduced. Note that in this specification, the expression "substantially the same" does not necessarily mean "exactly the same" in a strict sense and includes the meaning of being considered as the same. For example, a difference made by a single etching process is acceptable. Further, the thickness does not need to be the same.

For light exposure in forming a mask used for etching, ultraviolet light, KrF laser light, or ArF laser light is preferably used. Particularly for light exposure in the case where the channel length (L) is less than 25 nm, light exposure for forming a mask is preferably performed with extreme ultraviolet light having a wavelength of several nanometers to several tens of nanometers, which is extremely short. In light exposure using extreme ultraviolet light, resolution is high and depth of focus is large. Therefore, the channel length (L) of a transistor, which is completed later, can be 10 nm to 1000 nm (1 μm). By a reduction in channel length using such a method, operation speed can be improved. In addition, the off-state current of a transistor including the above-described oxide semiconductor is small; thus, an increase in power consumption due to miniaturization can be suppressed.

The materials and etching conditions of the conductive layer 108 and the second oxide semiconductor layer 106a are adjusted as appropriate so that the second oxide semiconductor layer 106a is not removed in etching of the conductive layer 108. Note that in some cases, the second oxide semiconductor layer 106a is partly etched in the etching step and thus has a groove portion (a depression portion) depending on the materials and the etching conditions.

There is a case where the crystalline layers in contact with the source or drain electrode layer 108a and the source or drain electrode layer 108b are changed into an amorphous state in the vicinity of side surfaces of the first oxide semiconductor layer 104a and the second oxide semiconductor layer 106a.

In order to reduce the number of masks to be used and reduce the number of steps, an etching step may be performed with the use of a resist mask formed using a multi-tone mask which is a light-exposure mask through which light is transmitted to have a plurality of intensities. A resist mask formed with the use of a multi-tone mask has a plurality of thicknesses (has a stair-like shape) and further can be changed in shape by ashing; therefore, the resist mask can be used in a plurality of etching steps. That is, a resist mask corresponding to at least two kinds of different patterns can be formed by using one multi-tone mask. Thus, the number of light-exposure masks can be reduced and the number of corresponding photolithography steps can also be reduced, whereby a process can be simplified.

Here, heat treatment (third heat treatment) may be performed on the second oxide semiconductor layer 106a. By the third heat treatment, a high-purity crystalline region is formed in a region of the second oxide semiconductor layer 106a, which includes the exposed surface of the second oxide semiconductor layer 106a and overlaps with neither the source or drain electrode layer 108a nor the source or drain electrode layer 108b. Here, the high-purity crystalline region is a region having higher crystallinity than the other region in the second oxide semiconductor layer 106a. The area of the high-purity crystalline region varies depending on the material of the second oxide semiconductor layer 106a, conditions of the heat treatment, and the like. For example, the high-purity crystalline region can be extended to the lower interface of the second oxide semiconductor layer 106a.

For the third heat treatment, heat treatment similar to the first heat treatment can be employed. In other words, heat treatment using an electric furnace, heat treatment using heat conduction from a medium such as a heated gas, heat treatment using thermal radiation, or the like can be employed.

For example, GRTA treatment at a temperature higher than or equal to 400° C. and lower than or equal to 900° C., in which a high-temperature inert gas (e.g., nitrogen or a rare gas) is used, can be employed. Note that although the essential part of the invention does not require a particular upper limit of the heat treatment temperature, in the case where the substrate 100 has low heat resistance, the upper limit of the heat treatment temperature needs to be lower than the allowable temperature limit of the substrate 100.

In the case of employing GRTA treatment, the heat treatment period is preferably longer than or equal to 1 minute and shorter than or equal to 100 minutes. For example, GRTA treatment is preferably performed at 650° C. for approximately 3 minutes to 6 minutes. By employing the above-described GRTA treatment, heat treatment can be performed in a short time; therefore, an adverse effect of heat on the substrate 100 can be reduced. That is, the upper limit of the heat treatment temperature can be increased in this case as compared to the case where heat treatment is performed for a long time. In addition, the high-purity crystalline region can be easily formed in the region including the surface of the second oxide semiconductor layer 106a.

In the third heat treatment, it is preferable that hydrogen (including water) or the like be not contained in a treatment atmosphere. For example, the purity of an inert gas introduced into a heat treatment apparatus is 6N (99.9999%, that is, the impurity concentration is 1 ppm or lower) or more, preferably 7N (99.99999%, that is, the impurity concentration is 0.1 ppm or lower) or more. Instead of the inert gas, an oxygen gas in which hydrogen (including water) or the like is sufficiently reduced, a $N_2O$ gas, an ultra-dry air (with a dew point of −40° C. or lower, preferably −60° C. or lower), or the like may be used.

Although GRTA treatment is employed as the third heat treatment in this embodiment, the third heat treatment is not limited to the GRTA treatment. For example, heat treatment using an electric furnace, LRTA treatment, or the like can also be employed.

By the third heat treatment performed in the above-described manner, recrystallization can be caused to form a high-purity crystalline region, which is a crystalline region having higher purity in the second oxide semiconductor layer 106a including a crystal. Further, in the case where the surface of the second oxide semiconductor layer 106a is damaged in the formation of the source or drain electrode layer 108a and the source or drain electrode layer 108b, the damaged portion can be repaired by the third heat treatment.

In a manner similar to that of the above-described crystal, in a crystal of the oxide semiconductor in the high-purity crystalline region formed in such a manner, the c-axis is aligned in a direction substantially perpendicular to the surface of the oxide semiconductor layer. Here, a "substantially perpendicular direction" means a direction within ±10° from a perpendicular direction.

By including such a high-purity crystalline region, the second oxide semiconductor layer 106a can have a higher electrical anisotropy.

By provision of such a high-purity crystalline region in the second oxide semiconductor layer 106a, electric characteristics of the semiconductor device can be improved.

Figure 3B:
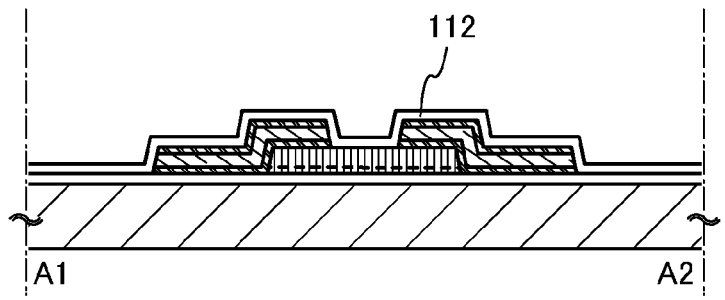

Next, a gate insulating layer 112 is formed in contact with part of the second oxide semiconductor layer 106a without exposure to the air (see FIG. 3B). The gate insulating layer 112 can be formed by a CVD method, a sputtering method, or the like. The gate insulating layer 112 is preferably formed so as to include silicon oxide, silicon nitride, silicon oxynitride, silicon nitride oxide, aluminum oxide, hafnium oxide, tantalum oxide, or the like. Note that the gate insulating layer 112 may have a single-layer structure or a stacked structure. There is no particular limitation on the thickness of the gate insulating layer 112; for example, the gate insulating layer 112 can have a thickness greater than or equal to 10 nm and less than or equal to 500 nm, preferably greater than or equal to 50 nm and less than or equal to 200 nm.

Note that an i-type or substantially i-type oxide semiconductor obtained by removing an impurity (a purified oxide semiconductor) is highly susceptible to interface states or interface charges; therefore, the gate insulating layer 112 needs to have high quality.

In this embodiment, the gate insulating layer 112 is formed using a high-density plasma apparatus. Here, a high-density plasma apparatus refers to an apparatus which can realize a plasma density higher than or equal to $1 \times 10^{11}/cm^3$.

For example, plasma is generated by application of a microwave power higher than or equal to 3 kW and lower than or equal to 6 kW so that the insulating film is formed.

For example, a high-density plasma CVD method using a microwave (e.g., 2.45 GHz) is favorable because the gate insulating layer 112 can be formed dense to have high withstand voltage and high quality. This is because a close contact between a purified oxide semiconductor layer and a high-quality gate insulating layer reduces interface states and produces desirable interface characteristics.

A monosilane gas ($SiH_4$), nitrous oxide ($N_2O$), and a rare gas are introduced into a chamber as a source gas to generate high-density plasma at a pressure higher than or equal to 10 Pa and lower than or equal to 30 Pa, so that the gate insulating layer 112 is formed. After that, the supply of a monosilane gas may be stopped, and nitrous oxide ($N_2O$) and a rare gas may be introduced without exposure to the air so that plasma treatment may be performed on a surface of the insulating film. The plasma treatment performed on the surface of the insulating film by introduction of nitrous oxide ($N_2O$) and a rare gas is performed at least after the formation of the insulating film. The insulating film formed through the above-described process procedure has a small thickness and is an insulating film whose reliability can be ensured even though it has a thickness less than 100 nm, for example.

In forming the gate insulating layer 112, the flow ratio of a monosilane gas ($SiH_4$) to nitrous oxide ($N_2O$) which are introduced into the chamber is in the range of 1:10 to 1:200. In addition, as a rare gas which is introduced into the chamber, helium, argon, krypton, xenon, or the like can be used. In particular, argon, which is inexpensive, is preferably used.

In addition, since the insulating film formed using the high-density plasma apparatus can have a uniform thickness, the insulating film has excellent step coverage. Further, with the high-density plasma apparatus, the thickness of a thin insulating film can be controlled precisely.

The insulating film formed through the above process procedure is greatly different from the insulating film formed using a conventional parallel-plate PCVD apparatus. The etching rate of the insulating film formed through the above process procedure is lower than that of the insulating film formed using the conventional parallel-plate PCVD apparatus by 10% or greater or 20% or greater in the case where the etching rates with the same etchant are compared to each other. Thus, it can be said that the insulating film formed using the high-density plasma apparatus is a dense film.

In this embodiment, as the gate insulating layer 112, a silicon oxynitride film (also referred to as $SiO_xN_y$, where x>y>0) having a thickness of 100 nm formed with a high-density plasma apparatus is used.

It is needless to say that another method such as a sputtering method or a plasma CVD method can also be employed as long as a high-quality insulating layer can be formed as the gate insulating layer 112. Moreover, it is possible to use an insulating layer whose quality, interface characteristics, or the like is improved by heat treatment performed after the formation of the insulating layer. In any case, an insulating layer that has a reduced interface state density and can form a favorable interface with an oxide semiconductor layer, as well as having favorable film quality as the gate insulating layer 112, is formed.

By thus improving characteristics of the interface with the gate insulating layer 112 and eliminating an impurity, particularly hydrogen, water, or the like, from an oxide semiconductor, it is possible to obtain a stable transistor whose threshold voltage ($V_{th}$) does not vary in a gate bias-temperature stress test (BT test: e.g., at 85° C. and $2\times10^6$ V/cm for 12 hours).

After that, fourth heat treatment is preferably performed in an inert gas atmosphere or an oxygen atmosphere. The temperature of the heat treatment is set in the range of 200° C. to 400° C., preferably 250° C. to 350° C. For example, the heat treatment may be performed at 250° C. for 1 hour in a nitrogen atmosphere. The fourth heat treatment can reduce variation in electric characteristics of the transistor. Further, it is also possible to supply oxygen to the oxide semiconductor layer 106a by the fourth heat treatment.

Note that the fourth heat treatment is performed after the formation of the gate insulating layer 112 in this embodiment; there is no particular limitation on the timing of the fourth heat treatment as long as it is performed after the third heat treatment. In addition, the fourth heat treatment is not necessarily a requisite step.

Figure 3C:
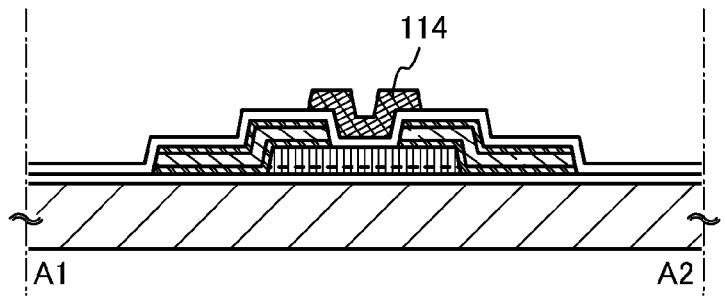

Next, a gate electrode layer 114 is formed over the gate insulating layer 112 in a region overlapping the first oxide semiconductor layer 104a and the second oxide semiconductor layer 106a (see FIG. 3C). The gate electrode layer 114 can be formed by forming a conductive layer over the gate insulating layer 112 and then selectively patterning the conductive layer.

The above-described conductive layer can be formed by a PVD method such as a sputtering method or a CVD method such as a plasma CVD method. The conductive layer can be formed using an element selected from aluminum, chromium, copper, tantalum, titanium, molybdenum, and tungsten, an alloy including any of these elements as a component, or the like. Alternatively, titanium nitride, tantalum nitride, or the like, which are nitrides of the above-described elements, may be used. A material including one or more of manganese, magnesium, zirconium, and beryllium may be used. A material including aluminum and one or more of elements selected from titanium, tantalum, tungsten, molybdenum, chromium, neodymium, and scandium may be used.

The conductive layer may also be formed using a conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials in which silicon or silicon oxide is included can be used.

The conductive layer can have either a single-layer structure or a stacked structure of two or more layers. For example, a single-layer structure of an aluminum film including silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a nitride film including tantalum and silicon, a three-layer structure in which a titanium film, an aluminum film, and a titanium film are stacked, or the like can be given. Here, a conductive layer is formed using a material including titanium and then processed into the gate electrode layer 114.

Figure 3D:
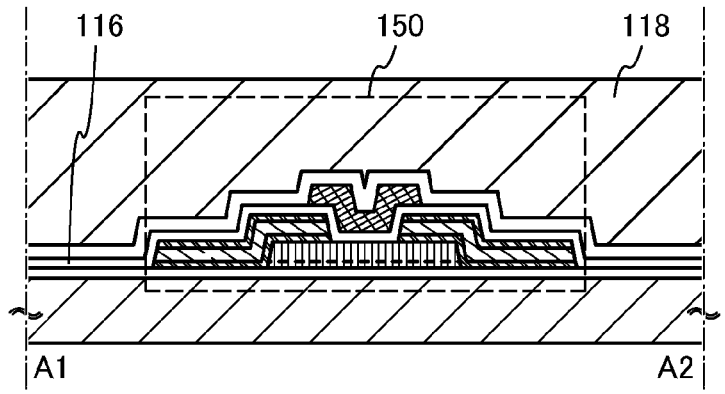

Next, an interlayer insulating layer 116 and an interlayer insulating layer 118 are formed over the gate insulating layer 112 and the gate electrode layer 114 (see FIG. 3D). The interlayer insulating layers 116 and 118 can be formed by a PVD method, a CVD method, or the like. The interlayer insulating layers 116 and 118 can be formed using a material including an inorganic insulating material such as silicon oxide, silicon nitride oxide, silicon nitride, hafnium oxide, aluminum oxide, or tantalum oxide. Note that the interlayer insulating layers 116 and 118 are stacked in this embodiment, but an embodiment of the disclosed invention is not limited to this example. A single-layer structure or a stacked structure including three or more layers can also be used.

For example, the interlayer insulating layer 118 can be formed to a thickness of at least 1 nm by a method by which an impurity such as water or hydrogen does not enter the interlayer insulating layer 118, such as a sputtering method, as appropriate. In this embodiment, a silicon oxide film is formed to a thickness of 300 nm as the interlayer insulating layer 118 by a sputtering method. The substrate temperature in film formation may be higher than or equal to room temperature and lower than or equal to 300° C. and, in this embodiment, is 100° C. The formation of the silicon oxide film by a sputtering method can be performed in a rare gas (typically argon) atmosphere, an oxygen atmosphere, or a mixed atmosphere of a rare gas (typically argon) and oxygen. As a target, a silicon oxide target or a silicon target may be used. For example, with the use of a silicon target, silicon oxide can be deposited by a sputtering method under an atmosphere of oxygen and nitrogen. As the interlayer insulating layer 118 which is provided over the oxide semiconductor layer with reduced resistance, an inorganic insulating film which does not include impurities such as moisture, a hydrogen ion, or OH— and blocks entry of these impurities from the outside is used. Typically, a silicon oxide film, a silicon nitride oxide film, an aluminum oxide film, an aluminum oxynitride film, or the like is used. Further, a protective insulating layer such as a silicon nitride film or an aluminum nitride film may be formed over the interlayer insulating layer 118.

Further, preheat treatment is preferably performed before formation of the interlayer insulating layer 118, in order to remove water or hydrogen which remains on an inner wall of the sputtering apparatus, on a surface of the target, or inside the target material. After the preheat treatment, the substrate or the sputtering apparatus is cooled. Then, the interlayer insulating layer 118 is formed without exposure to the air. In this case, not water but oil or the like is preferably used as a coolant for the target. Although a certain level of effect can be obtained when introduction and exhaustion of nitrogen are repeated without heating, it is more preferable to perform the treatment with the inside of the film formation chamber heated.

Further, after the film formation of the interlayer insulating layer 118, a silicon nitride film may be stacked thereover by a sputtering method without exposure to the air.

Further, a contact hole reaching the gate electrode layer 114 is formed in the interlayer insulating layer 118 and the interlayer insulating layer 116, and a connection electrode which is electrically connected to the gate electrode layer 114 and supplies a gate potential to the gate electrode layer 114 may be formed over the interlayer insulating layer 118. Alternatively, the following may be employed: a contact hole reaching the gate electrode layer 114 is formed after formation of the interlayer insulating layer 116; a connection electrode is formed thereover using the same material as that of the source electrode layer and the drain electrode layer; the interlayer insulating layer 118 is formed over the connection electrode; a contact hole reaching the connection electrode is formed in the interlayer insulating layer 118; and then, an electrode which is electrically connected to the connection electrode and supplies a gate potential to the connection electrode is formed over the interlayer insulating layer 118.

Note that the interlayer insulating layer 118 is desirably formed so as to have a flat surface. This is because an electrode, a wiring, or the like can be favorably formed over the interlayer insulating layer 118 when the interlayer insulating layer 118 is formed so as to have a flat surface.

Through the above-described process, the transistor 150 including the second oxide semiconductor layer 106a which is formed by crystal growth from the crystalline region of the first oxide semiconductor layer 104a is completed.

The transistor 150 manufactured by the above-described method can have favorable electric characteristics thanks to the crystal included in the second oxide semiconductor layer 106a.

By the first heat treatment and the second heat treatment, crystallization is performed; and an oxide semiconductor is purified by removing hydrogen that is an n-type impurity from the oxide semiconductor so that an impurity other than main components of the oxide semiconductor is prevented from being contained therein as much as possible. In this manner, an intrinsic (i-type) or substantially intrinsic oxide semiconductor is formed. In other words, a purified i-type (intrinsic) semiconductor, or a semiconductor close thereto, is obtained not by adding an impurity but by removing an impurity such as hydrogen or water as much as possible. By purification of the oxide semiconductor layers, the threshold voltage of the transistor becomes positive, so that a so-called normally-off transistor 150 can be obtained.

In the case of manufacturing the transistor 150 by the above-described method, the hydrogen concentration in the first oxide semiconductor layer 104a and the second oxide semiconductor layer 106a is less than or equal to $5\times10^{18}/cm^3$, and the off-state current of the transistor 150 is smaller than or equal to $1\times10^{-13}$ A, which is the measurement limit. By employing the first oxide semiconductor layer 104a and the second oxide semiconductor layer 106a which are purified by sufficient reduction of the hydrogen concentration and supply of oxygen, the transistor 150 can have excellent characteristics.

A conventional oxide semiconductor is of n-type in general, and current tends to flow between the source electrode and the drain electrode even if the gate voltage is 0 V, that is, the transistor tends to be normally on. Even when the field-effect mobility is high, if the transistor is normally on, it is difficult to control the circuit. In the case where the oxide semiconductor is of n-type, the Fermi level ($E_f$) is located closer to the conduction band and is away from the intrinsic Fermi level ($E_i$) that is located in the middle of the band gap. It is known that part of hydrogen contained in the oxide semiconductor forms a donor and might be a factor that causes an oxide semiconductor to be an n-type oxide semiconductor.

In view of this, intrinsic (i-type) or substantially intrinsic oxide semiconductor layers are formed in such a manner that the oxide semiconductor is purified by removing hydrogen that is an n-type impurity from the oxide semiconductor so that an impurity other than main components of the oxide semiconductor is prevented from being contained therein as much as possible. In other words, a feature is that a purified i-type (intrinsic) semiconductor or a semiconductor close thereto is formed not by adding an impurity but by removing an impurity such as hydrogen or water as much as possible. This enables the Fermi level ($E_f$) to be at the same level as the intrinsic Fermi level ($E_i$).

By purification of the oxide semiconductor layers, the threshold voltage of the transistor can be positive, whereby a so-called normally-off switching element can be realized.

As a process for purification, it is preferable to remove moisture or the like remaining in the sputtering apparatus before, during, or after the formation of the oxide semiconductor layers. In order to remove moisture remaining in the sputtering chamber, an adsorption-type vacuum pump is preferably used. For example, a cryopump, an ion pump, a titanium sublimation pump, or the like is preferably used. As an evacuation unit, a turbo pump provided with a cold trap may be used. Since a hydrogen atom, a compound containing a hydrogen atom, such as water ($H_2O$), and the like are removed from the deposition chamber of the sputtering apparatus which is evacuated with the cryopump, the concentration of impurities in the oxide semiconductor films formed in the deposition chamber can be reduced. In addition, it is preferable that an oxide semiconductor contained in the oxide semiconductor target for deposition have a relative density of 80% or more, preferably 95% or more, further preferably 99.9% or more. In the case of using a target having a high relative density, the concentration of impurities in the oxide semiconductor films can be reduced.

If an impurity is mixed into the oxide semiconductor film, crystal growth in one direction, that is, crystal growth which proceeds downwardly from a surface may be interrupted at the time of later heat treatment for crystallization. Therefore, it is ideal that the oxide semiconductor film contains no impurity. Accordingly, purification is extremely important.

Further, preheat treatment may be performed before formation of the oxide semiconductor films, in order to remove water or hydrogen which remains on an inner wall of the sputtering apparatus, on a surface of the target, or inside the target material. As the preheat treatment, a method in which the inside of the film deposition chamber is heated to a temperature of from 200° C. to 600° C. under reduced pressure, a method in which introduction and exhaustion of nitrogen or an inert gas are repeated while the inside of the film deposition chamber is heated, and the like can be given. In this case, not water but oil or the like is preferably used as a coolant for the target. Although a certain level of effect can be obtained when introduction and exhaustion of nitrogen are repeated without heating, it is more preferable to perform the treatment with the inside of the film formation chamber heated. After the preheat treatment, the substrate or the sputtering apparatus is cooled, and then the oxide semiconductor films are deposited.

Also as the sputtering gas used for depositing the oxide semiconductor films or a material film formed on and in contact with the oxide semiconductor films, it is preferable to use a high-purity gas in which an impurity such as hydrogen, water, a hydroxyl group, or hydride is reduced so that the concentration is decreased to approximately a value expressed in the unit "ppm" (preferably, "ppb").

During the formation of the oxide semiconductor films by a sputtering method, the substrate may be heated to a temperature that is higher than or equal to room temperature and lower than or equal to the strain point of the substrate.

In addition, as one step for purification, first heat treatment is performed in an atmosphere which hardly contains hydrogen and moisture (such as a nitrogen atmosphere, an oxygen atmosphere, or a dry-air atmosphere (e.g., as for the moisture, a dew point is lower than or equal to −40° C., preferably lower than or equal to −50° C.)). The first heat treatment can be called dehydration or dehydrogenation in which H, OH, or the like is eliminated from the oxide semiconductor layer. In the case where temperature is raised in an inert atmosphere and the atmosphere is switched to an atmosphere containing oxygen during the heat treatment, or in the case where an oxygen atmosphere is employed, the first heat treatment can also be called treatment for supplying oxygen.

For the first heat treatment, a heating method using an electric furnace, a rapid heating method such as a gas rapid thermal anneal (GRTA) method using a heated gas or a lamp rapid thermal anneal (LRTA) method using lamp light, or the like can be used. In addition, as the first heat treatment, heating using irradiation with light having a wavelength less than or equal to 450 nm may be performed at the same time. The oxide semiconductor layer is subjected to the first heat treatment for purification under such conditions that at least a peak at around 300° C. of two peaks of water is not detected when the oxide semiconductor layer after the first heat treatment is measured with thermal desorption spectroscopy (TDS) to a temperature of 450° C. Therefore, even if TDS is performed to a temperature of 450° C. on a transistor including the oxide semiconductor layer subjected to the heat treatment for purification, at least the peak of water at around 300° C. is not detected.

Since crystal growth is performed in a state where there is no polycrystalline layer which serves as a seed of crystal growth, it is preferable that the first heat treatment be performed at high temperature for short time so as to cause only crystal growth from a surface. In addition, when a surface of the oxide semiconductor layer is flat, a favorable plate-shaped polycrystalline layer can be obtained. Therefore, it is preferable that flatness of a base component such as an insulating layer or a substrate be as high as possible. Increase of flatness is effective because a polycrystalline layer in contact with an entire surface of the base component can be formed easily. For example, the flatness of the oxide semiconductor layer is approximately equivalent to that of a commercial silicon wafer; for example, variation in height (surface roughness) in a region of 1 µm×1 µm is less than or equal to 1 nm, preferably 0.2 nm by AFM measurement.

In the polycrystalline layer, when electron clouds of In included in the oxide semiconductor overlap with each other and are connected to each other, electric conductivity σ is increased. Accordingly, a transistor including the polycrystalline layer can have high field-effect mobility.

One method for causing crystal growth using the plate-like polycrystalline layer formed through the first heat treatment as a seed crystal will be described with reference to FIGS. 14A to 14C.

The outline of the order of steps is as follows: the first oxide semiconductor layer is formed over the base component; first heat treatment for purification is performed; the polycrystalline layer whose crystal direction is aligned is formed over a surface of the first oxide semiconductor layer in the same step as the first heat treatment for purification; the second oxide semiconductor layer is stacked thereover; and further, second heat treatment for crystallization is performed, so that the second oxide semiconductor layer is crystallized with the use of the polycrystalline layer over the surface of the first oxide semiconductor layer as a seed.

In the first heat treatment, crystal growth is performed from the surface in the state where a crystal layer serving as a seed of crystal growth does not exist; whereas in the second heat treatment, the plate-shaped polycrystalline layer serves as a seed. Therefore, it is preferable that the second heat treatment be performed for a long time at a lowest temperature that can cause crystal growth because favorable crystallinity can be obtained. The crystal-growth direction by the second heat treatment corresponds to an upward direction from a lower portion, i.e., a direction from the substrate side to the surface side (also referred to as a recrystallization direction) and is different from the crystal-growth direction by the first heat treatment. In addition, since the polycrystalline layer obtained by the first heat treatment is heated again by the second heat treatment, the crystallinity of the polycrystalline layer is further increased.

Figure 14A:
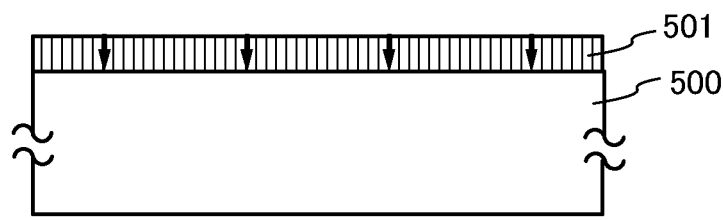
FIGS. 14A to 14C are cross-sectional views illustrating an embodiment of the invention.

FIG. 14A illustrates a state after first heat treatment for crystallization is performed on a first oxide semiconductor layer formed over a base component 500.

Figure 14B:
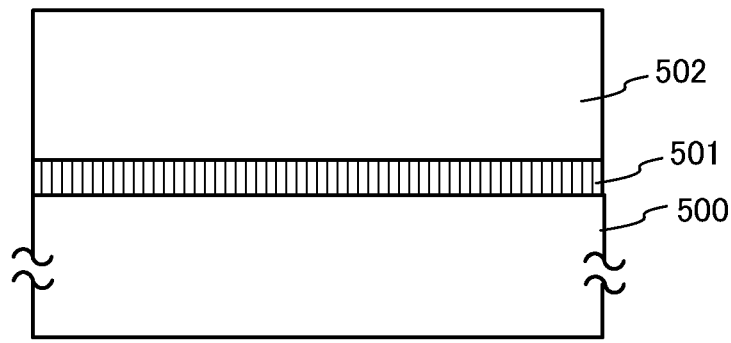

FIG. 14B illustrates a cross sectional view at the time right after formation of a second oxide semiconductor layer 502. The second oxide semiconductor layer 502 is formed by a sputtering method, and as a metal oxide target for this formation, a metal oxide target containing In, Ga, and Zn at 1:1:1 [atomic ratio] or a metal oxide target containing In, Ga, and Zn at 1:1:2 may be used.

Figure 14C:
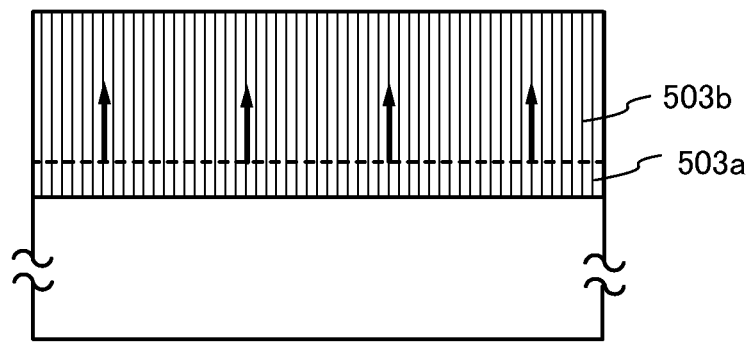

FIG. 14C is a cross-sectional view at the time after the second heat treatment. By the second heat treatment, crystal growth proceeds upward to a surface of the second oxide semiconductor layer 502 with the use of the polycrystalline layer of the first oxide crystal layer (a first oxide crystal layer 501) as a seed. As a result, a second oxide crystal layer 503b is formed. The crystal components have the same crystal structure.

Figure 15A:
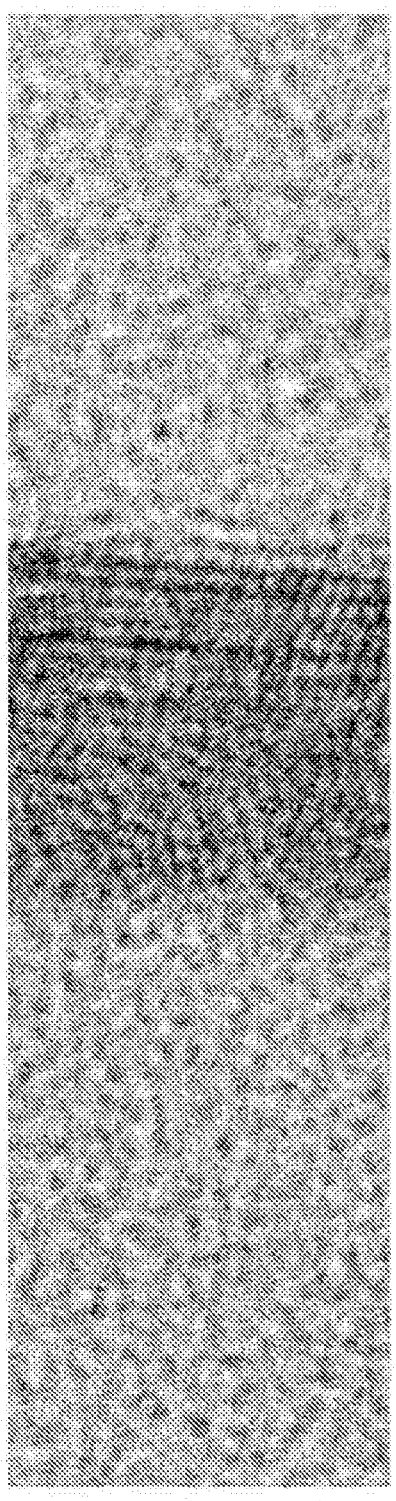
FIG. 15A is a cross-sectional TEM photograph.
Figure 15B:
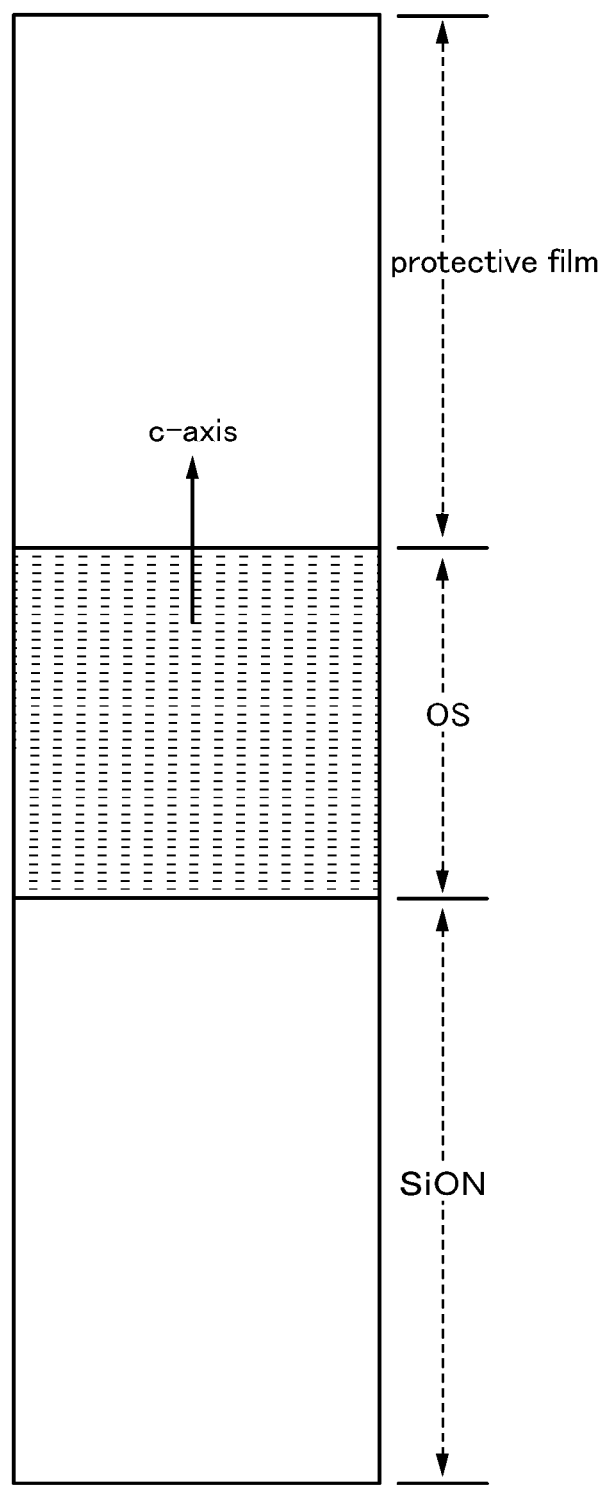
FIG. 15B is a schematic view thereof.

A structure which corresponds to FIG. 14B was manufactured actually. A TEM photograph of a cross section of the structure is shown in FIG. 15A. Note that a schematic view thereof is illustrated in FIG. 15B. Note that the TEM photograph was taken by a high-resolution transmission electron microscope ("H9000-NAR" manufactured by Hitachi, Ltd.: TEM) at a high magnification (eight-million-fold magnification) and an accelerating voltage of 300 kV. A sample of FIG. 15A was formed in such a manner that an insulating layer was formed over a glass substrate, a first In—Ga—Zn—O film with a thickness of 5 nm was formed thereover, and heat treatment was performed thereon in a dry-air atmosphere at 700° C. for one hour. It can be found from FIG. 15A that c-axis of the first In—Ga—Zn—O film is aligned in a direction perpendicular to a surface of the first In—Ga—Zn—O film, and that the vicinity of an interface between the insulating layer and the first In—Ga—Zn—O film is also crystallized and has c-axis aligned in a direction perpendicular to the surface. As illustrated in FIG. 14A, the first oxide crystal layer 501 which includes a plate-shaped polycrystal is formed over the base component. The plate-like polycrystal is preferably a crystal of $InGaZnO_4$ (In:Ga:Zn:O=1:1:1:4). Further, the c-axis direction of the crystal corresponds to a film thickness direction.

The first In—Ga—Zn—O film in the sample of FIG. 15A was deposited with a sputtering apparatus using a target for depositing an oxide semiconductor (a target for depositing an In—Ga—Zn—O-based oxide semiconductor ($In_2O_3:Ga_2O_3$: ZnO=1:1:2 [molar ratio], In:Ga:Zn=1:1:1 [atomic ratio])) under the following conditions: the substrate temperature was 200° C. and the deposition rate was 4 nm/min. Without limitation to the material and the component of the target, for example, when a target containing $In_2O_3$, $Ga_2O_3$, and ZnO at 1:1:1 [molar ratio] is used, a polycrystal of $In_2Ga_2ZnO_7$ can be easily obtained.

The crystal structure of $In_2Ga_2ZnO_7$ includes any of In, Ga, and Zn, and can be considered to have a stacked structure of layers parallel to a-axis and b-axis. Since conductivity of the crystal of $In_2Ga_2ZnO_7$ is mainly controlled by In, electric characteristics of the layer containing In in a direction parallel to the a-axis and the b-axis are favorable. In the crystal of $In_2Ga_2ZnO_7$, electron clouds of In overlap with each other and are connected to each other, so that a carrier path is formed.

Instead of the above target, a metal oxide target containing $In_2O_3$, $Ga_2O_3$, and ZnO at 2:1:8 [molar ratio] may be used.

In addition, a metal oxide target containing $In_2O_3$ and ZnO at 1:2 [molar ratio], which does not include Ga, may be used. If a bottom-gate transistor is formed, since an oxide of Ga is an insulator, higher field-effect mobility can be obtained with the use of an In—Zn—O film as compared to the case of using the first In—Ga—Zn—O film.

In addition, the polycrystalline layer obtained by the first heat treatment is heated again by the second heat treatment to be a third oxide crystal layer 503a having improved crystallinity.

In addition, it can be said that the structure illustrated in FIG. 14C is a two-layer structure in which the third oxide crystal layer 503a is provided on and in contact with the base component 500 and the second oxide crystal layer 503b is stacked thereover. There are no particular limitations on materials of the first oxide crystal layer 501 and the second oxide semiconductor layer 502 as long as a polycrystal whose c-axis is aligned in a direction perpendicular to the surface can be obtained. The materials of the first oxide crystal layer 501 and the second oxide semiconductor layer 502 may be different or may contain the same main component.

Note that in the case where oxide semiconductor materials containing the same main component are used, a boundary between the third oxide crystal layer 503a and the second oxide crystal layer 503b is unclear as illustrated by a dotted line in FIG. 14C, so that the third oxide crystal layer 503a and the second oxide crystal layer 503b can be regarded as one layer.

In this manner, the polycrystalline layer formed of a stack of the third oxide crystal layer 503a and the second oxide crystal layer 503b can be obtained by crystal growth caused by two heat treatments.

Note that in FIG. 14A, crystal growth of the polycrystalline layer whose crystal direction is relatively aligned and which is formed in a surface portion of the first oxide semiconductor layer proceeds in the film thickness direction from the surface; therefore, the polycrystalline layer can be formed without being influenced by the base component.

After deposition of the second In—Ga—Zn—O film, heat treatment was performed in a nitrogen atmosphere at 650° C. for 6 minutes, and a cross section was taken. FIG. 16A is an actual TEM photograph of the cross section. A schematic view thereof is illustrated in FIG. 16B. In FIG. 16A, a state in which the whole second In—Ga—Zn—O film is crystallized can be confirmed. In addition, it can be observed that the crystal of the second In—Ga—Zn—O film has c-axis that is aligned in a direction perpendicular to a surface of the second In—Ga—Zn—O film. Further, it can also be found that the vicinity of an interface between the insulating layer and the first In—Ga—Zn—O film is not crystallized even after the second heat treatment.

A mechanism in which the crystal layer whose crystal direction is relatively aligned is formed in the surface portion of the first oxide semiconductor layer, for example, of the In—Ga—Zn—O film will be described. By heat treatment, zinc included in the In—Ga—Zn—O film is diffused and concentrated in the vicinity of the surface, and becomes a seed of crystal growth. In the crystal growth, crystal grows more in the lateral direction (a direction parallel to the surface) than in the depth direction (a direction perpendicular to the surface); therefore, the plate-shaped polycrystalline layer is formed. These are supposed from the fact that when TDS measurement is performed to a temperature of 450° C., peaks of In and Ga are not detected but a peak of zinc is detected in a vacuum-heat condition, in particular at around 300° C. Note that it can be confirmed that the TDS measurement is performed in vacuum and zinc is detected at a temperature around 200° C.

As a comparative example, a sample is formed. The sample is formed in such a manner that an In—Ga—Zn—O film with a thickness of 50 nm is formed and subjected to heating at 700° C. for one hour. A TEM photograph of a cross section of the sample is shown in FIG. 17A. A schematic view thereof is illustrated in FIG. 17B. Note that the TEM photograph of FIG. 17A is taken by a high-resolution transmission electron microscope ("H9000-NAR" manufactured by Hitachi, Ltd.: TEM) at a high magnification (two-million-fold magnification) and an accelerating voltage of 300 kV. From FIG. 17A, it can be found that a region from the surface of the In—Ga—Zn—O film to a depth of about 5 nm is crystallized, and a large number of amorphous portions and a plurality of crystals whose crystal directions are not aligned exist randomly in the In—Ga—Zn—O film. Accordingly, it can be said that even when the In—Ga—Zn—O film is deposited to such a large thickness as 50 nm and then subjected to heat treatment once at 700° C. that is higher than 650° C., for one hour that is longer than 6 minutes, it is difficult to obtain a crystal layer whose crystal direction is highly aligned as a whole.

From these results, it can be said that a polycrystalline layer having a large thickness can be formed in such a manner that two depositions are performed: a polycrystalline layer serving as a seed of crystal growth is formed, then a film is deposited, and then crystal growth is performed. Accordingly, it is found that the method disclosed in this specification is extremely useful. By performing deposition twice and performing heat treatment twice, a crystalline layer whose crystal direction is highly aligned, i.e., a thick polycrystalline layer whose c-axis is aligned in a direction perpendicular to a surface of the oxide semiconductor layer can be obtained.

A device formed using a metal oxide, typically an In—Ga—Zn—O film is totally different from a device formed using a single crystal Si, a device formed using SiC, and a device formed using GaN.

As wide-gap semiconductors, SiC (3.26 eV) and GaN (3.39 eV) are known. However, SiC and GaN are expensive materials. In addition, when SiC is used, a temperature higher than or equal to 1700° C. is needed for activation after doping with phosphorus or aluminum in order to selectively form a low-resistance region. In addition, in order to perform epitaxial growth of GaN, epitaxial-growth process in which heating at a temperature higher than or equal to 1200° C. is performed for a long time is performed. That is, when SiC or GaN is used, a process temperature higher than or equal to 1000° C. is needed; therefore, it is substantially impossible to thinly form SiC or GaN over a glass substrate.

Further, the crystal structure of SiC or GaN is only a single crystal. Therefore, control with a PN junction is needed and more complete single-crystallization is needed. Accordingly, a small amount of impurities which are unintentionally mixed in a manufacturing process serve as donors or acceptors; therefore, the carrier density has lower limit. On the other hand, a metal oxide can have any of an amorphous structure, a polycrystalline structure, and a single crystalline structure. This is because control of a band which is equivalent to control of a PN junction is performed by utilizing each of properties represented with $\phi_{MS}$ versus $\chi_{OS}+\frac{1}{2}Eg^{OS}$ and $\phi_{MD}$ versus $\chi_{OS}+\frac{1}{2}Eg^{OS}$, in other words, the properties of work functions of a source and a drain ($\phi_{MS}$ and $\phi_{MD}$), electron affinity of metal oxide ($\chi_{OS}$), and energy band width ($Eg^{OS}$), without using control with a PN junction. This is one feature of the metal oxide.

A metal oxide, typically an In—Ga—Zn—O film has a band gap which is three times as wide as that of single crystal silicon and is an inexpensive material because of a low manufacturing cost as compared with SiC.

The band gap of In—Ga—Zn—O is 3.05 eV, and an intrinsic carrier density is calculated based on this value. It is known that energy distribution f(E) of electrons in a solid depends on the Fermi-Dirac statistics represented by the following formula.

$$f(E) = \frac{1}{1 + \exp\left(\frac{E - E_F}{kT}\right)} \quad \text{[Formula 2]}$$

In the case of a normal semiconductor whose carrier density is not very high (which does not degenerate), the following relational expression is satisfied.

$$|E - E_F| > kT \quad \text{[Formula 3]}$$

Therefore, the Fermi-Dirac distribution of the Formula 1 is approximated to the formula of Boltzmann distribution expressed by the following formula.

$$f(E) = \exp\left[-\frac{E - E_F}{kT}\right] \quad \text{[Formula 4]}$$

When an intrinsic carrier density ($n_i$) is calculated using the Formula 3, the following formula can be obtained.

$$n_i = \sqrt{N_C N_V} \exp\left(-\frac{E_g}{2kT}\right) \quad \text{[Formula 5]}$$

Then, the values of effective density of states (Nc and Nv) and a band gap (Eg) of Si and In—Ga—Zn—O were substituted into the Formula 4 and an intrinsic carrier density was calculated. The results are shown in Table 1.

TABLE 1

|  |  | Si | IGZO |
|---|---|---|---|
| Nc (300K) | [cm$^{-3}$] | $2.8 \times 10^{19}$ | $5.0 \times 10^{18}$ |
| Nv (300K) | [cm$^{-3}$] | $1.04 \times 10^{19}$ | $5.0 \times 10^{18}$ |
| Eg (300K) | [eV] | 1.08 | 3.05 |
| $n_i$ (300K) | [cm$^{-3}$] | $1.45 \times 10^{10}$ | $1.2 \times 10^{-7}$ |

It is found that In—Ga—Zn—O has extremely low intrinsic carrier density as compared to Si. In the case where the value of 3.05 eV is selected as a band gap of IGZO, it can be said that the carrier density of Si is approximately $10^{17}$ times as large as that of In—Ga—Zn—O, assuming that the Fermi-Dirac distribution law is applicable to the intrinsic carrier density.

In the case of an oxide semiconductor, a thin oxide semiconductor film can be formed by a sputtering method at a heating temperature of from a room temperature to 400° C., and a maximum process temperature can be set to a temperature higher than or equal to 850° C., typically a temperature higher than or equal to 450° C. and lower than or equal to 700° C. In the case where the maximum process temperature is set to a temperature lower than or equal to the strain point of glass, a thin oxide semiconductor film can be formed over a large-area glass substrate. Therefore, it is important for industrialization to use a metal oxide whose band gas is wide and whose maximum process temperature is lower than 850° C., typically higher than or equal to 450° C. and lower than or equal to 700° C.

In addition, in the case of forming a three-dimensional silicon integrated circuit, since a process temperature of an oxide semiconductor is lower than a temperature at which connection at a bottom side (a silicon side) is broken (1050° C.), application to a three-dimension integrated circuit which includes a silicon integrated circuit and an oxide semiconductor circuit thereover can be achieved.

As described above, using the disclosed invention, a semiconductor device having excellent characteristics, which has a novel structure, can be realized.

Modified Examples

Next, modified examples of the semiconductor devices illustrated in FIGS. 1A and 1B, FIGS. 2A to 2E, and FIGS. 3A to 3D will be described with reference to FIGS. 4A to 4C, FIGS. 5A to 5C, and FIGS. 6A and 6B. Note that many components of the semiconductor devices illustrated in FIGS. 4A to 4C, FIGS. 5A to 5C, and FIGS. 6A and 6B are common with those of the semiconductor devices illustrated in FIGS. 1A and 1B, FIGS. 2A to 2E, and FIGS. 3A to 3D; therefore, only different points will be described.

Figure 4A:
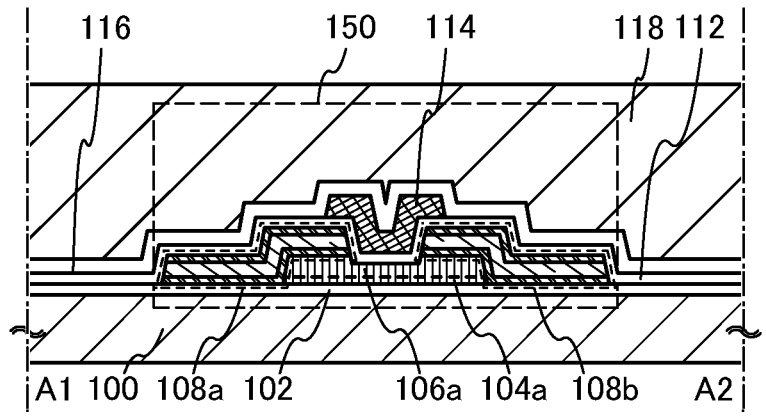
FIGS. 4A to 4C are cross-sectional views each illustrating a semiconductor device.

The transistor 150 illustrated in FIG. 4A includes the oxide semiconductor layer 106a having a depression portion (a groove portion). The depression portion is formed by etching at the time of forming the source or drain electrode layer 108a and the source or drain electrode layer 108b. Accordingly, the depression portion is formed in a region overlapping with the gate electrode layer 114. The depression portion can reduce the thickness of the semiconductor layer in the channel formation region, thereby contributing the prevention of a short-channel effect.

Figure 4B:
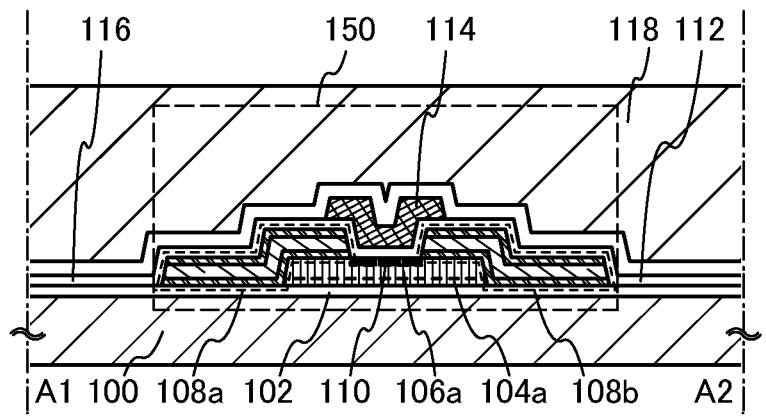

The transistor 150 illustrated in FIG. 4B includes the oxide semiconductor layer 106a including a high-purity crystalline region 110. Note that the high-purity crystalline region 110 is formed by the third heat treatment after the formation of the source or drain electrode layer 108a and the source or drain electrode layer 108b. Accordingly, the high-purity crystalline region 110 is formed in a region of the second oxide semiconductor layer 106a, which includes the exposed surface of the second oxide semiconductor layer 106a and overlaps with neither the source or drain electrode layer 108a nor the source or drain electrode layer 108b. Here, the high-purity crystalline region 110 is a region having higher crystallinity than the other region in the second oxide semiconductor layer 106a. By including the high-purity crystalline region 110, the second oxide semiconductor layer 106a can have a higher electrical anisotropy, and electric characteristics of the semiconductor device can be increased.

Figure 4C:
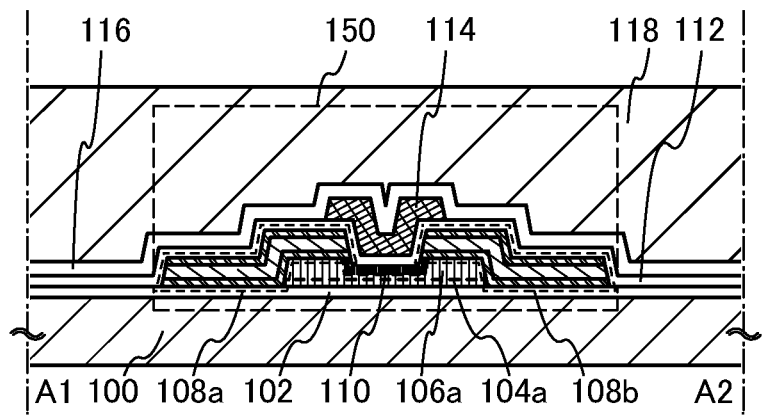

The transistor 150 illustrated in FIG. 4C includes the oxide semiconductor layer 106a having a depression portion (a groove portion) and also includes the high-purity crystalline region 110 in a region of the second oxide semiconductor layer 106a, which includes the exposed surface of the second oxide semiconductor layer 106a and overlaps with neither the source or drain electrode layer 108a nor the source or drain electrode layer 108b. In other words, the transistor illustrated in FIG. 4C has features of both the transistor 150 of FIG. 4A and the transistor 150 of FIG. 4B. The effects caused from the structure are similar to the effects caused in the cases of FIGS. 4A and 4B.

Figure 5A:
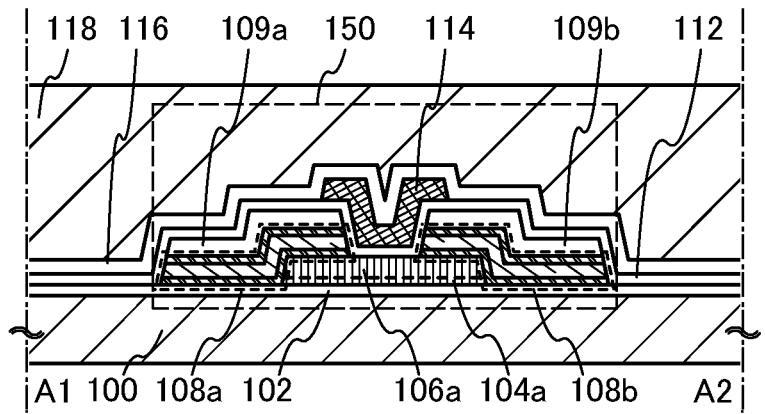
FIGS. 5A to 5C are cross-sectional views each illustrating a semiconductor device.

The transistor 150 illustrated in FIG. 5A includes an insulating layer 109a and an insulating layer 109b which have substantially the same shape as the source or drain electrode layer 108a and the source or drain electrode layer 108b, over the source or drain electrode layer 108a and the source or drain electrode layer 108b. In this case, there is an advantage in that capacitance (so-called gate capacitance) between the source and the drain electrode layer and the gate electrode can be reduced. Note that in this specification, the expression "substantially the same" does not necessarily mean "exactly the same" in a strict sense and includes the meaning of being considered as the same. For example, a difference made by a single etching process is acceptable. Further, the thickness does not need to be the same.

Figure 5B:
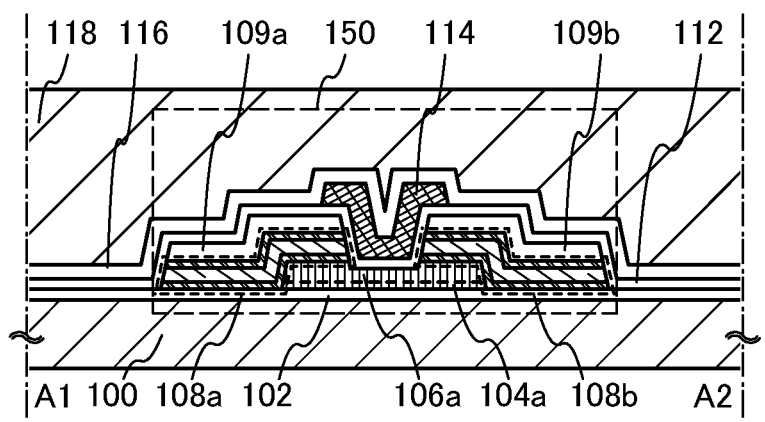

The transistor 150 illustrated in FIG. 5B includes the oxide semiconductor layer 106a having a depression portion (a groove portion) and also includes an insulating layer 109a and an insulating layer 109b which have substantially the same shape as the source or drain electrode layer 108a and the source or drain electrode layer 108b, over the source or drain electrode layer 108a and the source or drain electrode layer 108b. In other words, the transistor illustrated in FIG. 5B has features of both the transistor 150 of FIG. 4A and the transistor 150 of FIG. 5A. The effects caused from the structure are similar to the effects caused in the cases of FIG. 4A and FIG. 5A.

Figure 5C:
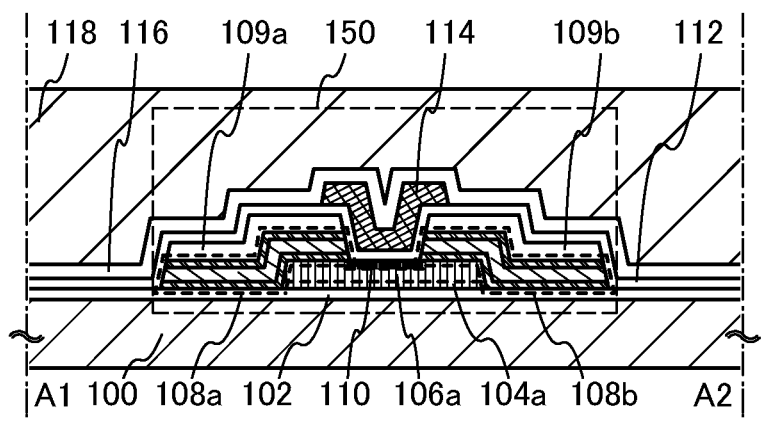

The transistor 150 illustrated in FIG. 5C includes the high-purity crystalline region 110 in a region of the second oxide semiconductor layer 106a, which includes the exposed surface of the second oxide semiconductor layer 106a and overlaps with neither the source or drain electrode layer 108a nor the source or drain electrode layer 108b, and the transistor 150 illustrated in FIG. 5C also includes an insulating layer 109a and an insulating layer 109b which have substantially the same shape as the source or drain electrode layer 108a and the source or drain electrode layer 108b, over the source or drain electrode layer 108a and the source or drain electrode layer 108b. In other words, the transistor illustrated in FIG. 5C has features of both the transistor 150 of FIG. 4B and the transistor 150 of FIG. 5A. The effects caused from the structure are similar to the effects caused in the cases of FIG. 4B and FIG. 5A.

Figure 6A:
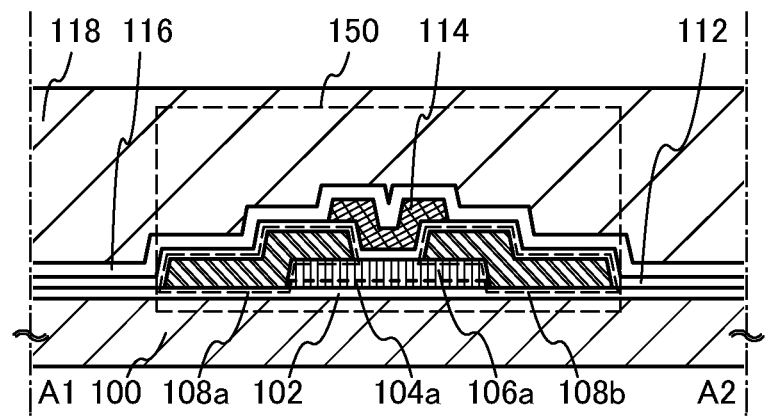
FIGS. 6A and 6B are cross-sectional views each illustrating a semiconductor device.

The transistor 150 illustrated in FIG. 6A includes the source or drain electrode layer 108a and the source or drain electrode layer 108b each having a single-layer structure. Specifically, a single-layer structure of a titanium layer can be employed, for example. In the case of the source and drain electrode layers having a single-layer structure, a favorable tapered shape can be obtained by etching as compared to the case of employing a stacked structure.

Figure 6B:
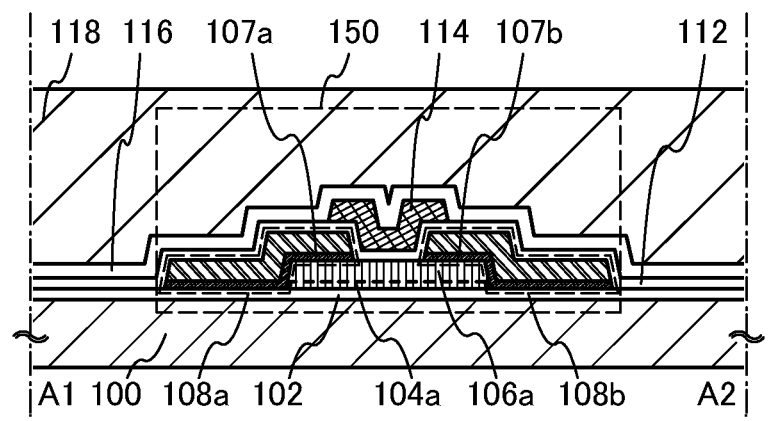

The transistor 150 illustrated in FIG. 6B includes a conductive layer 107a formed of a material having a low ability of extracting oxygen (a material having a low oxygen affinity) in a region where the source or drain electrode layer 108a is in contact with the oxide semiconductor layer 106a and also includes a conductive layer 107b formed of a material having a low ability of extracting oxygen in a region where the source or drain electrode layer 108b is in contact with the oxide semiconductor layer 106a. With the conductive layers having a low ability of extracting oxygen as described above, a change to an n-type in the oxide semiconductor layer due to extraction of oxygen can be prevented; accordingly, an adverse effect to transistor characteristics caused by uneven change of the oxide semiconductor layer to an n-type or the like can be prevented.

Note that the source or drain electrode layer 108a and the source or drain electrode layer 108b having a two-layer structure are employed in FIG. 6B; however, an embodiment of the disclosed invention is not limited to this structure. They may have a single-layer structure of a conductive layer formed of a material having a low ability of extracting oxygen or a stacked structure of three or more layers. In the case of a single-layer structure, a single-layer structure of a titanium nitride film can be employed for example. In the case of a stacked structure, a two-layer structure of a titanium nitride film and a titanium film can be employed, for example.

Figure 28A:
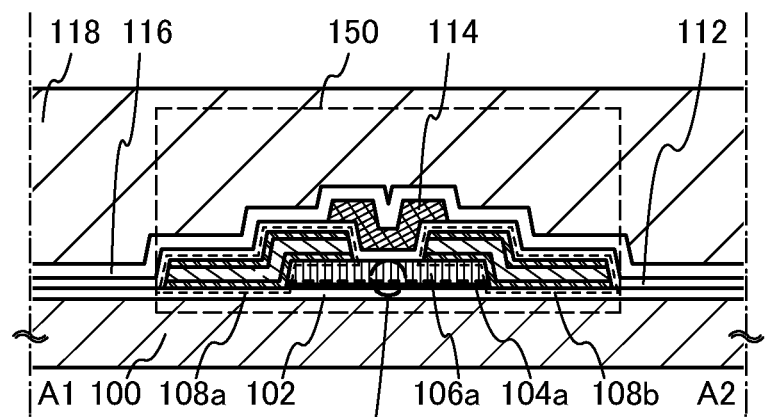
FIGS. 28A and 28B are cross-sectional views illustrating a semiconductor device.
Figure 28B:
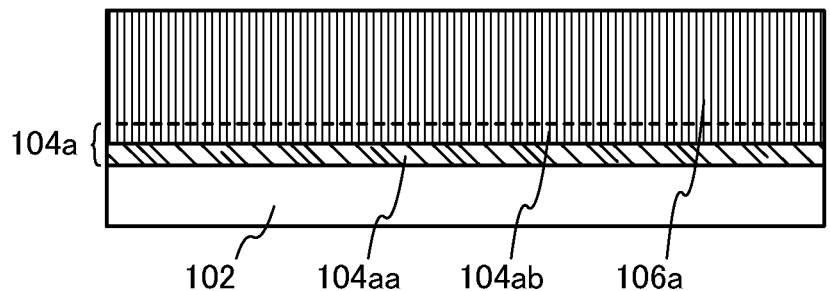

The transistor 150 illustrated in FIG. 28A includes the first oxide semiconductor layer 104a in a lower part of which an amorphous remains. Here, an enlarged view of a region including the first oxide semiconductor layer 104a of FIG. 28A is illustrated in FIG. 28B. As illustrated in FIG. 28B, the first oxide semiconductor layer 104a has a feature of including an amorphous region 104aa in a lower part and a crystalline region 104ab in an upper part. It is preferable that the amorphous region remains below the crystalline region functioning as a channel formation region of the transistor 150, because carriers flowing in the crystalline region are prevented from being directly affected by the interface between the insulating layer 102 and the first oxide semiconductor layer 104a.

Figure 29:
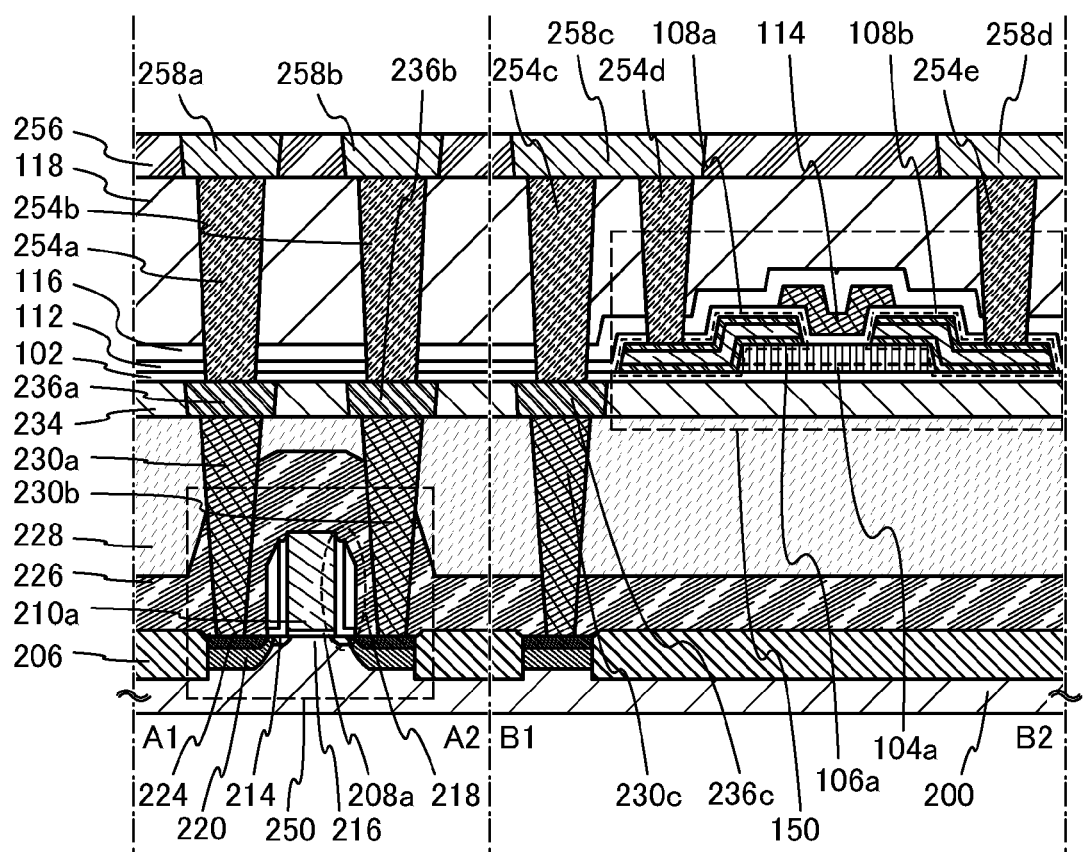
FIG. 29 is a cross-sectional view illustrating a semiconductor device.

FIG. 29 is a cross-sectional view illustrating an example of a structure of a semiconductor device. The semiconductor device illustrated in FIG. 29 includes a transistor 250 including a material (e.g., silicon) other than an oxide semiconductor in a lower portion and the transistor 150 including an oxide semiconductor in an upper portion. The transistor 150 including an oxide semiconductor is the transistor 150 illustrated in FIG. 1A. Note that although the transistors 250 and 150 are n-channel transistors here, p-channel transistors may be employed. In particular, it is easy to use a p-channel transistor as the transistor 250.

The transistor 250 includes a channel formation region 216 provided in a substrate 200 containing a semiconductor material, impurity regions 214 and high-concentration impurity regions 220 (collectively called simply impurity regions) formed with the channel formation region 216 positioned therebetween, a gate insulating layer 208a over the channel formation region 216, a gate electrode layer 210a over the gate insulating layer 208a, and source or drain electrode layers 230a and 230b electrically connected to the impurity regions 214 (see FIG. 29).

Here, sidewall insulating layers 218 are formed on side surfaces of the gate electrode layer 210a. The high-concentration impurity regions 220 are provided in regions of the substrate 200 which do not overlap with the sidewall insulating layers 218 when seen from above. Metal compound regions 224 are provided in contact with the high-concentration impurity regions 220. An element isolation insulating layer 206 is provided over the substrate 200 so as to surround the transistor 250. An interlayer insulating layer 226 and an interlayer insulating layer 228 are provided so as to cover the transistor 250. The source or drain electrode layer 230a and the source or drain electrode layer 230b are electrically connected to the metal compound regions 224 through openings formed in the interlayer insulating layer 226, the interlayer insulating layer 228, and an insulating layer 234. In other words, the source or drain electrode layer 230a and the source or drain electrode layer 230b are electrically connected to the high-concentration impurity regions 220 and the impurity regions 214 through the metal compound regions 224.

The transistor 150 includes the oxide semiconductor layer 106a provided over the insulating layer 102, the source or drain electrode layer 108a and the source or drain electrode layer 108b provided over the oxide semiconductor layer 106a and electrically connected to the oxide semiconductor layer 106a, a gate insulating layer 112 provided so as to cover the oxide semiconductor layer 106a, the source or drain electrode layer 108a, and the source or drain electrode layer 108b, and a gate electrode layer 114 provided over the gate insulating layer 112 in a region overlapping with the oxide semiconductor layer 106a (see FIG. 29).

In addition, over the transistor 150, the interlayer insulating layer 116 and the interlayer insulating layer 118 are provided. Openings that reach the source or drain electrode layer 108a and the source or drain electrode layer 108b are formed in the gate insulating layer 112, the interlayer insulating layer 116, and the interlayer insulating layer 118. An electrode 254d and an electrode 254e are formed in contact with the source or drain electrode layer 108a and the source or drain electrode layer 108b, respectively, through the respective openings. In a similar manner to that of the electrodes 254d and 254e, an electrode 254a, an electrode 254b, and an electrode 254c are formed in contact with an electrode 236a, an electrode 236b, and an electrode 236c, respectively, through openings provided in the gate insulating layer 112, the interlayer insulating layer 116, and the interlayer insulating layer 118.

Here, the oxide semiconductor layer 106a is preferably an oxide semiconductor layer which is purified by sufficiently removing an impurity such as hydrogen therefrom and supplying oxygen thereto. Specifically, the hydrogen concentration of the oxide semiconductor layer 106a is $5 \times 10^{19}/cm^3$ or lower, preferably $5 \times 10^{18}/cm^3$ or lower, and further preferably $5 \times 10^{17}/cm^3$ or lower. Note that the oxide semiconductor layer 106a which is purified by sufficiently reducing the hydrogen concentration and supplying oxygen has a carrier density (e.g., lower than $1 \times 10^{12}/cm^3$, preferably $1.45 \times 10^{10}/cm^3$ or lower) which is sufficiently lower than that of a general silicon wafer (a silicon wafer to which an impurity element such as phosphorus or boron is slightly added) (approximately $1 \times 10^{14}/cm^3$). The transistor 150 with excellent off-state current characteristics can be obtained with the use of such an i-type or substantially i-type oxide semiconductor. For example, when the drain voltage $V_d$ is +1 V or +10 V and the gate voltage $V_g$ is set in the range of from −20 V to −5 V, the off-state current is $1 \times 10^{-13}$ A or less. The oxide semiconductor layer 106a which is purified by a sufficient reduction in the hydrogen concentration as described above is used so that the off-state current of the transistor 150 is reduced, whereby a semiconductor device with a novel structure can be realized. Note that the above hydrogen concentration of the oxide semiconductor layer 106a is measured by secondary ion mass spectrometry (SIMS).

Note that an oxide semiconductor included in the oxide semiconductor layer is not particularly limited as long as it has a non-single-crystal structure. A variety of structures, such as an amorphous structure, a microcrystalline structure (also including a nanocrystalline structure and the like), a polycrystalline structure, a structure in which microcrystals or polycrystals are included in an amorphous structure, or a structure in which microcrystals or polycrystals are formed at a surface of an amorphous structure can be employed.

An insulating layer 256 is provided over the interlayer insulating layer 118. An electrode 258a, an electrode 258b, an electrode 258c, and an electrode 258d are provided so as to be embedded in the insulating layer 256. The electrode 258a is in contact with the electrode 254a. The electrode 258b is in contact with the electrode 254b. The electrode 258c is in contact with the electrode 254c and the electrode 254d. The electrode 258d is in contact with the electrode 254e. It is preferable to use a material containing copper for part of the electrode 258a, the electrode 258b, the electrode 258c, and the electrode 258d. In the case of using a material containing copper for part of the electrode 258a, the electrode 258b, the electrode 258c, and the electrode 258d, conductivity can be increased.

In other words, the source or drain electrode layer 108a of the transistor 150 is electrically connected to another element (such as a transistor including a material other than an oxide semiconductor) through an electrode 230c, the electrode 236c, the electrode 254c, the electrode 258c, and the electrode 254d (see FIG. 29). In addition, the source or drain electrode layer 108b of the transistor 150 is electrically connected to another element through the electrode 254e and the electrode 258d. Note that the structure of connection electrodes (such as the electrode 230c, the electrode 236c, the electrode 254c, the electrode 258c, and the electrode 254d) is not limited to the above structure, and appropriate addition, omission, or the like is possible.

Although an example of typical connection relationship is given above, an embodiment of the disclosed invention is not limited to the example. For example, the gate electrode layer 210a of the transistor 250 and the source or drain electrode layer 108a of the transistor 150 may be electrically connected to each other.

As described above, an embodiment of the disclosed invention can be modified in various ways. In addition, the modified example is not limited to the above-described modified examples. For example, the structures of FIG. 4A, FIG. 4B, FIG. 4C, FIG. 5A, FIG. 5B, FIG. 5C, FIG. 6A, FIG. 6B, FIGS. 28A and 28B, and FIG. 29 may be combined as appropriate as another modified example. It is needless to say that addition, omission, and the like are possible within the scope of the description in this specification or the like.

The structures, methods, and the like described in this embodiment can be combined as appropriate with any of the structures, methods, and the like described in the other embodiments.

Embodiment 2

In this embodiment, semiconductor devices having structures different from the semiconductor devices of the above embodiment, and a manufacturing method thereof will be described with reference to FIGS. 7A and 7B, FIGS. 8A to 8D, FIGS. 9A to 9C, FIGS. 10A to 10C, FIGS. 11A to 11C, and FIGS. 12A to 12C. Note that the structures described in this embodiment are in common with the structures described in the above embodiment in many points; therefore, only different points will be mainly described below.

<The Structure of the Semiconductor Device>

Figure 7A:
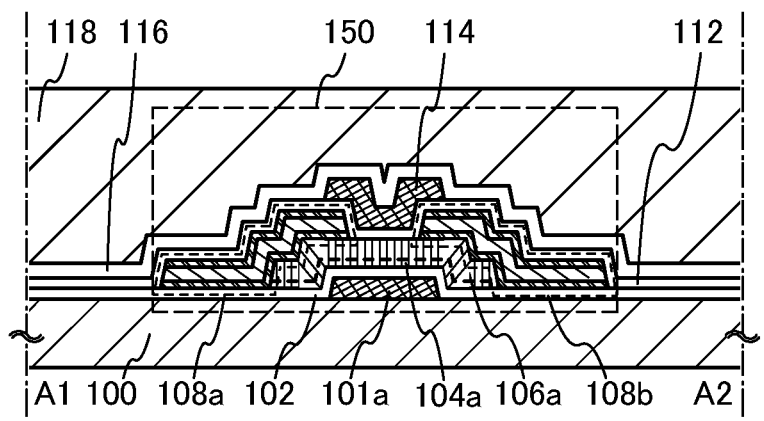
FIGS. 7A and 7B are cross-sectional views each illustrating a semiconductor device.
Figure 7B:
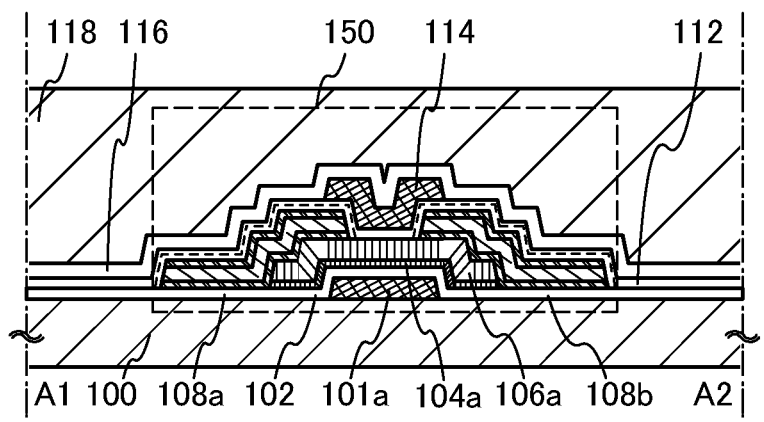

FIGS. 7A and 7B are cross-sectional views illustrating the transistor 150 which is an example of the structure of a semiconductor device.

The point different from the structure of FIGS. 1A and 1B is that a gate electrode layer 101a exists below the first oxide semiconductor layer 104a. In other words, the transistor 150 illustrated in FIGS. 7A and 7B includes the gate electrode layer 101a over the substrate 100, the insulating layer 102 covering the gate electrode layer 101a, the first oxide semiconductor layer 104a provided over the insulating layer 102, the second oxide semiconductor layer 106a provided over the first oxide semiconductor layer 104a, the source or drain electrode layer 108a and the source or drain electrode layer 108b which are electrically connected to the oxide semiconductor layer 106a, the gate insulating layer 112 covering the second oxide semiconductor layer 106a, the source or drain electrode layer 108a, and the source or drain electrode layer 108b, and the gate electrode layer 114 over the gate insulating layer 112 (see FIGS. 7A and 7B). Here, the insulating layer 102 also functions as a gate insulating layer.

In addition, the interlayer insulating layer 116 and the interlayer insulating layer 118 are provided over the transistor 150. Note that the interlayer insulating layer 116 and the interlayer insulating layer 118 are not requisite components and may be omitted as appropriate.

As described in Embodiment 1, the first oxide semiconductor layer 104a includes the crystalline region in the region including the surface, and the second oxide semiconductor layer 106a is formed by crystal growth from the crystalline region of the first oxide semiconductor layer 104a.

The gate electrode layer 101a illustrated in FIGS. 7A and 7B can function as a so-called back gate. The potential of the back gate can be a fixed potential, e.g., 0V or a ground potential, and may be determined as appropriate. In addition, by providing the gate electrodes above and below the oxide semiconductor layer, in a bias-temperature stress test (hereinafter, referred to as a BT test) for examining reliability of the thin film transistor, the amount of shift in threshold voltage of the thin film transistor in the BT test can be reduced. That is, provision of the gate electrodes above and below the oxide semiconductor layer can improve the reliability. Further, by controlling gate voltage applied to the back gate, the threshold voltage can be controlled. By setting the threshold voltage to be positive, the transistor can be function as an enhancement type transistor. Alternatively, by setting the threshold voltage to be negative, the transistor can functions as a depletion type transistor. For example, an inverter circuit including a combination of an enhancement type transistor and a depletion type transistor (hereinafter, the circuit is referred to as an EDMOS circuit) can be formed to be used for a driver circuit. The driver circuit includes at least a logic circuit portion, and a switch portion or a buffer portion. The logic circuit portion has a circuit structure including the above-described EDMOS circuit.

In the oxide semiconductor layer, a region overlapping with the step of the insulating layer 102 includes a crystal boundary and is polycrystalline. A region serving as a channel formation region in the oxide semiconductor layer has at least a flat surface. The first oxide semiconductor layer and the second oxide semiconductor layer are polycrystals, and c-axis of the first oxide semiconductor layer and c-axis of the second oxide semiconductor layer are aligned in the same direction. The variation in height of the surface of the second oxide semiconductor layer is preferably 1 nm or less (further preferably 0.2 nm or less) in a region overlapping with a gate electrode layer (the channel formation region).

For the details of structural elements, the above embodiment can be referred to, and description thereof will be omitted.

By using the second oxide semiconductor layer 106a formed by crystal growth from the crystalline region of the purified first oxide semiconductor layer 104a like the structures illustrated in FIGS. 7A and 7B, a semiconductor device having favorable electric characteristics can be realized.

In the case where the first oxide semiconductor layer 104a and the second oxide semiconductor layer 106a are formed using the same material (i.e., in the case of homoepitaxy), the boundary between the first oxide semiconductor layer 104a and the second oxide semiconductor layer 106a may not be able to be identified. There is a case where the first oxide semiconductor layer 104a and the second oxide semiconductor layer 106a can be regarded as one layer (see FIG. 7A).

Alternatively, the first oxide semiconductor layer 104a and the second oxide semiconductor layer 106a may be formed using different materials (see FIG. 7B). In the case where the first oxide semiconductor layer 104a and the second oxide semiconductor layer 106a are formed using different materials (i.e., in the case of heteroepitaxy), for example, the first oxide semiconductor layer 104a can be formed using an In—Zn—O-based material which is a two-component metal oxide, and the second oxide semiconductor layer 106a can be formed using an In—Ga—Zn—O-based material which is a three-component metal oxide.

The second oxide semiconductor layer 106a is comparatively stable, and thus can prevent entry of an impurity (e.g., moisture) thereto. Accordingly, the reliability of the second oxide semiconductor layer 106a can be improved.

Further, by inclusion of the gate electrode layer 101a which is a so-called back gate, electric characteristics of the transistor 150 can be easily controlled. Note that a potential the same as or different from that applied to the gate electrode layer 114 may be applied to the gate electrode layer 101a. Alternatively, the gate electrode layer 101a may be in a floating state.

<Method for Manufacturing a Semiconductor Device>

Next, a manufacturing method of the transistor 150 which is an example of the structure of a semiconductor device will be described with reference to FIGS. 8A to 8D, FIGS. 9A to 9C, and FIGS. 10A to 10C.

Figure 8A:
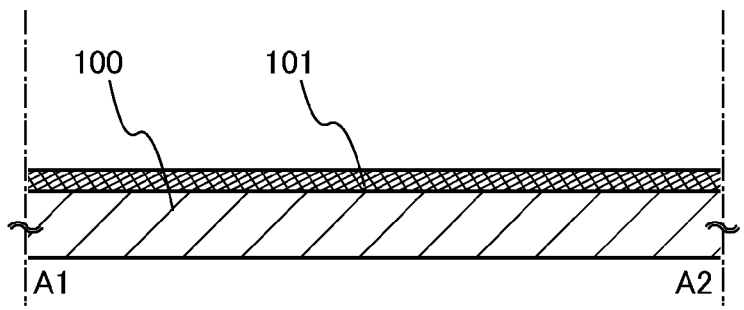
FIGS. 8A to 8D are cross-sectional views illustrating a manufacturing process of a semiconductor device.

First, a conductive layer 101 is formed over the substrate 100 (see FIG. 8A). For the details of the substrate 100, the above embodiment can be referred to and description thereof is omitted.

The conductive layer 101 can be formed by a PVD method such as a sputtering method or a CVD method such as a plasma CVD method. The conductive layer 101 can be formed using an element selected from aluminum, chromium, copper, tantalum, titanium, molybdenum, and tungsten, an alloy including any of these elements as a component, or the like. A material including one or more of manganese, magnesium, zirconium, beryllium, and thorium may be used. A material including aluminum and one or more of elements selected from titanium, tantalum, tungsten, molybdenum, chromium, neodymium, and scandium may be used.

The conductive layer 101 may also be formed using a conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials in which silicon or silicon oxide is included can be used.

The conductive layer 101 can have either a single-layer structure or a stacked structure of two or more layers. In an embodiment of the disclosed invention, since heat treatment at a relatively high temperature is performed after formation of the conductive layer 101, the conductive layer 101 is preferably formed using a material having high heat resistance. As the material having high heat resistance, titanium, tantalum, tungsten, molybdenum, or the like can be given, for example. Polysilicon whose conductivity is increased by addition of an impurity element or the like can also be used.

Figure 8B:
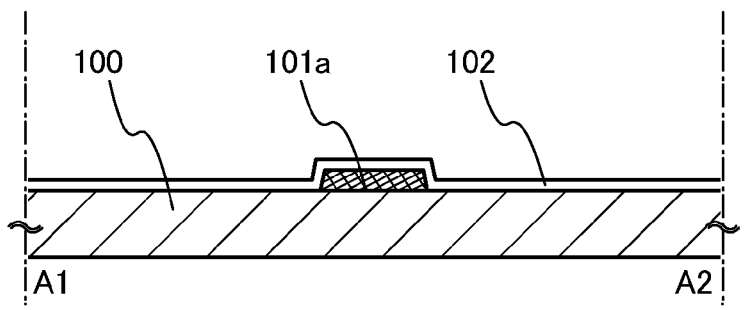

Next, the conductive layer 101 is selectively etched to form the gate electrode layer 101a, and the insulating layer 102 is formed to cover the gate electrode layer 101a (see FIG. 8B).

For light exposure in forming a mask used for etching, ultraviolet light, KrF laser light, or ArF laser light is preferably used. Particularly for light exposure in the case where the channel length (L) is less than 25 nm, light exposure for forming a mask is preferably performed with extreme ultraviolet light whose wavelength is several nanometers to several tens of nanometers, which is extremely short. Light exposure using extreme ultraviolet light has a feature of high resolution and large depth of focus and, therefore, is appropriate for miniaturization.

The gate electrode layer 101a is a so-called back gate. By the existence of the gate electrode layer 101a, electric field in the oxide semiconductor layer 106a can be controlled, whereby electric characteristics of the transistor 150 can be controlled. Note that the gate electrode layer 101a may be electrically connected to another wiring, electrode, or the like so that a potential is applied to the gate electrode layer 101a, or may be insulated so as to be in a floating state.

Note that a "gate electrode" commonly means a gate electrode whose potential can be controlled intentionally; however, a "gate electrode" in this specification also means a gate electrode whose potential is not intentionally controlled. For example, the conductive layer which is insulated and in a floating state as described above is, in some cases, called a "gate electrode layer."

The insulating layer 102 functions as a gate insulating layer as well as a base. The insulating layer 102 can be formed by a CVD method, a sputtering method, or the like. The insulating layer 102 is preferably formed so as to include silicon oxide, silicon nitride, silicon oxynitride, silicon nitride oxide, aluminum oxide, hafnium oxide, tantalum oxide, or the like. Note that the insulating layer 102 may have a single-layer structure or a stacked structure. There is no particular limitation on the thickness of the insulating layer 102; for example, the insulating layer 102 can have a thickness greater than or equal to 10 nm and less than or equal to 500 nm.

If hydrogen, water, or the like is contained in the insulating layer 102, hydrogen may enter the oxide semiconductor layer or extract oxygen from the oxide semiconductor layer, whereby characteristics of the transistor may be degraded. Therefore, it is desirable to form the insulating layer 102 so as to include as little hydrogen or water as possible.

In the case of using a sputtering method or the like, for example, it is desirable that the insulating layer 102 be formed in a state where moisture remaining in the treatment chamber is removed. In order to remove moisture remaining in the treatment chamber, an adsorption-type vacuum pump such as a cryopump, an ion pump, or a titanium sublimation pump is preferably used. A turbo pump provided with a cold trap may be used. From the treatment chamber evacuated with a cryopump or the like, hydrogen, water, or the like is sufficiently removed; thus, the concentration of an impurity in the insulating layer 102 can be reduced.

When the insulating layer 102 is formed, it is desirable to use a high-purity gas in which an impurity such as hydrogen or water is reduced so that the concentration is decreased to approximately a value expressed in the unit "ppm" (preferably, "ppb").

The insulating layer 102 needs to have high quality, in a manner similar to that of the gate insulating layer 112. Therefore, the insulating layer 102 is preferably formed by a method that can be employed for the gate insulating layer 112. For the details, the above embodiment can be referred to and description thereof is omitted.

Figure 8C:
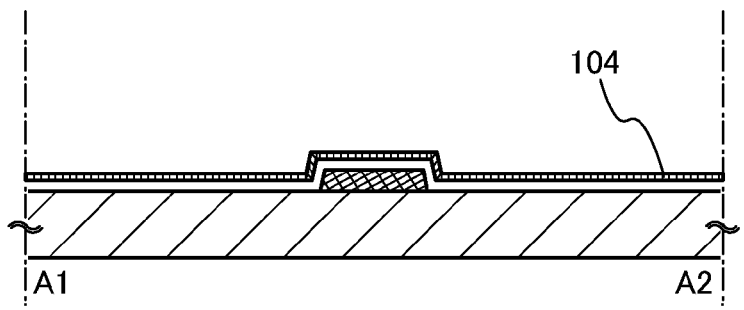
Figure 8D:
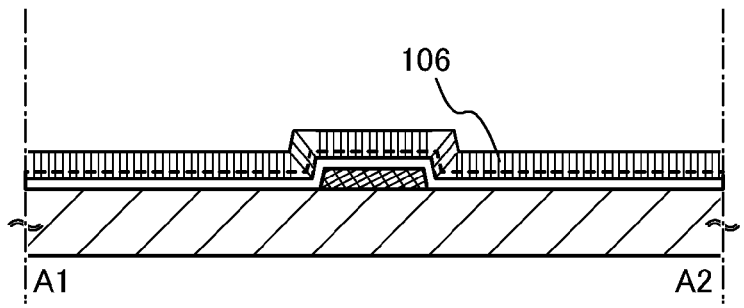

Next, the first oxide semiconductor layer 104 is formed over the insulating layer 102, and first heat treatment is performed to crystallize a region including at least a surface of the first oxide semiconductor layer, whereby the first oxide semiconductor layer 104 is formed (see FIG. 8C). As for the details of the formation method of the first oxide semiconductor layer, conditions of the first heat treatment, and the first oxide semiconductor layer 104, the above embodiment can be referred to and description thereof is omitted.

In the first oxide semiconductor layer 104, a region overlapping with the step of the gate insulating layer includes a crystal boundary and is polycrystalline. A region serving as a channel formation region in the first oxide semiconductor layer 104 has at least a flat surface. The first oxide semiconductor layer and the second oxide semiconductor layer are polycrystals, and c-axis of the first oxide semiconductor layer and c-axis of the second oxide semiconductor layer are aligned in the same direction.

Next, a second oxide semiconductor layer is formed over the first oxide semiconductor layer 104 which includes the crystalline region in a region including at least the surface, and second heat treatment is performed to cause crystal growth using the crystalline region of the first oxide semiconductor layer 104 as a seed. Thus, the second oxide semiconductor layer 106 is formed (see FIG. 8D). As for the details of the formation method of the second oxide semiconductor layer, conditions of the second heat treatment, and the second oxide semiconductor layer 106, the above embodiment can be referred to and description thereof is omitted.

Figure 9A:
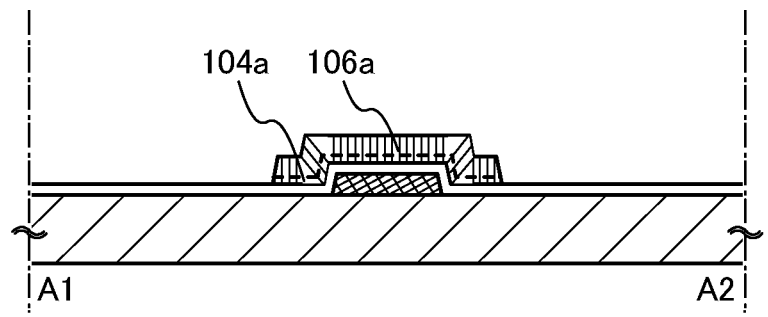
FIGS. 9A to 9C are cross-sectional views illustrating a manufacturing process of a semiconductor device.

Next, the first oxide semiconductor layer 104 and the second oxide semiconductor layer 106 are processed by a method such as etching using a mask; thus, the island-shaped first oxide semiconductor layer 104a and the island-shaped second oxide semiconductor layer 106a are formed (see FIG. 9A). Here, it needs to be noted that the first oxide semiconductor layer 104a and the second oxide semiconductor layer 106a are formed in the region overlapping with the gate electrode layer 101a. For the details, the above embodiment can be referred to.

Figure 9B:
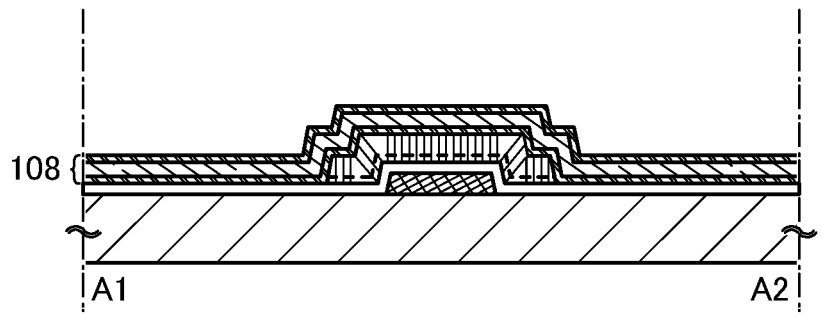

Next, the conductive layer 108 is formed in contact with the second oxide semiconductor layer 106a (see FIG. 9B). The conductive layer 108 is selectively etched to form the source or drain electrode layer 108a and the source or drain electrode layer 108b (see FIG. 9C). For the conductive layer 108, the source or drain electrode layer 108a, the source or drain electrode layer 108b, the etching step, and the other details, the above embodiment can be referred to.

Figure 9C:
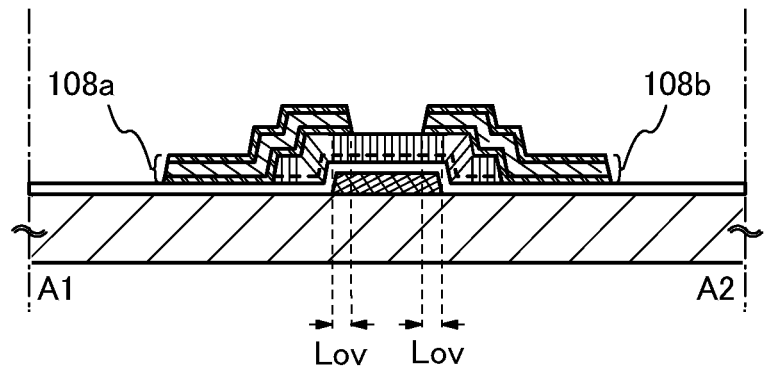

One feature is that the gate electrode layer 101a includes a region overlapping with the source or drain electrode layer 108a (or the source or drain electrode layer 108b) as illustrated in FIG. 9C. The gate electrode layer 101a includes a region between an edge portion of the source or drain electrode layer 108a and a step of the insulating layer 102, in other words, a region between the edge portion of the source or drain electrode layer 108a and a point of the gate insulating layer, at which a flat surface is changed to a surface of a tapered portion in the cross-sectional view (here, an $L_{OV}$ region in FIG. 9C). The $L_{OV}$ region is important in view of preventing carriers from flowing to a crystal grain boundary generated due to the step of the edge portion of the gate electrode layer.

Next, in a manner similar to that of the above embodiment, heat treatment (third heat treatment) may be performed on the second oxide semiconductor layer 106a. By the third heat treatment, a high-purity crystalline region is formed in a region of the second oxide semiconductor layer 106a, which includes the exposed surface of the second oxide semiconductor layer 106a and overlaps with neither the source or drain electrode layer 108a nor the source or drain electrode layer 108b. The area of the high-purity crystalline region varies depending on the material of the second oxide semiconductor layer 106a, conditions of the heat treatment, and the like. For example, the high-purity crystalline region can be extended to the lower interface of the second oxide semiconductor layer 106a. For the third heat treatment and the other details, the above embodiment can be referred to.

Figure 10A:
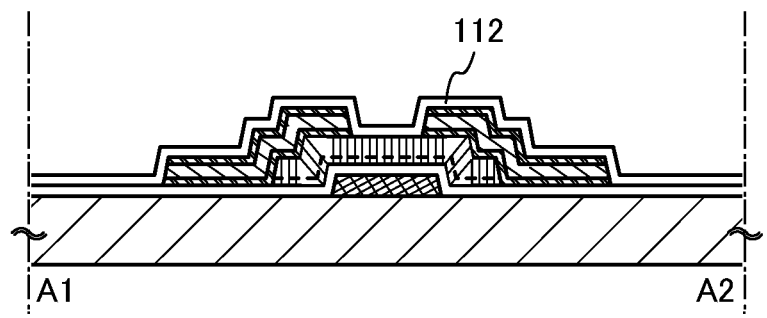
FIGS. 10A to 10C are cross-sectional views illustrating a manufacturing process of a semiconductor device.
Figure 10B:
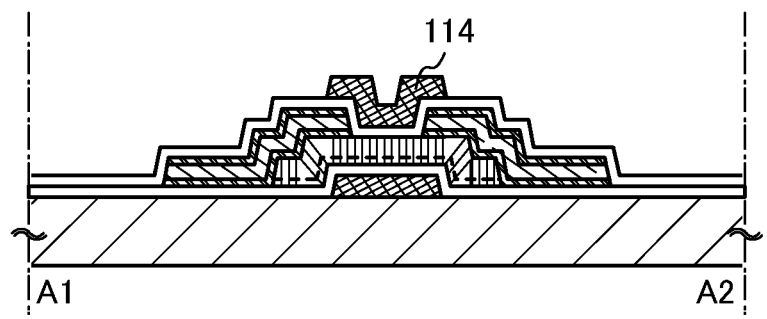
Figure 10C:
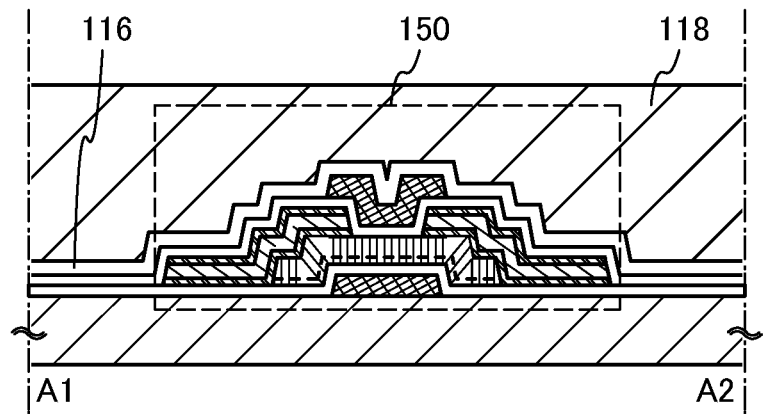

Next, the gate insulating layer 112 is formed in contact with part of the second oxide semiconductor layer 106a without exposure to the air (see FIG. 10A). After that, the gate electrode layer 114 is formed in a region overlapping with the first oxide semiconductor layer 104a and the second oxide semiconductor layer 106a over the gate insulating layer 112 (see FIG. 10B). Then, the interlayer insulating layer 116 and the interlayer insulating layer 118 are formed over the gate insulating layer 112 and the gate electrode layer 114 (see FIG. 10C). For the details of above-described step, the above embodiment can be referred to.

Using the method described in this embodiment, the second oxide semiconductor layer 106a which is formed by crystal growth from the crystalline region of the first oxide semiconductor layer 104a can be formed; accordingly, a semiconductor device having favorable electric characteristics can be realized.

Using the method described in this embodiment, the hydrogen concentration in the first oxide semiconductor layer 104a and the second oxide semiconductor layer 106a is less than or equal to $5\times10^{19}/cm^3$, and the off-state current of the transistor is smaller than or equal to $1\times10^{-13}$ A. Since the first oxide semiconductor layer 104a and the second oxide semiconductor layer 106a which are purified by sufficient reduction of the hydrogen concentration and supply of oxygen are used, the semiconductor device having excellent characteristics can be realized.

Further, with the gate electrode layer serving as a so-called back gate, electric characteristics of the semiconductor device can be easily controlled.

As described above, using the disclosed invention, a semiconductor device having excellent characteristics, which has a novel structure, can be realized.

Modified Examples

Next, modified examples of the semiconductor devices illustrated in FIGS. 7A and 7B, FIGS. 8A to 8D, FIGS. 9A to 9C, and FIGS. 10A to 10C will be described with reference to FIGS. 11A to 11C, FIGS. 12A to 12C, and FIG. 13. Note that many components of the semiconductor devices illustrated in FIGS. 11A to 11C, FIGS. 12A to 12C, and FIG. 13 are common with those of the semiconductor devices illustrated in FIGS. 7A and 7B, FIGS. 8A to 8D, FIGS. 9A to 9C, and FIGS. 10A to 10C; therefore, only different points will be described.

Figure 11A:
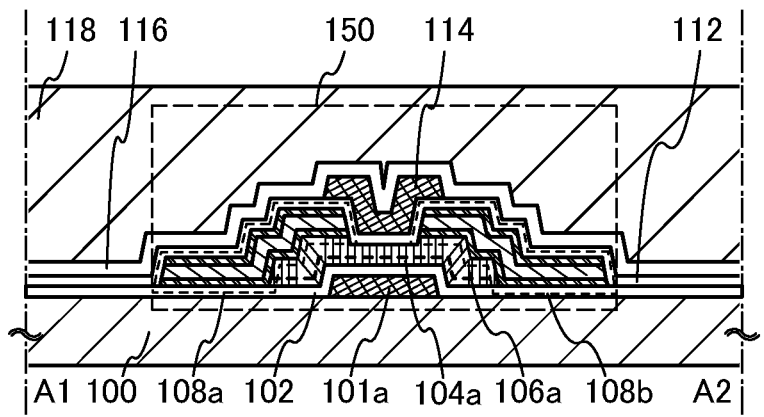
FIGS. 11A to 11C are cross-sectional views each illustrating a semiconductor device.

The transistor 150 illustrated in FIG. 11A includes the oxide semiconductor layer 106a having a depression portion (a groove portion). The depression portion is formed by etching at the time of forming the source or drain electrode layer 108a and the source or drain electrode layer 108b. Accordingly, the depression portion is formed in a region overlapping with the gate electrode layer 114. The depression portion can reduce the thickness of the semiconductor layer in the channel formation region, thereby contributing the prevention of a short-channel effect.

Figure 11B:
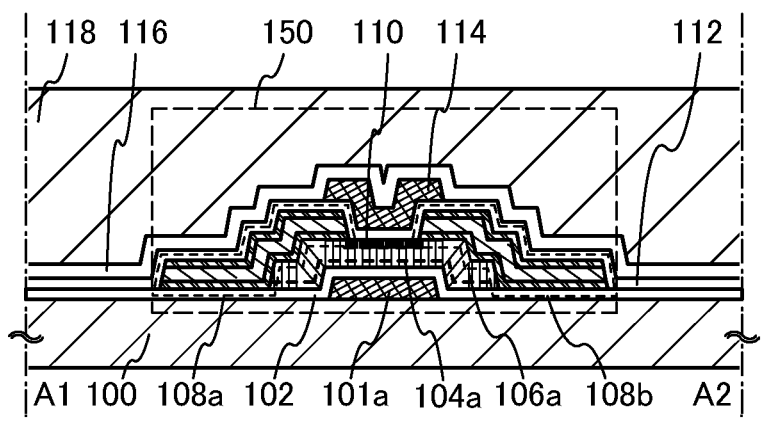

The transistor 150 illustrated in FIG. 11B includes the oxide semiconductor layer 106a including the high-purity crystalline region 110. Note that the high-purity crystalline region 110 is formed by the third heat treatment after the formation of the source or drain electrode layer 108a and the source or drain electrode layer 108b. Accordingly, the high-purity crystalline region 110 is formed in a region of the second oxide semiconductor layer 106a, which includes the exposed surface of the second oxide semiconductor layer 106a and overlaps with neither the source or drain electrode layer 108a nor the source or drain electrode layer 108b. Here, the high-purity crystalline region 110 is a region having higher crystallinity than the other region in the second oxide semiconductor layer 106a. By including the high-purity crystalline region 110, the second oxide semiconductor layer 106a can have a higher electrical anisotropy, and electric characteristics of the semiconductor device can be increased.

Figure 11C:
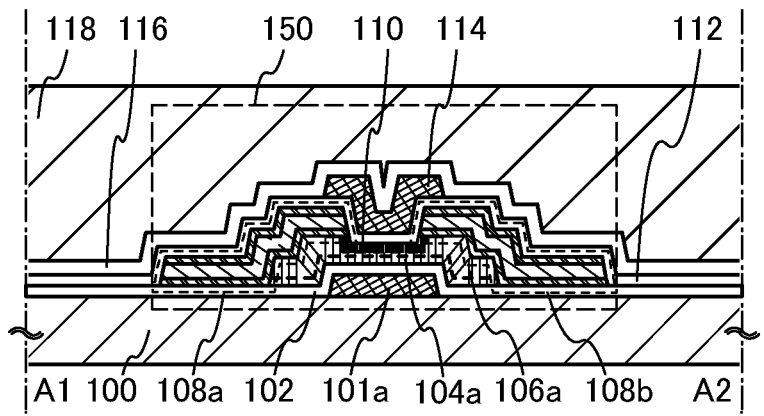

The transistor 150 illustrated in FIG. 11C includes the oxide semiconductor layer 106a having a depression portion (a groove portion) and also includes the high-purity crystalline region 110 in a region of the second oxide semiconductor layer 106a, which includes the exposed surface of the second oxide semiconductor layer 106a and overlaps with neither the source or drain electrode layer 108a nor the source or drain electrode layer 108b. In other words, the transistor illustrated in FIG. 11C has features of both the transistor 150 of FIG. 11A and the transistor 150 of FIG. 11B. The effects caused from the structure are similar to the effects caused in the cases of FIGS. 11A and 11B.

Figure 12A:
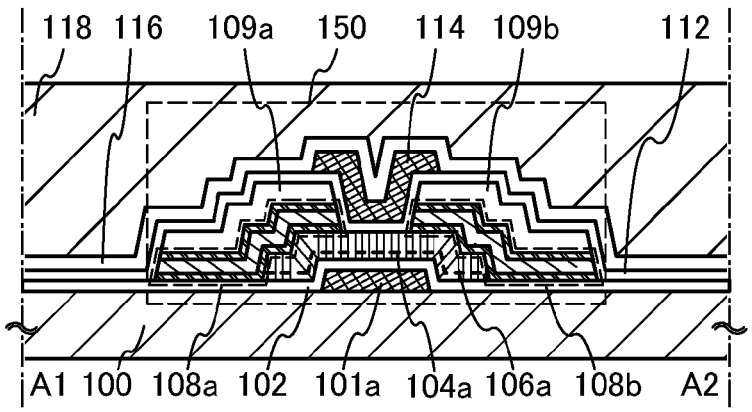
FIGS. 12A to 12C are cross-sectional views each illustrating a semiconductor device.

The transistor 150 illustrated in FIG. 12A includes an insulating layer 109a and an insulating layer 109b which have substantially the same shape as the source or drain electrode layer 108a and the source or drain electrode layer 108b, over the source or drain electrode layer 108a and the source or drain electrode layer 108b. In this case, there is an advantage in that capacitance (so-called gate capacitance) between the source and the drain electrode layer and the gate electrode can be reduced. Note that in this specification, the expression "substantially the same" does not necessarily mean "exactly the same" in a strict sense and includes the meaning of being considered as the same. For example, a difference made by a single etching process is acceptable. Further, the thickness does not need to be the same.

Figure 12B:
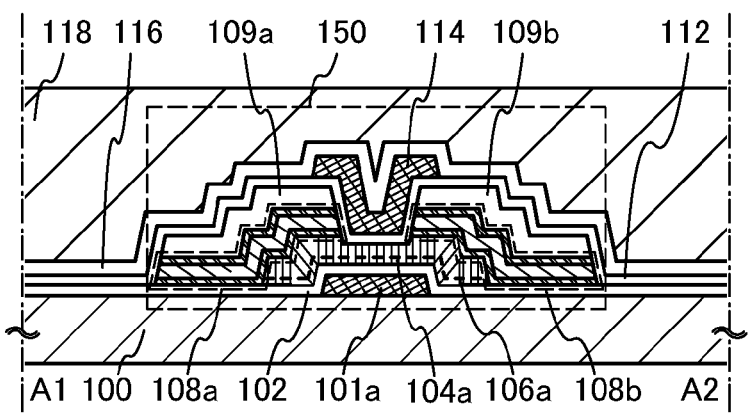

The transistor 150 illustrated in FIG. 12B includes the oxide semiconductor layer 106a having a depression portion (a groove portion) and also includes an insulating layer 109a and an insulating layer 109b which have substantially the same shape as the source or drain electrode layer 108a and the source or drain electrode layer 108b, over the source or drain electrode layer 108a and the source or drain electrode layer 108b. In other words, the transistor illustrated in FIG. 12B has features of both the transistor 150 of FIG. 11A and the transistor 150 of FIG. 12A. The effects caused from the structure are similar to the effects caused in the cases of FIG. 11A and FIG. 12A.

Figure 12C:
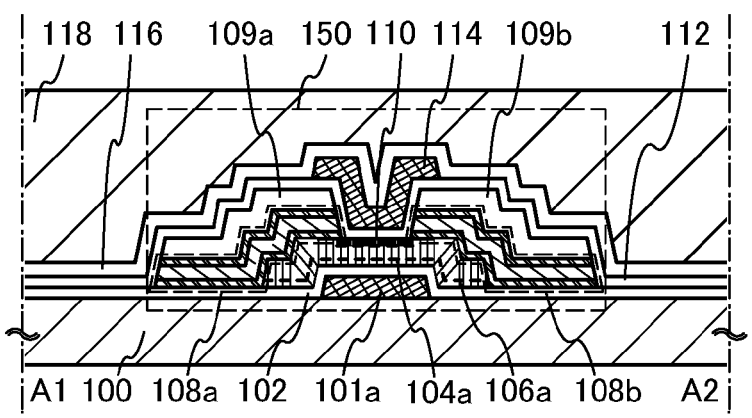

The transistor 150 illustrated in FIG. 12C includes the high-purity crystalline region 110 in a region of the second oxide semiconductor layer 106a, which includes the exposed surface of the second oxide semiconductor layer 106a and overlaps with neither the source or drain electrode layer 108a nor the source or drain electrode layer 108b, and the transistor 150 illustrated in FIG. 12C also includes an insulating layer 109a and an insulating layer 109b which have substantially the same shape as the source or drain electrode layer 108a and the source or drain electrode layer 108b, over the source or drain electrode layer 108a and the source or drain electrode layer 108b. In other words, the transistor illustrated in FIG. 12C has features of both the transistor 150 of FIG. 11B and the transistor 150 of FIG. 12A. The effects caused from the structure are similar to the effects caused in the cases of FIG. 11B and FIG. 12A.

Figure 13:
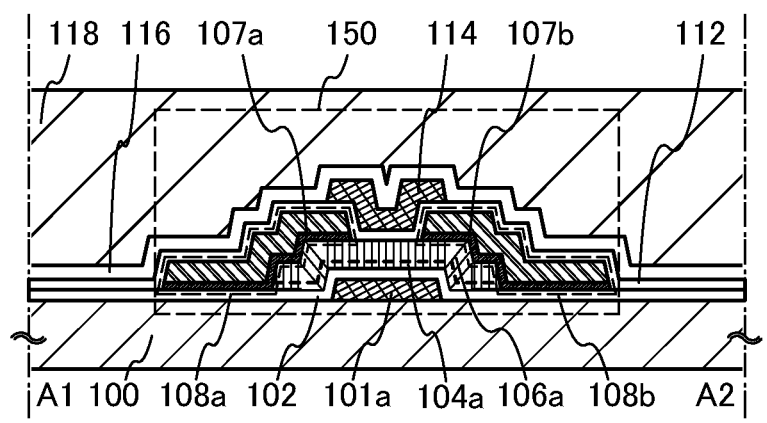
FIG. 13 is a cross-sectional view illustrating a semiconductor device.

The transistor 150 illustrated in FIG. 13 includes a conductive layer 107a formed of a material having a low ability of extracting oxygen (a material having a low oxygen affinity) in a region where the source or drain electrode layer 108a is in contact with the oxide semiconductor layer 106a and also includes a conductive layer 107b formed of a material having a low ability of extracting oxygen in a region where the source or drain electrode layer 108b is in contact with the oxide semiconductor layer 106a. With the conductive layers having a low ability of extracting oxygen as described above, a change to an n-type in the oxide semiconductor layer due to extraction of oxygen can be prevented; accordingly, an adverse effect to transistor characteristics caused by uneven change of the oxide semiconductor layer to an n-type or the like can be prevented.

Note that the source or drain electrode layer 108a and the source or drain electrode layer 108b having a two-layer structure are employed in FIG. 13; however, an embodiment of the disclosed invention is not limited to this structure. They may have a single-layer structure of a conductive layer formed of a material having a low ability of extracting oxygen or a stacked structure of three or more layers. In the case of a single-layer structure, a single-layer structure of a titanium nitride film can be employed, for example. In the case of a stacked structure, a two-layer structure of a titanium nitride film and a titanium film can be employed, for example.

As described above, an embodiment of the disclosed invention can be modified in various ways. In addition, the modified example is not limited to the above-described modified examples. For example, the structures of FIG. 11A, FIG. 11B, FIG. 11C, FIG. 12A, FIG. 12B, FIG. 12C, and FIG. 13 may be combined as appropriate as another modified example. It is needless to say that addition, omission, and the like are possible within the scope of the description in this specification or the like.

The structures, methods, and the like described in this embodiment can be combined as appropriate with any of the structures, methods, and the like described in the other embodiments.

Embodiment 3

In this embodiment, examples of electronic devices each including the semiconductor device according to any of the above-described embodiments will be described with reference to FIGS. 30A to 30F. The semiconductor device according to any of the above embodiments has unprecedented excellent characteristics. Therefore, an electronic device with a novel structure can be provided by using the semiconductor device.

Figure 30A:
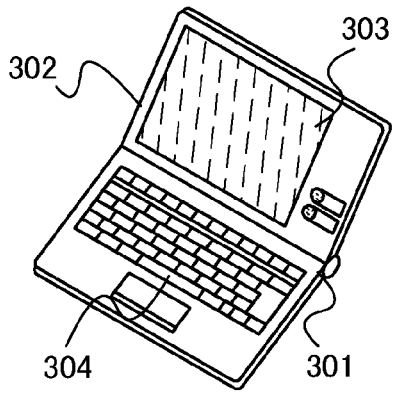
FIGS. 30A to 30F illustrate electronic devices.

FIG. 30A illustrates a notebook personal computer including the semiconductor device according to any of the above embodiments, and includes a main body 301, a housing 302, a display portion 303, a keyboard 304, and the like. The semiconductor device according to the disclosed invention is integrated, mounted on a circuit board or the like, and incorporated in the housing 302. In addition, the semiconductor device according to the disclosed invention can be applied to the display portion 303. By applying the semiconductor device according to the disclosed invention to an integrated circuit board or the like, high-speed circuit operation can be realized. Furthermore, by applying the semiconductor device according to the disclosed invention to the display portion 303, high-quality images can be displayed. By applying the semiconductor device according to the disclosed invention to a personal computer as described above, a high-performance personal computer can be provided.

Figure 30D:
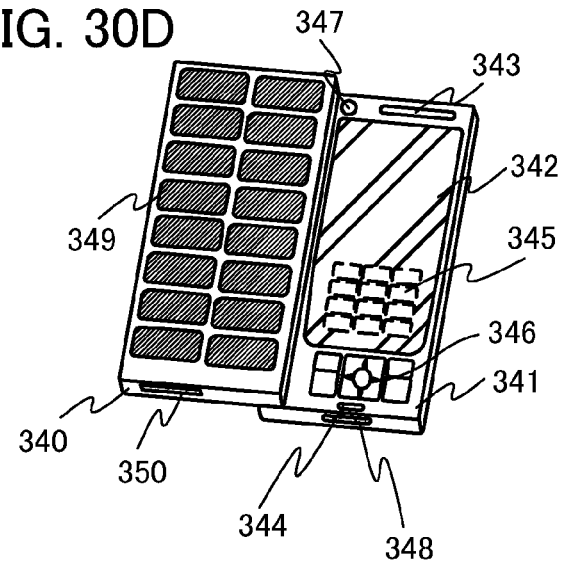
Figure 30B:
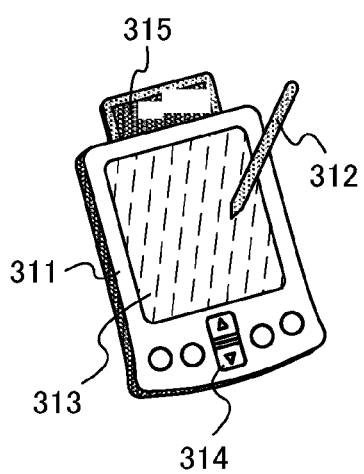

FIG. 30B illustrates a personal digital assistant (PDA) including the semiconductor device according to any of the above embodiments. A main body 311 is provided with a display portion 313, an external interface 315, operation buttons 314, and the like. Further, a stylus 312 is provided as an accessory for operation. The semiconductor device according to the disclosed invention is integrated, mounted on a circuit board or the like, and incorporated in the main body 311. In addition, the semiconductor device according to the disclosed invention can be applied to the display portion 313. By applying the semiconductor device according to the disclosed invention to an integrated circuit board or the like, high-speed circuit operation can be realized. Furthermore, by applying the semiconductor device according to the disclosed invention to the display portion 313, high-quality images can be displayed. By applying the semiconductor device according to the disclosed invention to a personal digital assistant (PDA) as described above, a high-performance personal digital assistant (PDA) can be provided.

Figure 30E:
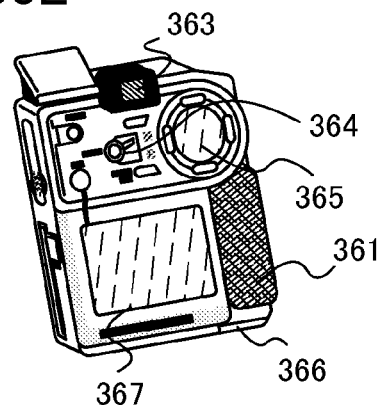
Figure 30C:
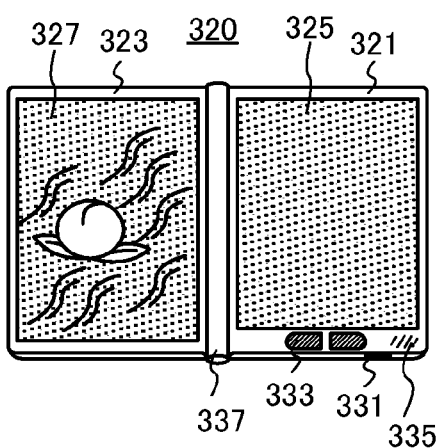

FIG. 30C illustrates an electronic book 320 as an example of electronic paper including the semiconductor device according to any of the above embodiments. The electronic book 320 includes two housings, a housing 321 and a housing 323. The housing 321 is combined with the housing 323 by a hinge 337, so that the electronic book 320 can be opened and closed using the hinge 337 as an axis. With such a structure, the electronic book 320 can be used like a paper book.

The housing 321 includes a display portion 325, and the housing 323 includes a display portion 327. The semiconductor device according to the disclosed invention is integrated, mounted on a circuit board or the like, and incorporated in the housing 323 or the housing 321. The semiconductor device according to the disclosed invention can be applied to the display portion 327. The display portion 325 and the display portion 327 can display a continuous image or different images. A structure for displaying different images enables text to be displayed on the right display portion (the display portion 325 in FIG. 30C) and images to be displayed on the left display portion (the display portion 327 in FIG. 30C). By applying the semiconductor device according to the disclosed invention to an integrated circuit board or the like, high-speed circuit operation can be realized. By applying the semiconductor device according to the disclosed invention to the display portion 327, high-quality images can be displayed.

FIG. 30C illustrates an example in which the housing 321 is provided with an operation portion and the like. For example, the housing 321 is provided with a power switch 331, operation keys 333, a speaker 335, and the like. The operation keys 333 allow pages to be turned. Note that a keyboard, a pointing device, or the like may also be provided on the same side of the housing as the display portion. Furthermore, an external connection terminal (an earphone terminal, a USB terminal, a terminal that can be connected to an AC adapter or various cables such as a USB cable, or the like), a recording medium insertion portion, and the like may be provided on the back surface or the side surface of the housing. The electronic book 320 can also serve as an electronic dictionary.

In addition, the electronic book 320 can send and receive information wirelessly. Through wireless communication, desired book data or the like can be purchased and downloaded from an electronic book server.

Note that electronic paper can be used for devices in all fields as long as they can display data. For example, to display data, electronic paper can be applied to posters, advertisement in vehicles such as trains, a variety of cards such as credit cards, and the like as well as electronic books. By applying the semiconductor device according to the disclosed invention to electronic paper as described above, high-performance electronic paper can be provided.

FIG. 30D illustrates a cellular phone including the semiconductor device according to any of the above embodiments. The cellular phone includes two housings, a housing 340 and a housing 341. The housing 341 includes a display panel 342, a speaker 343, a microphone 344, a pointing device 346, a camera lens 347, an external connection terminal 348, and the like. The housing 340 includes a solar cell 349 for charging the cellular phone, an external memory slot 350, and the like. An antenna is incorporated in the housing 341. The semiconductor device according to the disclosed invention is integrated, mounted on a circuit board or the like, and incorporated in the housing 340 or the housing 341.

The display panel 342 has a touch panel function. A plurality of operation keys 345 displayed as images are indicated by dashed lines in FIG. 30D. The semiconductor device according to the disclosed invention can be applied to the display panel 342. By applying the semiconductor device according to the disclosed invention to the display panel 342, high-quality images can be displayed. Note that the cellular phone includes a booster circuit for increasing a voltage output from the solar cell 349 to a voltage needed for each circuit. It is possible for the cellular phone to have, in addition to the above structure, a structure in which a noncontact IC chip, a small recording device, or the like is formed.

The display panel 342 changes the orientation of display as appropriate in accordance with the application mode. Further, the camera lens 347 is provided on the same side as the display panel 342, so that the cellular phone can be used as a video phone. The speaker 343 and the microphone 344 can be used for videophone calls, recording, and playing sound, etc. as well as voice calls. Moreover, the housings 340 and 341 in a state where they are developed as illustrated in FIG. 30D can be slid so that one is lapped over the other. Therefore, the size of the cellular phone can be reduced, which makes the cellular phone suitable for being carried around.

The external connection terminal 348 can be connected to an AC adapter or a variety of cables such as a USB cable, so that the cellular phone can be charged or can perform data communication. Moreover, the cellular phone can store and transfer a larger amount of data by inserting a recording medium into the external memory slot 350. Further, in addition to the above functions, an infrared communication function, a television reception function, or the like may be provided. By applying the semiconductor device according to the disclosed invention to a cellular phone, a high-performance cellular phone can be provided.

FIG. 30E illustrates a digital camera including the semiconductor device according to any of the above embodiments. The digital camera includes a main body 361, a display portion A 367, an eyepiece 363, an operation switch 364, a display portion B 365, a battery 366, and the like. The semiconductor device according to the disclosed invention can be applied to the display portion A 367 or the display portion B 365. By applying the semiconductor device according to the disclosed invention to the display portion A 367 or the display portion B 365, high-quality images can be displayed. By applying the semiconductor device according to the disclosed invention to a digital camera as described above, a high-performance digital camera can be provided.

Figure 30F:
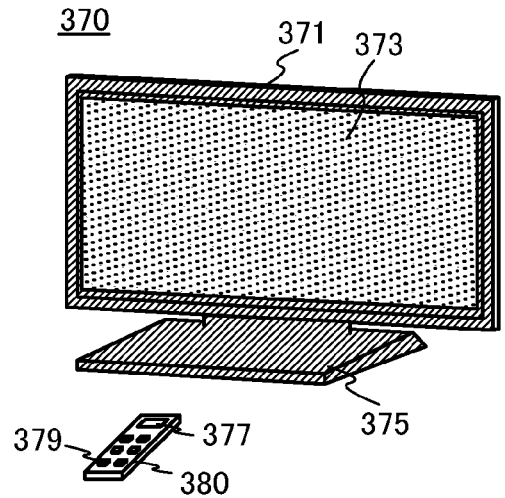

FIG. 30F illustrates a television set including the semiconductor device according to any of the above embodiments. In a television set 370, a display portion 373 is incorporated in a housing 371. Images can be displayed on the display portion 373. Here, the housing 371 is supported by a stand 375. By applying the semiconductor device according to the disclosed invention to the display portion 373, high-speed operation of a switching element can be achieved and an increase in the area of the display portion 373 can be realized.

The television set 370 can be operated with an operation switch included in the housing 371 or by a remote controller 380. Channels and volume can be controlled with a control key 379 included in the remote controller 380, and images displayed on the display portion 373 can thus be controlled. Further, the remote controller 380 can be provided with a display portion 377 for displaying data to be output from the remote controller 380.

Note that the television set 370 preferably includes a receiver, a modem, and the like. The receiver allows the television set 370 to receive a general television broadcast. In addition, the television set 370 is capable of one-way (from a transmitter to a receiver) or two-way (between a transmitter and a receiver, between receivers, or the like) data communication when connected to a communication network by wired or wireless connection via the modem. By applying the semiconductor device according to the disclosed invention to a television set as described above, a high-performance television set can be provided.

The structures, methods, and the like described in this embodiment can be combined as appropriate with any of the structures, methods, and the like described in other embodiments.

This application is based on Japanese Patent Application serial no. 2009-270857 filed with Japan Patent Office on Nov. 28, 2009, the entire contents of which are hereby incorporated by reference.

The invention claimed is:

1. A semiconductor device comprising:
   a first oxide semiconductor layer comprising a first crystalline region over a substrate having an insulating surface;
   a second oxide semiconductor layer over the first oxide semiconductor layer;
   a source electrode layer and a drain electrode layer each being in contact with the second oxide semiconductor layer;
   a first gate insulating layer covering the second oxide semiconductor layer, the source electrode layer, and the drain electrode layer; and
   a first gate electrode layer over the second oxide semiconductor layer with the first gate insulating layer interposed therebetween, wherein the second oxide semiconductor layer comprises a second crystalline region having a c-axis alignment same or substantially same as that of the first crystalline region, wherein the c-axis of the second crystalline region is aligned in a direction within ±10° from a perpendicular direction to a surface of the second oxide semiconductor layer, and wherein each of the first oxide semiconductor layer and the second oxide semiconductor layer comprises indium, zinc and a metal other than indium and zinc.

2. The semiconductor device according to claim 1, further comprising:
a second gate electrode layer over the substrate having the insulating surface;
a second gate insulating layer over the first gate electrode layer,
wherein the first oxide semiconductor layer is located over the second gate insulating layer.

3. The semiconductor device according to claim 1, wherein a variation in height of the surface of the second oxide semiconductor layer is 1 nm or less in a region between the source electrode layer and the drain electrode layer.

4. The semiconductor device according to claim 1, wherein the substrate having the insulating surface includes an oxide or a nitride.

5. The semiconductor device according to claim 1, wherein the first crystalline region included in the first oxide semiconductor layer has an average thickness greater than or equal to 2 nm and less than or equal to 10 nm.

6. The semiconductor device according to claim 1, wherein the metal comprises gallium.

7. The semiconductor device according to claim 1, wherein the first oxide semiconductor layer or the second oxide semiconductor layer is a purified oxide semiconductor layer.

8. The semiconductor device according to claim 1, wherein at least one of the first oxide semiconductor layer and the second oxide semiconductor layer has a carrier density lower than $1.0 \times 10^{12}$ cm$^{-3}$.

9. The semiconductor device according to claim 1, wherein at least one of the first oxide semiconductor layer and the second oxide semiconductor layer has a hydrogen concentration lower than $5 \times 10^{19}$ cm$^{-3}$.

10. The semiconductor device according to claim 1, wherein the sum of thicknesses of the first oxide semiconductor layer and the second oxide semiconductor layer is greater than or equal to 3 nm and less than or equal to 50 nm.

11. The semiconductor device according to claim 1, wherein the first crystalline region of the first oxide semiconductor layer has the same electron affinity as a crystal comprised in the second oxide semiconductor layer.

12. The semiconductor device according to claim 1, wherein the second oxide semiconductor layer has a depression portion.

13. The semiconductor device according to claim 1, wherein the second oxide semiconductor layer includes a high-purity crystalline region.

14. The semiconductor device according to claim 1, wherein the first oxide semiconductor layer and the second oxide semiconductor layer include materials including the same main component.

15. The semiconductor device according to claim 1, wherein the first oxide semiconductor layer and the second oxide semiconductor layer include different materials.

16. The semiconductor device according to claim 1, wherein insulating layers having substantially the same shape as the source electrode layer and the drain electrode layer are included over the source electrode layer and the drain electrode layer.

17. The semiconductor device according to claim 1, wherein portions in contact with the second oxide semiconductor layer of the source electrode layer and the drain electrode layer include a material having a low oxygen affinity.

18. A semiconductor device comprising:
a gate electrode layer over a substrate having an insulating surface;
a gate insulating layer over the gate electrode layer;
a first oxide semiconductor layer over the gate electrode layer with the gate insulating layer therebetween;
a second oxide semiconductor layer over the first oxide semiconductor layer; and
a source electrode layer and a drain electrode layer each being in contact with the second oxide semiconductor layer,
wherein the first oxide semiconductor layer comprises a first crystalline region,
wherein the second oxide semiconductor layer comprises a second crystalline region having a c-axis alignment same or substantially same as that of the first crystalline region,
wherein the c-axis of the second crystalline region is aligned in a direction within ±10° from a perpendicular direction to a surface of the second oxide semiconductor layer, and
wherein each of the first oxide semiconductor layer and the second oxide semiconductor layer comprises indium, zinc and a metal other than indium and zinc.

19. The semiconductor device according to claim 18, further comprising an insulating layer over the source electrode layer, the drain electrode layer and the second oxide semiconductor layer,
wherein the insulating layer is in contact with part of the surface of the second oxide semiconductor layer.

20. The semiconductor device according to claim 18, wherein a variation in height of the surface of the second oxide semiconductor layer is 1 nm or less in a region between the source electrode layer and the drain electrode layer.

21. The semiconductor device according to claim 18, wherein the first crystalline region included in the first oxide semiconductor layer has an average thickness greater than or equal to 2 nm and less than or equal to 10 nm.

22. The semiconductor device according to claim 18, wherein the metal comprises gallium.

23. The semiconductor device according to claim 18, wherein at least one of the first oxide semiconductor layer and the second oxide semiconductor layer has a carrier density lower than $1.0 \times 10^{12}$ cm$^{-3}$.

24. The semiconductor device according to claim 18, wherein at least one of the first oxide semiconductor layer and the second oxide semiconductor layer has a hydrogen concentration lower than $5 \times 10^{19}$ cm$^{-3}$.

25. The semiconductor device according to claim 18, wherein a sum of thicknesses of the first oxide semiconductor layer and the second oxide semiconductor layer is greater than or equal to 3 nm and less than or equal to 50 nm.

26. The semiconductor device according to claim 18, wherein the first crystalline region of the first oxide semiconductor layer has the same electron affinity as a crystal comprised in the second oxide semiconductor layer.

27. The semiconductor device according to claim 18, wherein the first oxide semiconductor layer and the second oxide semiconductor layer include materials including the same main component.

28. The semiconductor device according to claim 18, wherein the first oxide semiconductor layer and the second oxide semiconductor layer include different materials.

29. The semiconductor device according to claim 18, wherein portions in contact with the second oxide semiconductor layer of the source electrode layer and the drain electrode layer include a material having a low oxygen affinity.

30. A semiconductor device comprising:
a first gate electrode layer over a substrate having an insulating surface;
a first gate insulating layer over the first gate electrode layer;
a first oxide semiconductor layer over the first gate electrode layer with the first gate insulating layer therebetween;
a second oxide semiconductor layer over the first oxide semiconductor layer;
a source electrode layer and a drain electrode layer each being electrically connected to the second oxide semiconductor layer;
a second gate insulating layer over the second oxide semiconductor layer; and
a second gate electrode layer over the second oxide semiconductor layer with the second gate insulating layer interposed therebetween,
wherein the first oxide semiconductor layer comprises a first crystalline region,
wherein the second oxide semiconductor layer comprises a second crystalline region having a c-axis alignment same or substantially same as that of the first crystalline region,
wherein the c-axis of the second crystalline region is aligned in a direction within ±10° from a perpendicular direction to a surface of the second oxide semiconductor layer, and
wherein each of the first oxide semiconductor layer and the second oxide semiconductor layer comprises indium, zinc and a metal other than indium and zinc.

31. The semiconductor device according to claim 30, wherein a variation in height of the surface of the second oxide semiconductor layer is 1 nm or less in a region between the source electrode layer and the drain electrode layer.

32. The semiconductor device according to claim 30, wherein the first crystalline region included in the first oxide semiconductor layer has an average thickness greater than or equal to 2 nm and less than or equal to 10 nm.

33. The semiconductor device according to claim 30, wherein the metal comprises gallium.

34. The semiconductor device according to claim 30, wherein at least one of the first oxide semiconductor layer and the second oxide semiconductor layer has a carrier density lower than $1.0 \times 10^{12}$ cm$^{-3}$.

35. The semiconductor device according to claim 30, wherein at least one of the first oxide semiconductor layer and the second oxide semiconductor layer has a hydrogen concentration lower than $5 \times 10^{19}$ cm$^{-3}$.

36. The semiconductor device according to claim 30, wherein a sum of thicknesses of the first oxide semiconductor layer and the second oxide semiconductor layer is greater than or equal to 3 nm and less than or equal to 50 nm.

37. The semiconductor device according to claim 30, wherein the first crystalline region of the first oxide semiconductor layer has the same electron affinity as a crystal comprised in the second oxide semiconductor layer.

38. The semiconductor device according to claim 30, wherein the first oxide semiconductor layer and the second oxide semiconductor layer include materials including the same main component.

39. The semiconductor device according to claim 30, wherein the first oxide semiconductor layer and the second oxide semiconductor layer include different materials.

40. The semiconductor device according to claim 30, wherein portions in contact with the second oxide semiconductor layer of the source electrode layer and the drain electrode layer include a material having a low oxygen affinity.

* * * * *

UNITED STATES PATENT AND TRADEMARK OFFICE
CERTIFICATE OF CORRECTION

PATENT NO.        : 8,748,881 B2
APPLICATION NO.   : 12/951249
DATED             : June 10, 2014
INVENTOR(S)       : Shunpei Yamazaki It is certified that error appears in the above-identified patent and that said Letters Patent is hereby corrected as shown below:

In the Specification

At column 2, lines 29-30, "G Muller," should be --G. Muller,--;

At column 2, line 41, "$(ZnO)_n$," should be --$(ZnO)_m$--;

At column 13, line 12, "itself" should be --itself.--;

At column 14, line 25, "$cm^3$" should be --$cm^{-3}$--;

At column 14, line 26, "$cm^3$" should be --$cm^{-3}$--;

At column 18, line 5, "lam," should be --μm,--;

At column 19, line 46, "nm" should be --nm.--;

At column 47, line 41, "OV" should be --0V--;

In the Claims

In claim 10, at column 57, line 45, "wherein the" should be --wherein a--.

Signed and Sealed this
Twenty-first Day of October, 2014

Michelle K. Lee
*Deputy Director of the United States Patent and Trademark Office*